(12) United States Patent
Acar et al.

(10) Patent No.: US 9,410,805 B2
(45) Date of Patent: Aug. 9, 2016

(54) MICROMACHINED PIEZOELECTRIC Z-AXIS GYROSCOPE

(71) Applicant: QUALCOMM MEMS Technologies, Inc., San Diego, CA (US)

(72) Inventors: Cenk Acar, Irvine, CA (US); Ravindra V. Shenoy, Dublin, CA (US); Justin Phelps Black, Santa Clara, CA (US); Kurt Edward Petersen, Milpitas, CA (US); Srinivasan Kodaganallur Ganapathi, Palo Alto, CA (US); Philip Jason Stephanou, Mountain View, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 528 days.

(21) Appl. No.: 13/956,163

(22) Filed: Jul. 31, 2013

(65) Prior Publication Data

US 2013/0333175 A1    Dec. 19, 2013

Related U.S. Application Data

(62) Division of application No. 12/930,175, filed on Dec. 30, 2010, now Pat. No. 8,516,887.

(60) Provisional application No. 61/343,598, filed on Apr. 30, 2010, provisional application No. 61/343,599, filed on Apr. 30, 2010, provisional application No. 61/343,600, filed on Apr. 30, 2010, provisional application No. 61/343,601, filed on Apr. 30, 2010.

(51) Int. Cl.
*G01C 19/5769* (2012.01)
*G01C 19/5712* (2012.01)
(Continued)

(52) U.S. Cl.
CPC ........ *G01C 19/5769* (2013.01); *G01C 19/5712* (2013.01); *G01C 19/5747* (2013.01);
(Continued)

(58) Field of Classification Search
CPC ........... G01C 19/5642; G01C 19/5607; G01C 19/5649; G01C 25/00; Y10T 29/42
See application file for complete search history.

(56) References Cited

U.S. PATENT DOCUMENTS

| 3,938,113 A | 2/1976 | Dobson et al. |
|---|---|---|
| 4,030,347 A | 6/1977 | Norris et al. |

(Continued)

FOREIGN PATENT DOCUMENTS

| CN | 1766528 A | 5/2006 |
|---|---|---|
| CN | 1828223 A | 9/2006 |

(Continued)

OTHER PUBLICATIONS

U.S. Notice of Allowance dated Sep. 30, 2013, issued in U.S. Appl. No. 12/930,186.

(Continued)

*Primary Examiner* — Peter DungBa Vo
*Assistant Examiner* — Jeffrey T Carley
(74) *Attorney, Agent, or Firm* — Weaver Austin Villeneuve & Sampson LLP

(57) ABSTRACT

This disclosure provides systems, methods and apparatus, including computer programs encoded on computer storage media, for making and using gyroscopes. Such gyroscopes may include a central anchor, a sense frame disposed around the central anchor, a plurality of sense beams configured for connecting the sense frame to the central anchor and a drive frame disposed around and coupled to the sense frame. The gyroscope may include pairs of drive beams disposed on opposing sides of the sense frame. The gyroscope may include a drive frame suspension for substantially restricting a drive motion of the drive frame to that of a substantially linear displacement along the first axis. The sense frame may be substantially decoupled from drive motions of the drive frame. Such devices may be included in a mobile device, such as a mobile display device.

20 Claims, 54 Drawing Sheets

(51) Int. Cl.
  *G01C 19/5747* (2012.01)
  *G01P 15/08* (2006.01)
  *G01P 15/125* (2006.01)
  *G01P 15/18* (2013.01)
  *G01C 25/00* (2006.01)

(52) U.S. Cl.
  CPC ............ *G01C25/00* (2013.01); *G01P 15/0802* (2013.01); *G01P 15/125* (2013.01); *G01P 15/18* (2013.01); *Y10T 29/42* (2015.01); *Y10T 29/49002* (2015.01); *Y10T 29/49155* (2015.01)

(56) References Cited

U.S. PATENT DOCUMENTS

| | | |
|---|---|---|
| 4,420,754 A | 12/1983 | Andermo |
| 4,543,526 A | 9/1985 | Burckhardt et al. |
| 4,703,663 A | 11/1987 | Oppermann |
| 4,841,225 A | 6/1989 | Meyer |
| 4,896,098 A | 1/1990 | Haritonidis et al. |
| 4,944,181 A | 7/1990 | Wnuk |
| 5,199,298 A | 4/1993 | Ng et al. |
| 5,209,117 A | 5/1993 | Bennett |
| 5,359,893 A | 11/1994 | Dunn |
| 5,394,096 A | 2/1995 | Meyer |
| 5,408,877 A | 4/1995 | Greiff et al. |
| 5,488,862 A | 2/1996 | Neukermans et al. |
| 5,555,765 A | 9/1996 | Greiff |
| 5,650,568 A | 7/1997 | Greiff et al. |
| 5,767,405 A * | 6/1998 | Bernstein ........... G01C 19/5719 73/504.12 |
| 5,894,091 A | 4/1999 | Kubota |
| 5,955,668 A * | 9/1999 | Hsu .................... G01C 19/5719 73/1.37 |
| 5,992,233 A | 11/1999 | Clark |
| 6,041,653 A | 3/2000 | Ichikawa et al. |
| 6,082,197 A | 7/2000 | Mizuno et al. |
| 6,149,190 A | 11/2000 | Galvin et al. |
| 6,189,381 B1 * | 2/2001 | Huang ................ G01C 19/5656 73/504.12 |
| 6,199,874 B1 | 3/2001 | Galvin et al. |
| 6,230,563 B1 | 5/2001 | Clark et al. |
| 6,262,520 B1 | 7/2001 | Knowles |
| 6,481,283 B1 | 11/2002 | Cardarelli |
| 6,561,028 B1 * | 5/2003 | Aigner ................ G01C 19/5712 73/504.11 |
| 6,591,678 B2 | 7/2003 | Sakai |
| 6,776,042 B2 | 8/2004 | Pike et al. |
| 6,792,804 B2 | 9/2004 | Adams et al. |
| 6,823,733 B2 | 11/2004 | Ichinose |
| 6,845,670 B1 | 1/2005 | McNeil et al. |
| 6,892,575 B2 | 5/2005 | Nasiri et al. |
| 6,978,673 B2 | 12/2005 | Johnson et al. |
| 7,002,284 B2 | 2/2006 | Ouchi et al. |
| 7,043,986 B2 | 5/2006 | Kikuchi et al. |
| 7,210,351 B2 | 5/2007 | Lo et al. |
| 7,240,552 B2 | 7/2007 | Acar et al. |
| 7,258,011 B2 | 8/2007 | Nasiri et al. |
| 7,337,667 B2 | 3/2008 | Ohuchi et al. |
| 7,368,861 B2 | 5/2008 | Tanaya |
| 7,412,887 B2 | 8/2008 | Memishian |
| 7,421,898 B2 | 9/2008 | Acar et al. |
| 7,444,868 B2 | 11/2008 | Johnson |
| 7,461,552 B2 | 12/2008 | Acar |
| 7,677,099 B2 * | 3/2010 | Nasiri ................ G01C 19/5719 73/504.04 |
| 7,793,542 B2 | 9/2010 | Schultz |
| 8,020,443 B2 | 9/2011 | Lin et al. |
| 8,186,221 B2 | 5/2012 | Lin et al. |
| 8,215,168 B2 | 7/2012 | Merz et al. |
| 8,256,290 B2 | 9/2012 | Mao |
| 8,418,556 B2 | 4/2013 | Chen et al. |
| 8,516,886 B2 | 8/2013 | Acar et al. |
| 8,516,887 B2 | 8/2013 | Acar et al. |
| 8,584,522 B2 | 11/2013 | Acar et al. |
| 9,021,880 B2 | 5/2015 | Stephanou et al. |
| 9,032,796 B2 | 5/2015 | Stephanou et al. |
| 2002/0134154 A1 | 9/2002 | Hsu et al. |
| 2002/0189351 A1 | 12/2002 | Reeds et al. |
| 2004/0045354 A1 | 3/2004 | Lentner et al. |
| 2004/0123660 A1 | 7/2004 | Willig et al. |
| 2005/0006988 A1 | 1/2005 | Kawauchi et al. |
| 2005/0061073 A1 | 3/2005 | Kanna et al. |
| 2005/0284223 A1 | 12/2005 | Karaki et al. |
| 2006/0156815 A1 | 7/2006 | Chen et al. |
| 2006/0191338 A1 | 8/2006 | Willig et al. |
| 2007/0266785 A1 * | 11/2007 | Cadarelli ........... G01C 19/5719 73/504.16 |
| 2009/0114016 A1 | 5/2009 | Nasiri et al. |
| 2009/0126488 A1 | 5/2009 | Fujimoto et al. |
| 2009/0165558 A1 | 7/2009 | Schultz |
| 2009/0183570 A1 | 7/2009 | Acar et al. |
| 2010/0058864 A1 | 3/2010 | Hsu et al. |
| 2010/0077858 A1 * | 4/2010 | Kawakubo .......... G01P 15/0802 73/504.12 |
| 2010/0083756 A1 * | 4/2010 | Merz ................ G01C 19/5762 73/504.12 |
| 2010/0089154 A1 | 4/2010 | Ballas et al. |
| 2011/0162453 A1 | 7/2011 | Wang et al. |
| 2011/0265564 A1 | 11/2011 | Acar et al. |
| 2011/0265565 A1 | 11/2011 | Acar et al. |
| 2011/0265566 A1 | 11/2011 | Acar et al. |
| 2011/0265568 A1 | 11/2011 | Stephanou et al. |
| 2011/0270569 A1 | 11/2011 | Stephanou et al. |
| 2013/0333175 A1 | 12/2013 | Acar et al. |
| 2014/0013557 A1 | 1/2014 | Acar et al. |
| 2014/0041174 A1 | 2/2014 | Acar et al. |
| 2015/0219457 A1 | 8/2015 | Stephanou et al. |

FOREIGN PATENT DOCUMENTS

| | | |
|---|---|---|
| CN | 1948906 A | 4/2007 |
| CN | 101135563 A | 3/2008 |
| CN | 101523223 A | 9/2009 |
| DE | 102007017209 A1 | 10/2008 |
| DE | 102008002748 A1 | 12/2009 |
| EP | 1582878 A1 | 10/2005 |
| EP | 1832841 A1 | 9/2007 |
| JP | S58221109 A | 12/1983 |
| JP | H08304450 A | 11/1996 |
| JP | H09325032 | 12/1997 |
| JP | H09512904 | 12/1997 |
| JP | H1089968 A | 4/1998 |
| JP | H1164002 A | 3/1999 |
| JP | H1194873 A | 4/1999 |
| JP | 11142157 A | 5/1999 |
| JP | H11211748 | 8/1999 |
| JP | 2000046558 A | 2/2000 |
| JP | 2000249554 A | 9/2000 |
| JP | 2001183138 A | 7/2001 |
| JP | 2003345508 A | 12/2003 |
| JP | 2005283402 A | 10/2005 |
| JP | 2005535889 | 11/2005 |
| JP | 2006242931 | 9/2006 |
| JP | 2006292690 A | 10/2006 |
| JP | 2007155489 A | 6/2007 |
| JP | 2007205739 A | 8/2007 |
| JP | 2007530914 A | 11/2007 |
| JP | 2008026018 A | 2/2008 |
| JP | 2008175578 A | 7/2008 |
| JP | 2008175825 | 7/2008 |
| JP | 2009063430 A | 3/2009 |
| JP | 2009243896 A | 10/2009 |
| JP | 2009271052 | 11/2009 |
| JP | 2010054263 | 3/2010 |
| JP | 2010078500 A | 4/2010 |
| JP | 2010089254 A | 4/2010 |
| JP | 2010523954 | 7/2010 |
| WO | 2004015372 | 2/2004 |
| WO | 2005017536 A1 | 2/2005 |
| WO | 2008045660 A2 | 4/2008 |
| WO | 2011136960 A1 | 11/2011 |
| WO | 2011136969 A1 | 11/2011 |

(56) References Cited

FOREIGN PATENT DOCUMENTS

| WO | 2011136970 A1 | 11/2011 |
| --- | --- | --- |
| WO | 2011136971 A1 | 11/2011 |
| WO | 2011136972 A1 | 11/2011 |

OTHER PUBLICATIONS

U.S. Office Action dated Jan. 24, 2014, issued in U.S. Appl. No. 12/930,187.
U.S. Notice of Allowance dated May 1, 2014, issued in U.S. Appl. No. 12/930,187.
U.S. Notice of Allowance dated Jul. 22, 2014, issued in U.S. Appl. No. 12/930,187.
U.S. Notice of Allowance dated Nov. 19, 2014, issued in U.S. Appl. No. 12/930,187.
U.S. Notice of Allowance dated Mar. 6, 2015, issued in U.S. Appl. No. 12/930,187.
U.S. Office Action dated Jan. 27, 2014, issued in U.S. Appl. No. 12/930,229.
U.S. Notice of Allowance dated May 2, 2014, issued in U.S. Appl. No. 12/930,229.
U.S. Notice of Allowance dated Jul. 29, 2014, issued in U.S. Appl. No. 12/930,229.
U.S. Notice of Allowance dated Nov. 24, 2014, issued in U.S. Appl. No. 12/930,229.
U.S. Notice of Allowance dated Mar. 6, 2015, issued in U.S. Appl. No. 12/930,229.
Chinese First Office Action dated Nov. 14, 2014 in Application No. 201180031703.5.
Japanese Office Action dated Sep. 1, 2014 issued in Application No. 2013-508023.
Chinese First Office Action dated Dec. 20, 2013 in Application No. 201180031805.7.
Chinese Second Office Action dated Aug. 21, 2014 in Application No. 201180031805.7.
Chinese Third Office Action dated Jan. 30, 2015 in Application No. 201180031805.7.
Japanese Office Action dated Sep. 1, 2014 issued in Application No. 2013271351.
Japanese Office Action dated Dec. 17, 2013 issued in Application No. 2013508021.
Chinese Office Action dated Oct. 21, 2014 issued in CN 201180031788.7.
Chinese First Office Action dated Nov. 5, 2013 issued in CN 201180031792.3.
Chinese Second Office Action dated Jul. 17, 2014 issued in CN 201180031792.3.
Chinese Third Office Action dated Oct. 29, 2014 issued in CN 201180031792.3.
European Examination Report dated Nov. 11, 2014 issued in EP 11 716 158.8.
Japanese Office Action dated Jan. 7, 2014 issued in JP 2013-508015.
Chinese Office Action dated Nov. 5, 2013 issued in CN 201180031787.2.
Chinese Second Office Action and Search Report dated Jul. 17, 2014 issued in CN 201180031787.2.
Chinese Third Office Action dated Oct. 29, 2014 issued in CN 201180031787.2.
European Examination Report dated Nov. 11, 2014 issued in EP 11 717 859.0.
Japanese Office Action dated Jan. 7, 2014 issued in JP 2013-508022.
Japanese Office Action dated Dec. 17, 2013 in Application No. 2013-508021.
Acar, Cenk et al., "Environmentally Robust MEMS Vibratory Gyroscopes for Automotive Applications," IEEE Sensors Journal, 9(12), 1895-1906.
International Preliminary Report on Patentability—PCT/US2011/ 032869, The International Bureau of WIPO—Geneva, Switzerland—Jul. 25, 2012.
International Preliminary Report on Patentability—PCT/US2011/ 032920, The International Bureau of WIPO—Geneva, Switzerland—Jul. 11, 2012.
International Preliminary Report on Patentability—PCT/US2011/ 032926, The International Bureau of WIPO—Geneva, Switzerland, Sep. 5, 2012.
International Preliminary Report on Patentability—PCT/US2011/ 032930, The International Bureau of WIPO—Geneva, Switzerland—Aug. 2, 2012.
International Preliminary Report on Patentability—PCT/US2011/ 032932, The International Bureau of WIPO—Geneva, Switzerland—Aug. 31, 2012.
International Search Report and Written Opinion issued Aug. 4, 2011, from Application No. PCT/US2011/032869.
International Search Report and Written Opinion issued Aug. 4, 2011, from Application No. PCT/US2011/032926.
International Search Report and Written Opinion issued Jul. 19, 2011, from Application No. PCT/US2011/032930.
International Search Report and Written Opinion issued Jul. 19, 2011, from Application No. PCT/US2011/032932.
International Search Report and Written Opinion issued Jul. 21, 2011, from Application No. PCT/US2011/032920.
Ishihara, Kel et al., "An Inertial Sensor Technology Using DRIE and Wafer Bonding with Interconnecting Capability," Journal of Microelectromechanical Systems, vol. 8, No. 4, Dec. 1999.
Kikuchi, T. et al., "Miniaturized quartz vibratory gyrosensor with hammer-headed arms", Proceedings of the 2004 IEEE International Frequency Control Symposium and Exposition, pp. 330-333, 2004.
Kotru, S., "Design and Fabrication of a Meso-Scale Gyroscope", Proceedings of the IEEE Workshop on Microelectronics and Electron Devices, pp. 5-8, 2008.
Schmidt, M. et al., "Fabrication and testing of a Micromachined Shear Sensor," Proceedings of IEEE 1987 IEDM, pp. 282-285, 1987.
Tang, William C. et al. "Electrostatic-comb Drive of Lateral Polysilicon Resonators," Transducers '89, Proceedings of the 5th International Conference on Solid-State Sensors and Actuators and Eurosensors III, vol. 2, pp. 328-331, Jun. 1990.
U.S. Appl. No. 12/930,175, entitled "Micromachined Piezoelectric Z-Axis Gyroscope," filed Dec. 30, 2010, by Acar et al.
U.S. Appl. No. 12/930,186, entitled "Micromachined Piezoelectric X-Axis Gyroscope," filed Dec. 30, 2010, by Acar et al.
U.S. Appl. No. 12/930,187, entitled "Stacked Lateral Overlap Transducer (SLOT) Based Three-Axis Accelerometer," filed Dec. 30, 2010, by Stephanou et al.
U.S. Appl. No. 12/930,229, entitled "Micromachined Piezoelectric Three-Axis Gyroscope and Stacked Lateral Overlap Transducer (SLOT) Based Three-Axis Accelerometer" filed Dec. 30, 2010, by Stephanou et al.
U.S. Appl. No. 12/930,174, entitled "Micromachined Piezoelectric X-Axis Gyroscope," filed Dec. 30, 2010, by Acar et al.
U.S. Appl. No. 61/343,598, entitled "Micromachined Piezoelectric X-Axis Gyroscope," filed Apr. 30, 2010, by Acar.
U.S. Appl. No. 61/343,601, entitled "Stacked Lateral Overlap Transducer (SLOT) Based 3-Axis MEMS Accelerometer," filed Apr. 30, 2010, by Stephanou et al.
U.S. Appl. No. 61/343,599, entitled "Micromachined Piezoelectric Z-Axis Gyroscope", filed Apr. 30, 2010, by Acar.
U.S. Appl. No. 61/343,600, entitled "Micromachined Piezoelectric X-Axis & Z-Axis Gyroscope and Stacked Lateral Overlap Transducer (SLOT) Based 3-Axis MEMS Accelerometer" filed Apr. 30, 2010, by Acar et al.
Voss, R. et al., "Silicon Angular Rate Sensor for Automotive Applications with Piezoelectric Drive and Piezoresistive Read-out", Proceedings of the 1997 International Conference on Solid-State Sensors and Actuators—Transducers 97, pp. 879-882.
Written Opinion of the International Preliminary Examining Authority issued Apr. 10, 2012, from Application No. PCT/US2011/032920.
Written Opinion of the International Preliminary Examining Authority issued Apr. 23, 2012, from Application No. PCT/US2011/032930.
Written Opinion of the International Preliminary Examining Authority issued Apr. 5, 2012, from Application No. PCT/US2011/032869.
Written Opinion of the International Preliminary Examining Authority issued May 8, 2012, from Application No. PCT/U82011/032926.

(56) References Cited

OTHER PUBLICATIONS

U.S. Office Action Feb. 26, 2013, issued in U.S. Appl. No. 12/930,186.
U.S. Office Action Feb. 21, 2013, issued in U.S. Appl. No. 12/930,174.
U.S. Office Action dated Apr. 5, 2013, issued in U.S. Appl. No. 12/930,187.
U.S. Office Action dated Apr. 5, 2013, issued in U.S. Appl. No. 12/930,229.
U.S. Office Action dated Feb. 12, 2013, issued in U.S. Appl. No. 12/930,175.
U.S. Notice of Allowance dated Jun. 20, 2013, issued in U.S. Appl. No. 12/930,174.
US Notice of Allowance in U.S. Appl. No. 12/930,175 dated Jun. 26, 2013.
US Final Rejection in U.S. Appl. No. 12/930,187 dated Aug. 6, 2013.
US Final Rejection in U.S. Appl. No. 12/930,229 dated Aug. 6, 2013.
US Notice of Allowance dated Jul. 18, 2013, issued in U.S. Appl. No. 12/930,186.
U.S. Office Action (Ex Parte Quayle) dated Mar. 30, 2016, issued in U.S. Appl. No. 14/054,617.
U.S. Notice of Allowance dated Apr. 13, 2016, issued in U.S. Appl. No. 13/956,147.
U.S. Notice of Allowance (Supplemental Notice of Allowability) dated Apr. 14, 2015, issued in U.S. Appl. No. 12/930,187.
U.S. Notice of Allowance (Supplemental Notice of Allowability) dated Apr. 2, 2015, issued in U.S. Appl. No. 12/930,229.
Chinese Second Office Action dated Jun. 24, 2015 issued in Application No. CN 201180031703.5.
European Office Action dated Mar. 26, 2015 issued in Application No. EP 11 716 161.2.
Chinese Second Office Action dated May 5, 2015 issued in Application No. CN 201180031788.7.
Chinese Fourth Office Action dated May 27, 2015 issued in Application No. CN 201180031787.2.

\* cited by examiner

Common Voltages

| Segment Voltages | | $VC_{ADD\_H}$ | $VC_{HOLD\_H}$ | $VC_{REL}$ | $VC_{HOLD\_L}$ | $VC_{ADD\_L}$ |
|---|---|---|---|---|---|---|
| | $VS_H$ | Stable | Stable | Relax | Stable | Actuate |
| | $VS_L$ | Actuate | Stable | Relax | Stable | Stable |

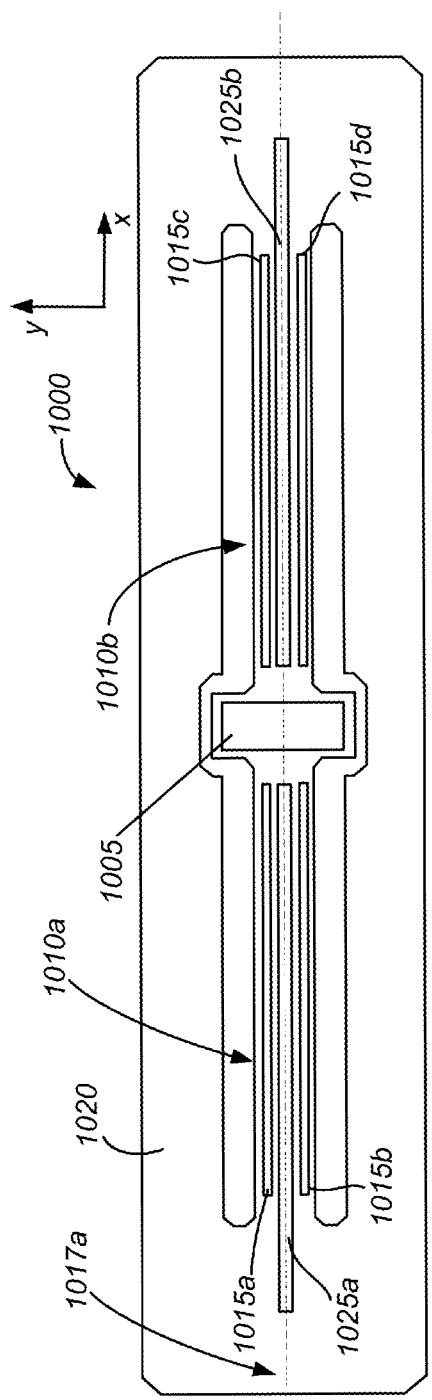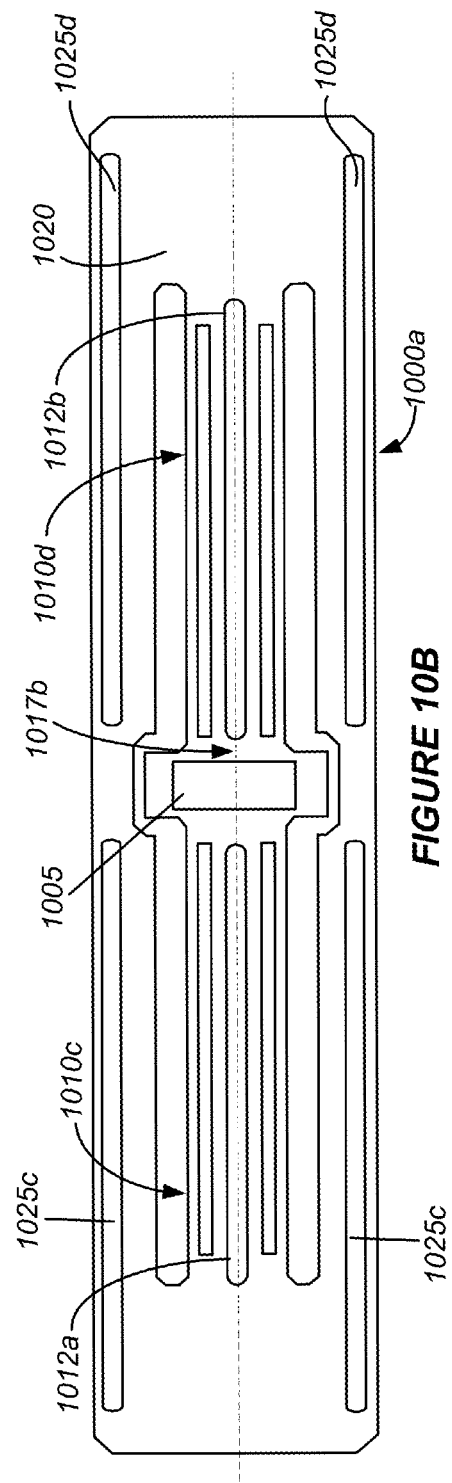
FIGURE 10A
FIGURE 10B

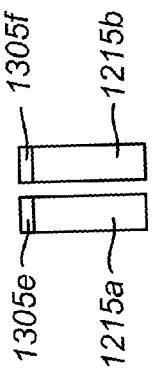
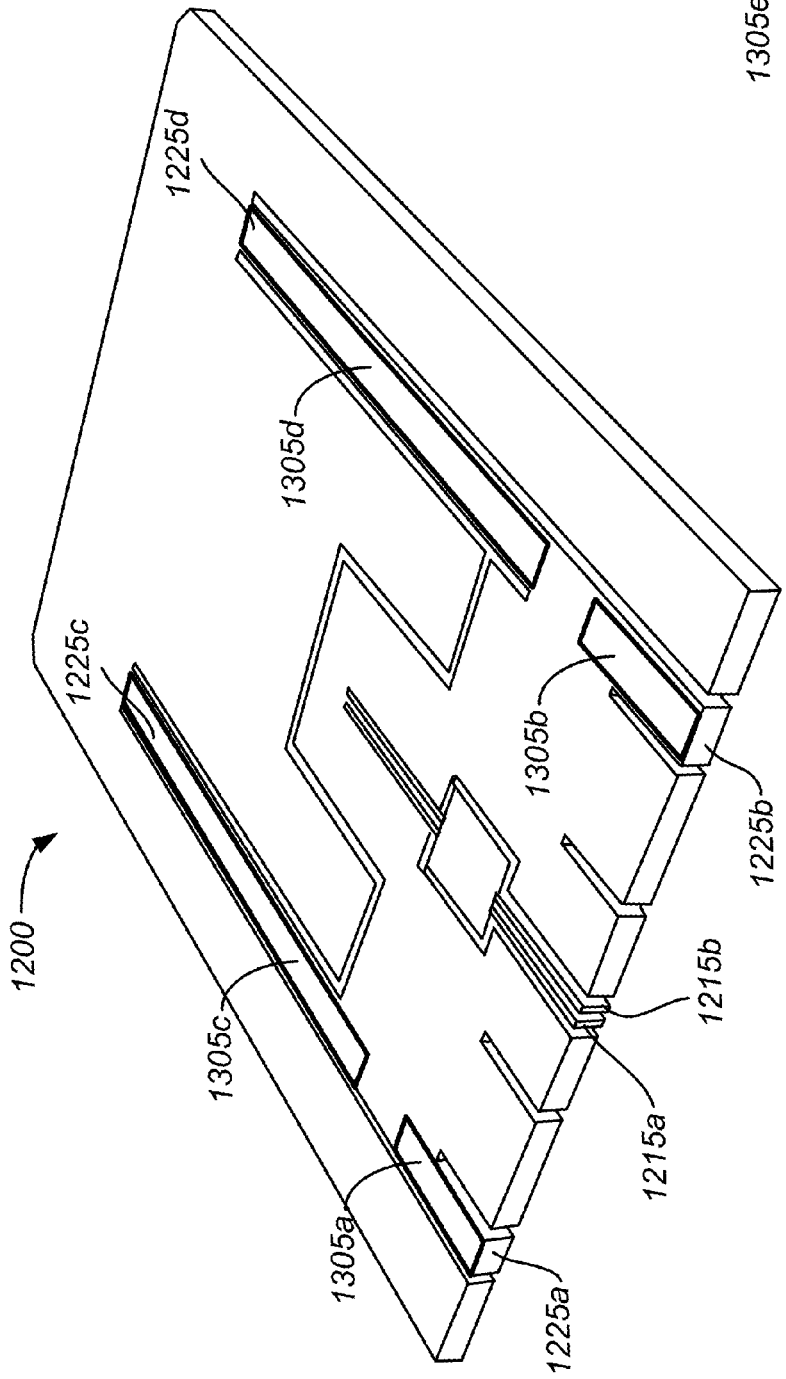
FIGURE 13B
FIGURE 13A

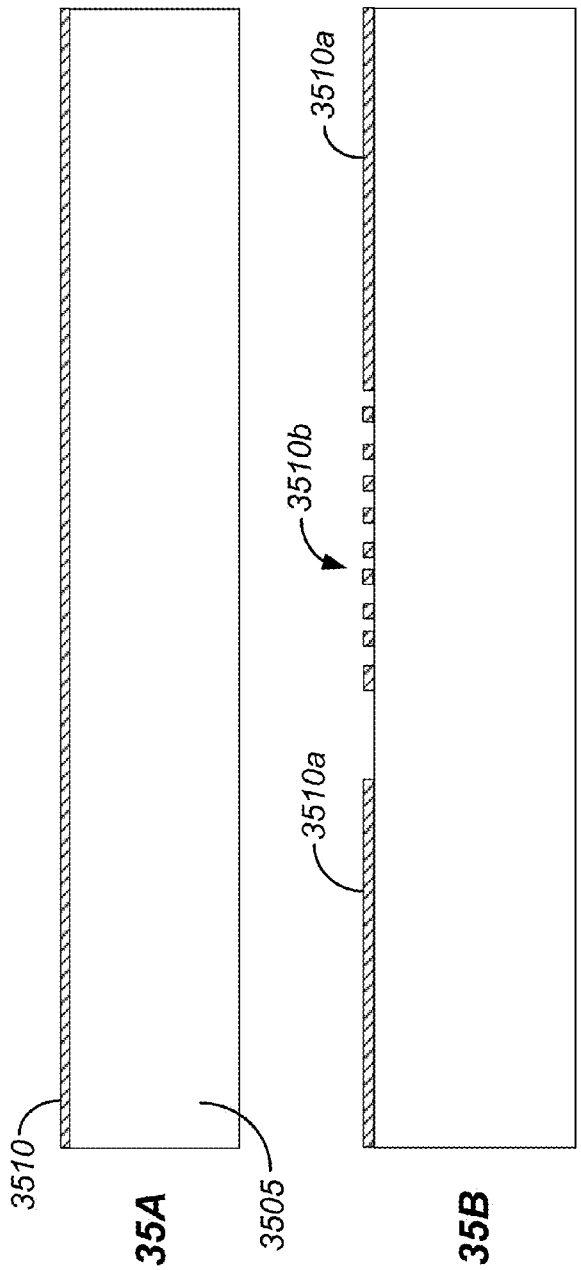
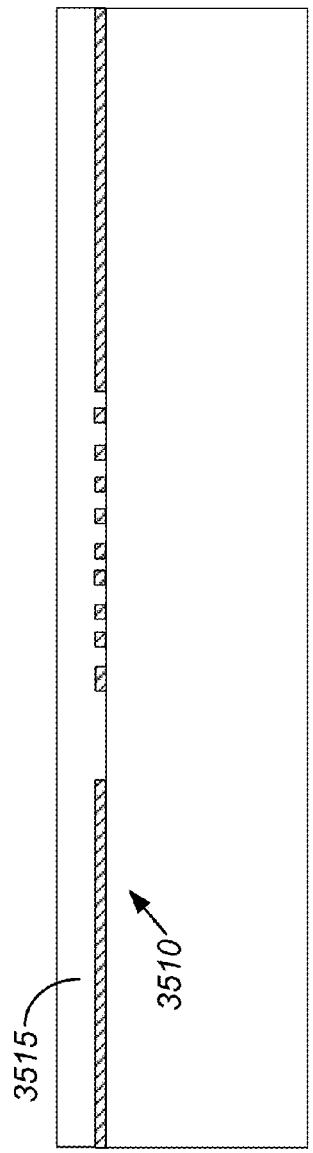
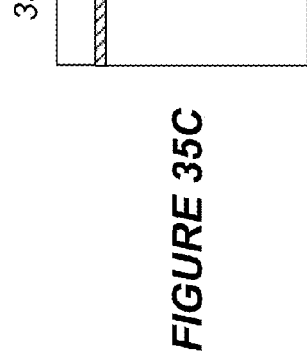
FIGURE 35A
FIGURE 35B
FIGURE 35C

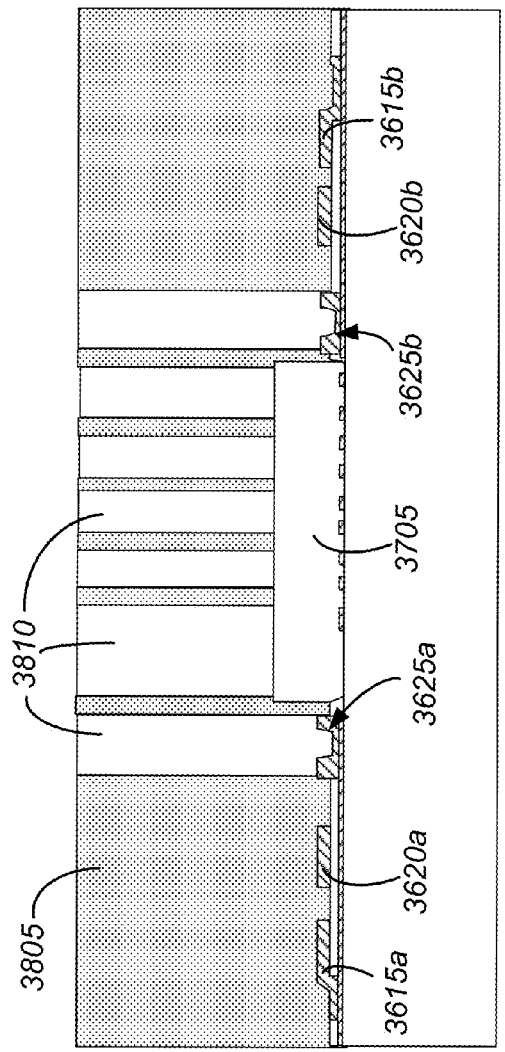
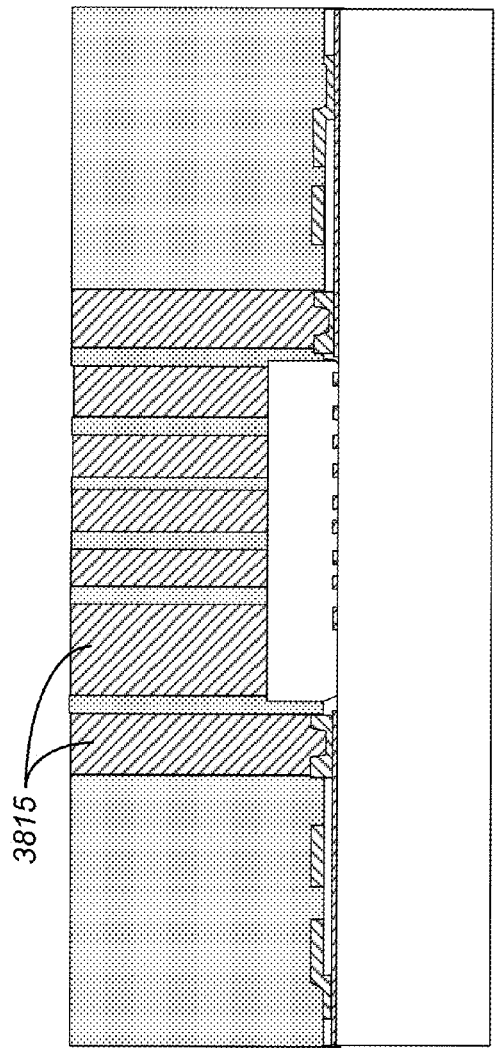
FIGURE 38A
FIGURE 38B

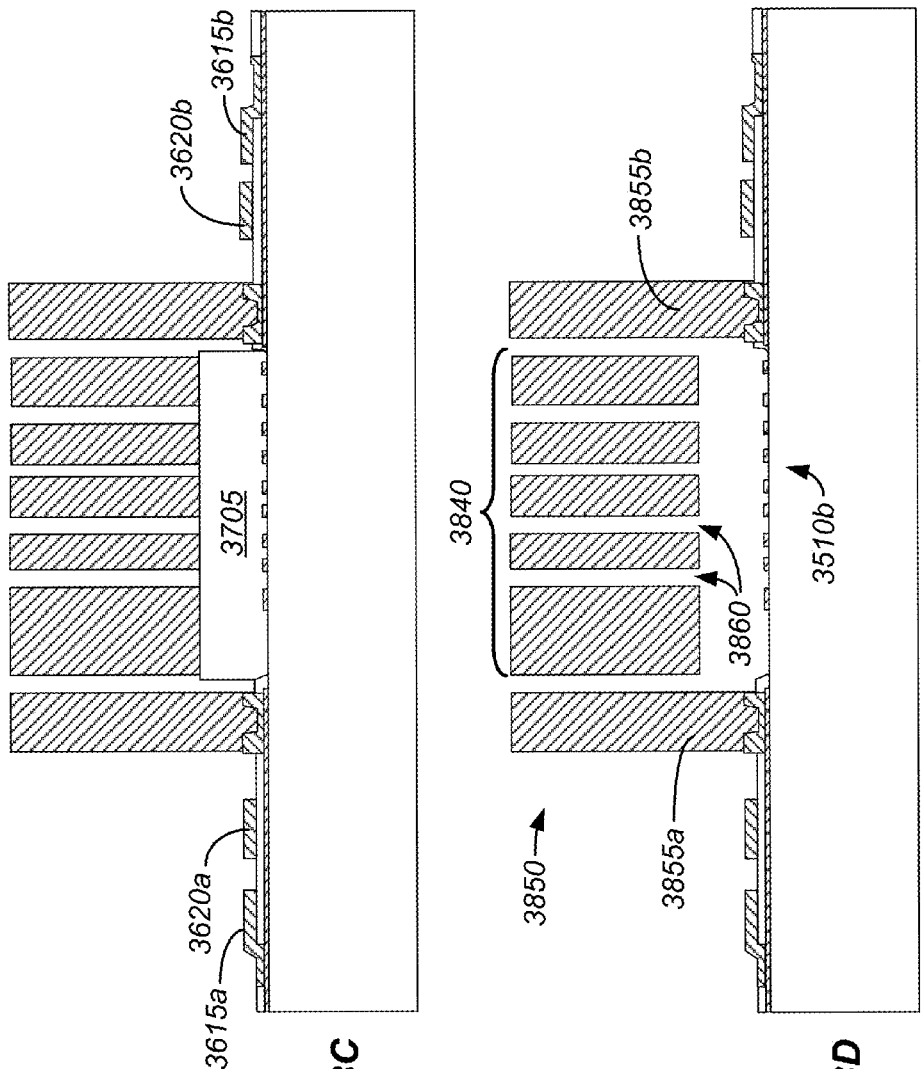

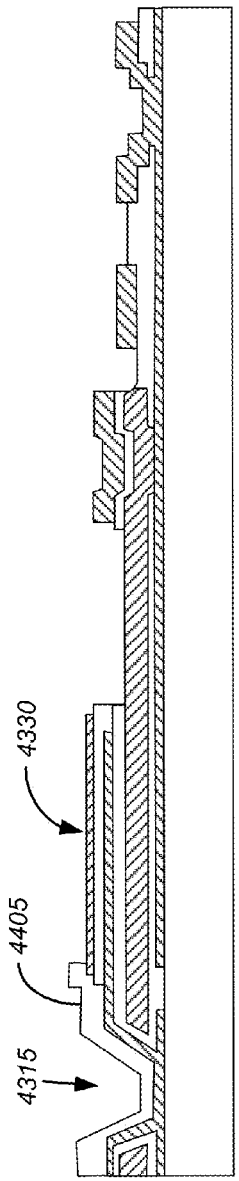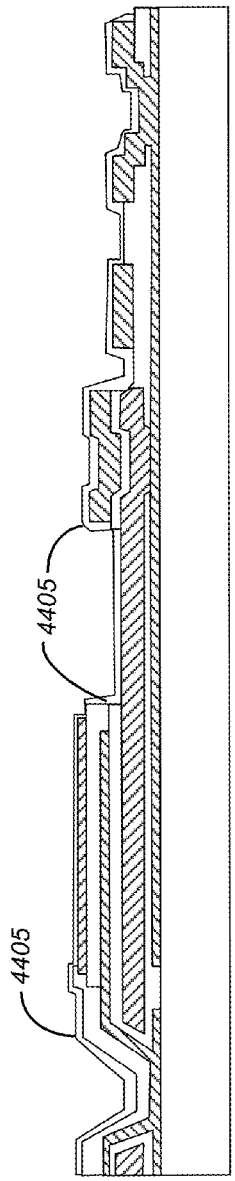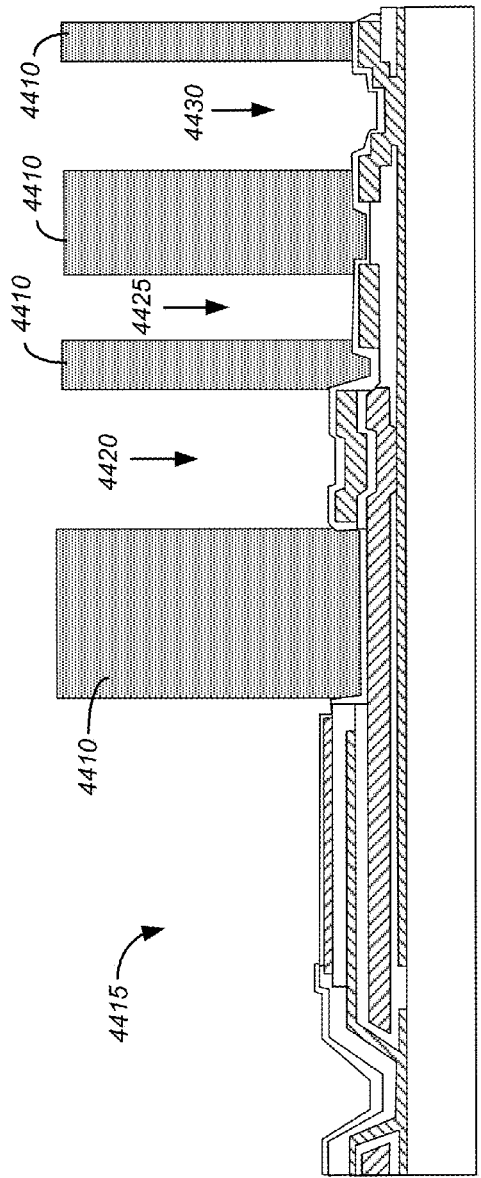
FIGURE 44A
FIGURE 44B
FIGURE 44C

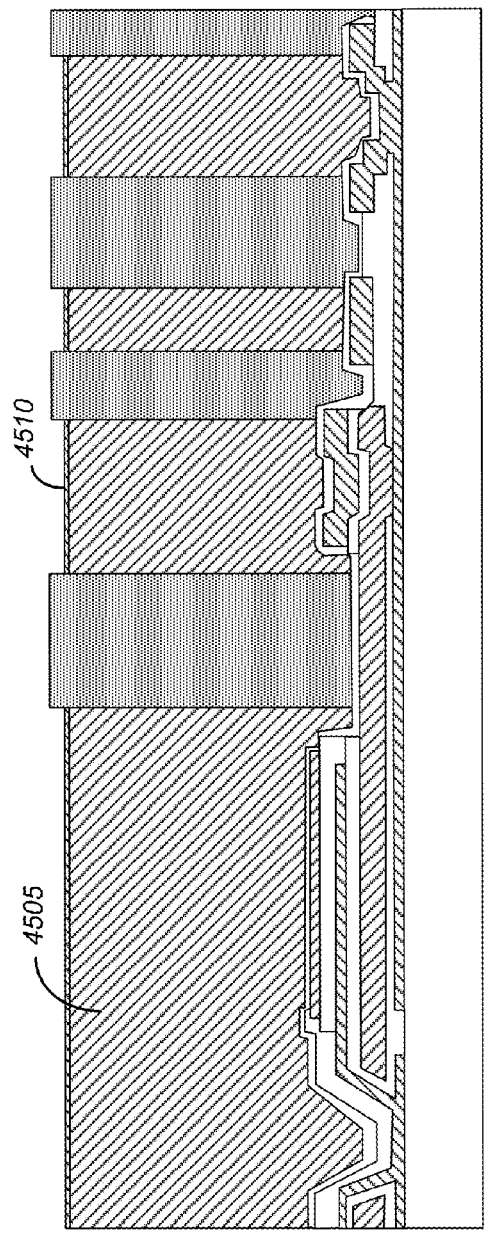
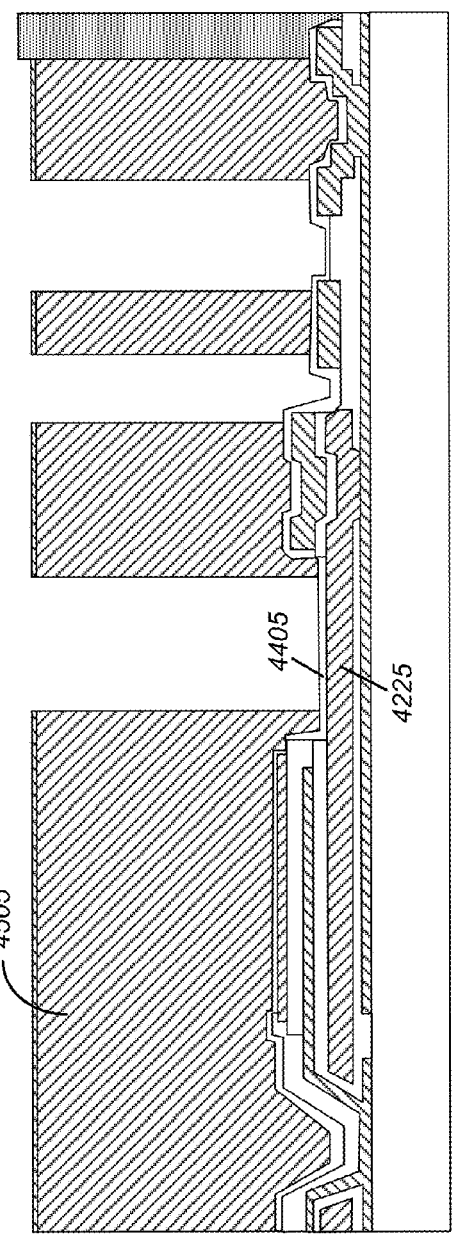
FIGURE 45A
FIGURE 45B

MICROMACHINED PIEZOELECTRIC Z-AXIS GYROSCOPE

CROSS-REFERENCE TO RELATED APPLICATIONS

This disclosure claims priority to U.S. Provisional Patent Application No. 61/343,598, filed Apr. 30, 2010, entitled "MICROMACHINED PIEZOELECTRIC X-AXIS GYROSCOPE" and assigned to the assignee hereof. This disclosure also claims priority to U.S. Provisional Patent Application No. 61/343,599, filed Apr. 30, 2010, entitled "MICROMACHINED PIEZOELECTRIC Z-AXIS GYROSCOPE" and assigned to the assignee hereof. This disclosure also claims priority to U.S. Provisional Patent Application No. 61/343,601, filed Apr. 30, 2010, entitled "STACKED LATERAL OVERLAP TRANSDUCER (SLOT) BASED 3-AXIS MEMS ACCELEROMETER" and assigned to the assignee hereof. This disclosure also claims priority to U.S. Provisional Patent Application No. 61/343,600, filed Apr. 30, 2010, entitled "MICROMACHINED PIEZOELECTRIC X-AXIS & Z-AXIS GYROSCOPE AND STACKED LATERAL OVERLAP TRANSDUCER (SLOT) BASED 3-AXIS MEMS ACCELEROMETER" and assigned to the assignee hereof. This disclosure claims priority to, and is a divisional of, U.S. patent application Ser. No. 12/930,175, filed Dec. 30, 2010, entitled "MICROMACHINED PIEZOELECTRIC Z-AXIS GYROSCOPE" and assigned to the assignee hereof. The disclosure of these prior applications is considered part of, and is incorporated by reference in, this disclosure.

This application is related to U.S. patent application Ser. No. 12/930,186, entitled "MICROMACHINED PIEZOELECTRIC X-AXIS GYROSCOPE" and filed on Dec. 30, 2010, and is also related to U.S. patent application Ser. No. 12/930,174, entitled "MICROMACHINED PIEZOELECTRIC X-AXIS GYROSCOPE" and filed on Dec. 30, 2010, and is also related to U.S. patent application Ser. No. 12/930,187, entitled "STACKED LATERAL OVERLAP TRANSDUCER (SLOT) BASED THREE-AXIS ACCELEROMETER" and filed on Dec. 30, 2010, and is also related to U.S. patent application Ser. No. 12/930,229, entitled "MICROMACHINED PIEZOELECTRIC THREE-AXIS GYROSCOPE AND STACKED LATERAL OVERLAP TRANSDUCER (SLOT) BASED THREE-AXIS ACCELEROMETER" and filed on Dec. 30, 2010, all of which are hereby incorporated by reference and for all purposes.

TECHNICAL FIELD

This disclosure relates to electromechanical systems, and more specifically to multi-axis gyroscopes and accelerometers.

DESCRIPTION OF THE RELATED TECHNOLOGY

Electromechanical systems include devices having electrical and mechanical elements, actuators, transducers, sensors, optical components (e.g., mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of electromechanical systems device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Recently, there has been increased interest in fabricating small-scale gyroscopes and accelerometers. For example, some gyroscopes and/or accelerometers have been incorporated into mobile devices, such as mobile display devices. Although such gyroscopes and accelerometers are satisfactory in some respects, it would be desirable to provide improved small-scale gyroscopes and accelerometers.

SUMMARY

The systems, methods and devices of the disclosure each have several innovative aspects, no single one of which is solely responsible for the desirable attributes disclosed herein.

One innovative aspect of the subject matter described in this disclosure can be implemented in a gyroscope that includes a central anchor, a sense frame disposed around the central anchor, a plurality of sense beams configured for connecting the sense frame to the central anchor and a drive frame disposed around and coupled to the sense frame. The drive frame may include a first side and a second side.

The gyroscope may include a plurality of drive beams disposed on opposing sides of the sense frame. The drive beams may be configured to drive the first side of the drive frame in a first direction along a first axis substantially in the plane of the drive frame. The drive beams may be further configured to drive the second side of the drive frame in a second and opposing direction along the first axis.

The gyroscope may include a drive frame suspension that is configured to substantially restrict a drive motion of the drive frame to that of a substantially linear displacement along the first axis. The drive frame suspension may include a plurality of flexures configured for coupling the sense frame to the drive frame. The drive frame suspension may include a plurality of flexures. Each flexure of the plurality of flexures may be configured for coupling a pair of drive beams to the drive frame.

The gyroscope may also include a sense frame suspension configured to be compliant to rotation around a second axis orthogonal to the first axis. The sense frame suspension may be configured to resist motion along the first axis. The sense frame suspension may include a plurality of slots between the central anchor and the sense frame. The sense frame may be substantially decoupled from drive motions of the drive frame.

The plurality of sense beams may include a first pair of sense beams extending from a first side of the central anchor along the first axis and a second pair of sense beams extending from a second side of the central anchor along a second axis substantially perpendicular to the first axis, the second side of the central anchor being adjacent to the first side of the central anchor. The sense frame suspension may include a slot extending along a first sense beam of the first pair of sense beams, along the central anchor to the second pair of sense beams and along a second sense beam of the second pair of sense beams.

The plurality of drive beams may include pairs of drive beams on opposing sides of the sense frame. The pairs of drive beams may be disposed along a second axis that is substantially perpendicular to the first axis. The drive beams may be configured to be actuated by applying anti-phase voltages to each pair of drive beams.

The gyroscope may also include an array of electrostatic actuators configured to tune a resonant frequency of drive frame motion. The array of electrostatic actuators may be configured to suppress quadrature coupling from the drive frame to the sense frame.

The drive beams and/or the sense beams may include a piezoelectric layer. The sense frame and/or the drive frame may be formed, at least in part, from plated metal. The drive frame may include a plurality of slots formed along an axis that is substantially perpendicular to the first axis.

Methods of fabricating a gyroscope are also provided herein. Some such methods may involve depositing electrodes on a substrate, forming a central anchor, forming a sense frame disposed around the central anchor and forming a plurality of sense beams. Each of the sense beams may include sense electrodes, such as piezoelectric sense electrodes. The sense beams may be configured for connecting the sense frame to the central anchor.

Some such methods may involve forming a drive frame and forming a plurality of drive beams. The drive frame may be disposed around and coupled to the sense frame. The drive frame may include a first side and a second side. The plurality of drive beams may be disposed on opposing sides of the sense frame. The drive beams may be configured to drive the first side of the drive frame in a first direction along a first axis in the plane of the drive frame. The drive beams may be further configured to drive the second side of the drive frame in a second and opposing direction along the first axis.

Such methods may involve forming a drive frame suspension and forming a sense frame suspension. The drive frame suspension may be configured to substantially restrict a drive motion of the drive frame to that of a substantially linear displacement along the first axis. The sense frame suspension may be compliant to rotation around a second axis orthogonal to the first axis. The sense frame suspension may be configured to resist motion along the first axis.

Forming the plurality of sense beams may involve depositing a first metal layer that is in contact with the electrodes, depositing a piezoelectric layer on the first metal layer, depositing a second metal layer on the piezoelectric layer and electroplating a third metal layer on the second metal layer. The method may involve separating the substrate into a plurality of sub-panels prior to the electroplating.

The process of forming the central anchor may involve etching through a sacrificial layer to expose the first metal layer, depositing an oxide layer on the first metal layer, forming a seed layer on the oxide layer and electroplating the third metal layer on the seed layer. Forming the sense frame and the drive frame may involve etching between a drive frame area and a sense frame area, depositing high aspect ratio photoresist material between the drive frame area and the sense frame area and electroplating the third metal layer in the drive frame area and the sense frame area.

Forming the sense frame and the drive frame may also involve removing the high aspect ratio photoresist material from between the drive frame area and the sense frame area, etching to expose a sacrificial layer disposed below the drive frame and the sense frame and removing the sacrificial layer to release the drive frame and the sense frame.

In some implementations, the apparatus may also include a display, a processor and a memory device. The processor may be configured to communicate with the display and with the gyroscope. The processor may be configured to process image data and gyroscope data. The memory device may be configured to communicate with the processor. The apparatus may also include an input device configured to receive input data and to communicate the input data to the processor. The apparatus may also include a driver circuit configured to send at least one signal to the display. The apparatus may also include a controller configured to send at least a portion of the image data to the driver circuit. The apparatus may also include an image source module configured to send the image data to the processor. The image source module may include at least one of a receiver, transceiver, and transmitter.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

BRIEF DESCRIPTION OF THE DRAWINGS

FIG. 10A shows an example of a gyroscope having a proof mass suspended by drive beams attached to a central anchor.

FIG. 10B shows an example of a gyroscope implementation similar to that of FIG. 10A, but having a gap between the drive electrodes.

FIG. 13A shows an example of a cross-section of a gyroscope implementation such as that shown in FIG. 12.

FIG. 13B shows an example of an enlarged pair of drive beams of the gyroscope implementation shown in FIG. 13A.

FIGS. 35A through 39B show examples of cross-sectional views of various blocks in a process of fabricating accelerometers.

FIGS. 42A through 46B show examples of cross-sectional views through a substrate, a portion of a gyroscope and portions of structures for packaging the gyroscope and making electrical connections with the gyroscope, at various stages during the process outlined in FIG. 41.

Like reference numbers and designations in the various drawings indicate like elements.

DETAILED DESCRIPTION

Figure 1:
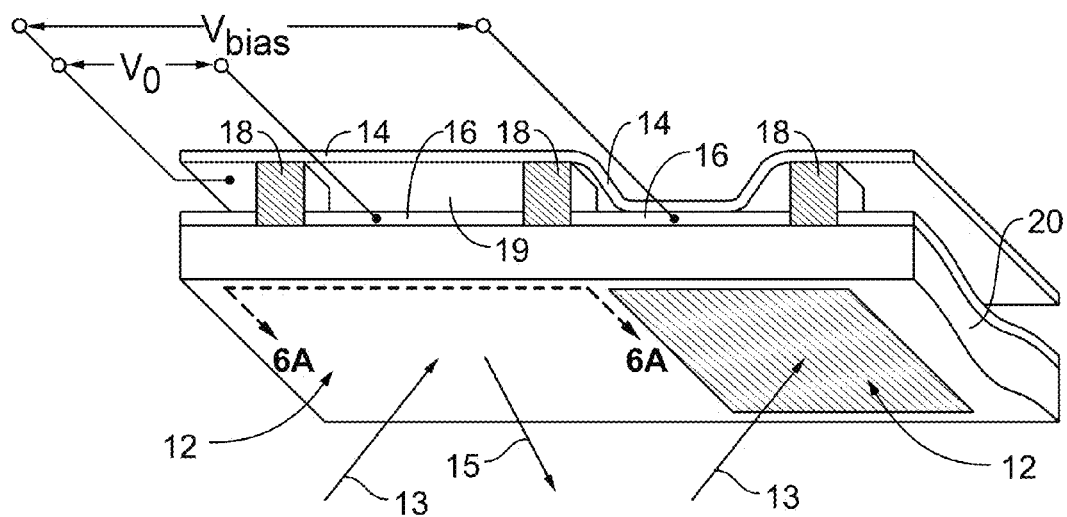
FIG. 1 shows an example of an isometric view depicting two adjacent pixels in a series of pixels of an interferometric modulator (IMOD) display device.

The following detailed description is directed to certain implementations for the purposes of describing the innovative aspects. However, the teachings herein can be applied in a multitude of different ways. The described implementations may be implemented in any device that is configured to display an image, whether in motion (e.g., video) or stationary (e.g., still image), and whether textual, graphical or pictorial. More particularly, it is contemplated that the implementations may be implemented in or associated with a variety of electronic devices such as, but not limited to, mobile telephones, multimedia Internet enabled cellular telephones, mobile television receivers, wireless devices, smartphones, bluetooth devices, personal data assistants (PDAs), wireless electronic mail receivers, hand-held or portable computers, netbooks, notebooks, smartbooks, printers, copiers, scanners, facsimile devices, GPS receivers/navigators, cameras, MP3 players, camcorders, game consoles, wrist watches, clocks, calculators, television monitors, flat panel displays, electronic reading devices (e.g., e-readers), computer monitors, auto displays (e.g., odometer display, etc.), cockpit controls and/or displays, camera view displays (e.g., display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (e.g., MEMS and non-MEMS), aesthetic structures (e.g., display of images on a piece of jewelry) and a variety of electromechanical systems devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

This disclosure describes various types of inertial sensors, how such sensors may be fabricated and how such sensors may be used. For example, some implementations described herein provide an x-axis gyroscope with low quadrature and bias error. The gyroscope is well suited to manufacturing on flat-panel display glass. Some such implementations include a proof mass that can oscillate torsionally in-plane (about the z-axis) in the drive mode and torsionally out-of-plane in the sense mode. By changing its orientation within the plane, the gyroscope can function as a y-axis gyroscope. Additionally, by disposing the gyroscope in an orthogonal plane, the gyroscope can function as a z-axis gyroscope.

However, some implementations described herein provide a z-axis gyroscope that may be fabricated and/or disposed in the same plane as the x-axis gyroscope and the y-axis gyroscope. Various z-axis gyroscopes described herein also can have low quadrature and bias error. Some implementations include a drive proof mass that may be piezoelectrically driven in a substantially linear, x-directed motion (in-plane). The drive proof mass may be mechanically coupled to a sense proof mass, which vibrates torsionally in the presence of angular rotation about the z-axis. Motion of the sense proof mass can induce charge in a piezoelectric film on beams connecting the sense mass to a substrate anchor. The charge may be read out and processed electronically.

The proof masses can be made from a variety of materials such as thick plated-metal alloys (e.g., nickel-manganese (Ni—Mn)), single crystal silicon from the device layer of a silicon on insulator (SOI) wafer, glass, and others. The piezoelectric film can be aluminum nitride (AlN), zinc oxide (ZnO), lead zirconate titanate (PZT), or other thin films, or single crystal materials such as quartz, lithium niobate, lithium tantalate, and others. Some implementations are well suited for manufacturing on flat-panel display glass.

Various implementations described herein provide novel three-axis accelerometers, as well as components thereof. Such three-axis accelerometers have sizes, performance levels and costs that are suitable for use in consumer electronic applications such as portable navigation devices and smart phones. Some such implementations provide a capacitive stacked lateral overlap transducer (SLOT) based three-axis accelerometer. Some implementations provide three-axis sensing using two proof masses, whereas other implementations provide three-axis sensing using only one proof mass. Different flexure types may be optimized for each axis.

Particular implementations of the subject matter described in this disclosure can be implemented to realize one or more of the following potential advantages. For example, in some such implementations the x-axis gyroscopes, z-axis gyroscopes and/or SLOT-based three-axis accelerometers may share layers that are deposited during a fabrication process. Combining such processes can enable the monolithic integration of six inertial sensing axes on a single substrate, such as a single glass substrate. Many implementations described herein may be fabricated on large area glass panels. The fabrication processes that may be used in forming SLOT-based three-axis accelerometers on large area glass panels is compatible with processes for fabricating piezoelectric aluminum nitride (AlN) (or other piezoelectric materials) on plated metal multi-axis MEMS gyroscopes, such as the x-axis, y-axis and z-axis gyroscopes described herein. Accordingly, some implementations described herein involve fabricating x-axis gyroscopes, y-axis gyroscopes, z-axis gyroscopes and SLOT-based three-axis accelerometers on the same glass substrate.

One example of a suitable MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity, i.e., by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, reflecting light outside of the visible range (e.g., infrared light). In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12. In the IMOD 12 on the left (as illustrated), a movable reflective layer 14 is illustrated in a relaxed position at a predetermined distance from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near or adjacent the optical stack 16. The voltage $V_{bias}$ applied across the IMOD 12 on the right is sufficient to maintain the movable reflective layer 14 in the actuated position.

In FIG. 1, the reflective properties of pixels 12 are generally illustrated with arrows 13 indicating light incident upon the pixels 12, and light 15 reflecting from the IMOD 12 on the left. Although not illustrated in detail, it will be understood by one having ordinary skill in the art that most of the light 13 incident upon the pixels 12 will be transmitted through the transparent substrate 20, toward the optical stack 16. A portion of the light incident upon the optical stack 16 will be transmitted through the partially reflective layer of the optical stack 16, and a portion will be reflected back through the transparent substrate 20. The portion of light 13 that is transmitted through the optical stack 16 will be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the IMOD 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, e.g., chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and conductor, while different, more conductive layers or portions (e.g., of the optical stack 16 or of other structures of the IMOD) can serve to bus signals between IMOD pixels. The optical stack 16 also can include one or more insulating or dielectric layers covering one or more conductive layers or a conductive/absorptive layer.

In some implementations, the layer(s) of the optical stack 16 can be patterned into parallel strips, and may form row electrodes in a display device as described further below. As will be understood by one having skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be on the order of 1-1000 um, while the gap 19 may be on the order of <10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the IMOD 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated IMOD 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
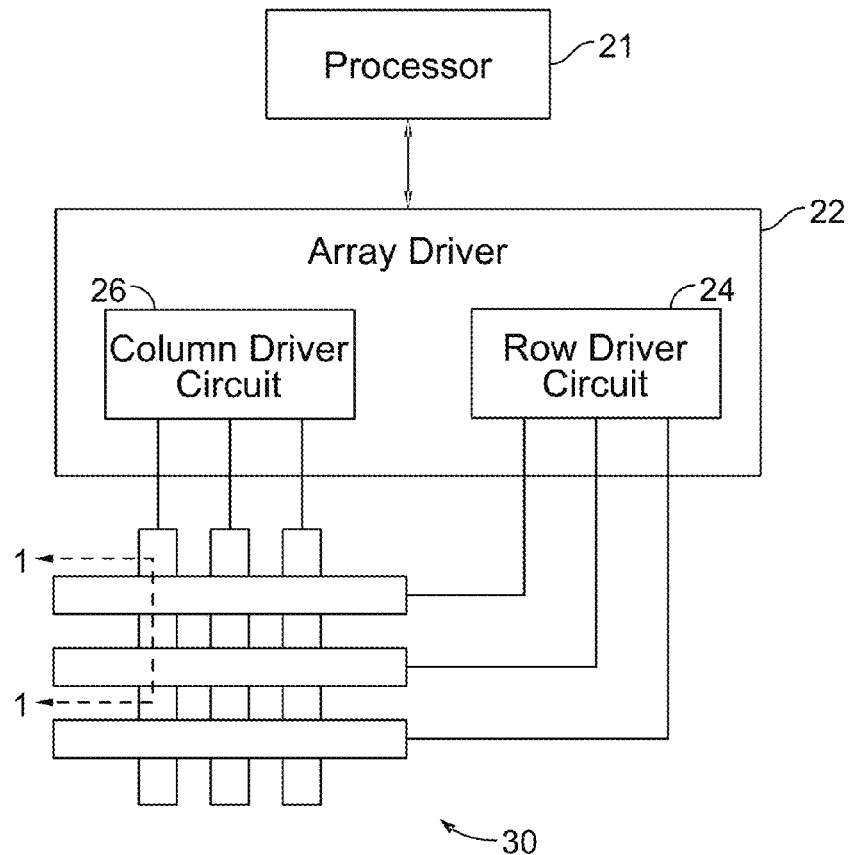
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
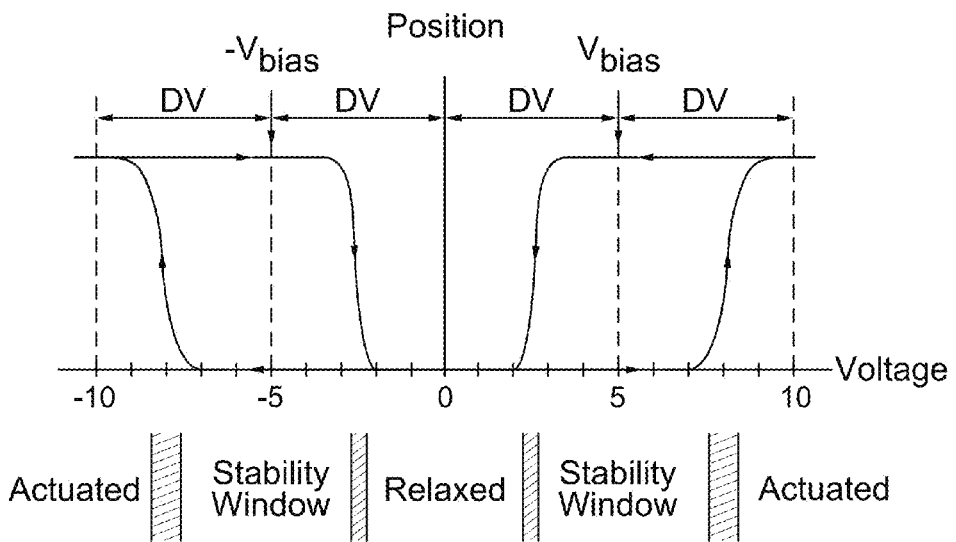
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10 volts, however, the movable reflective layer does not relax completely until the voltage drops below 2 volts. Thus, a range of voltage, approximately 3 to 7 volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10 volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7 volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window both when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
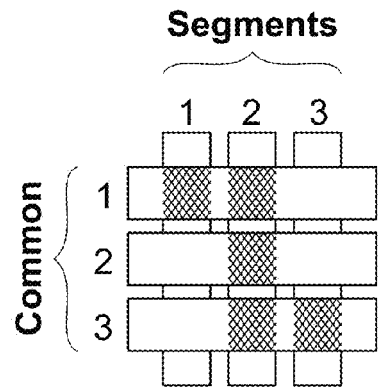
FIG. 5A shows an example of a diagram illustrating a frame of display data in the 3×3 interferometric modulator display of FIG. 2.
Figure 5B:
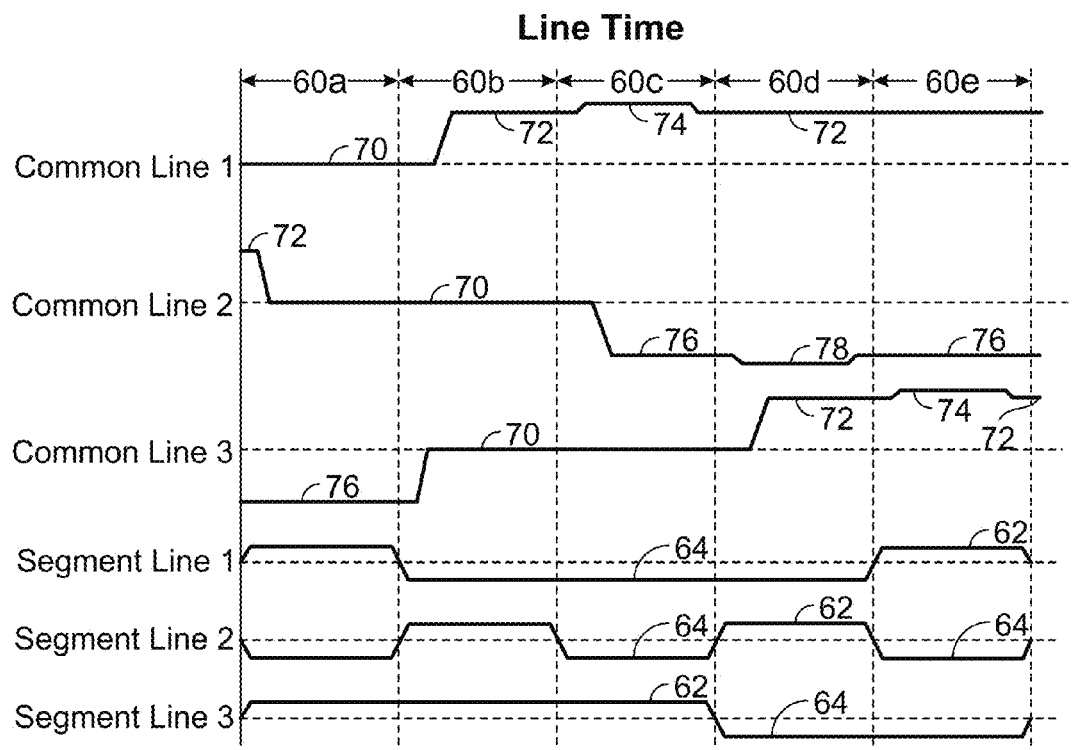
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a, a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$—relax and $VC_{HOLD\_L}$—stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
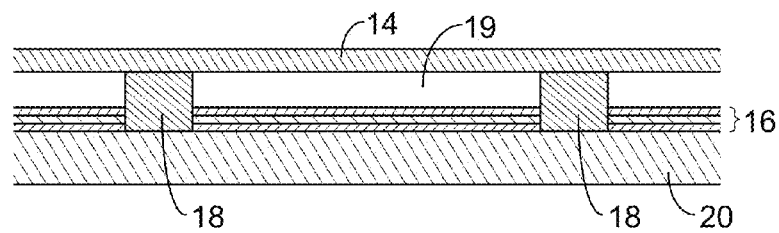
FIG. 6A shows an example of a partial cross-section of the interferometric modulator display of FIG. 1.
Figure 6B:
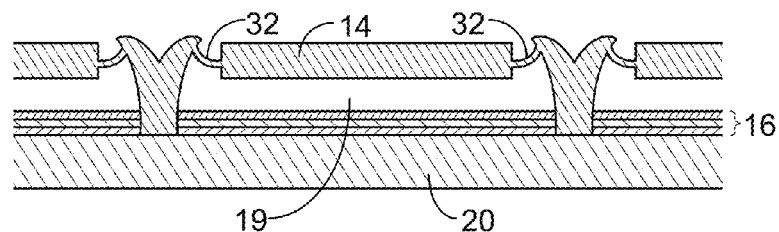
FIGS. 6B-6E show examples of cross-sections of varying implementations of interferometric modulators.
Figure 6C:
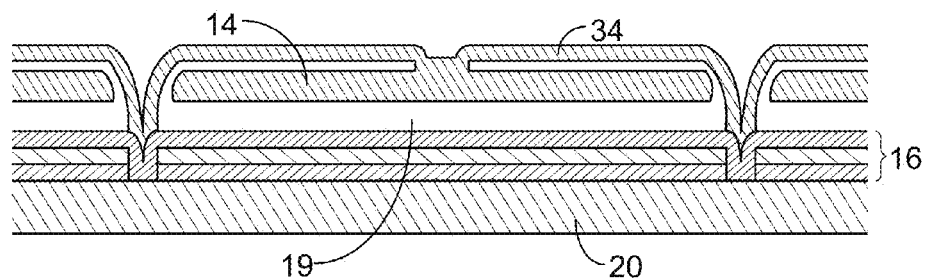

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
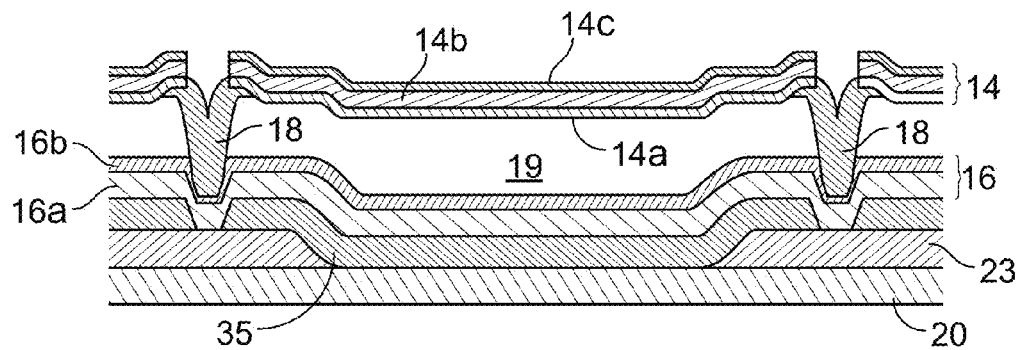

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, an $SiO_2$/SiON/$SiO_2$ tri-layer stack. Either or both of the reflective sub-layer 14a and the conductive layer 14c can include, e.g., an Al alloy with about 0.5% Cu, or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, an $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, $CF_4$ and/or $O_2$ for the MoCr and $SiO_2$ layers and $Cl_2$ and/or $BCl_3$ for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
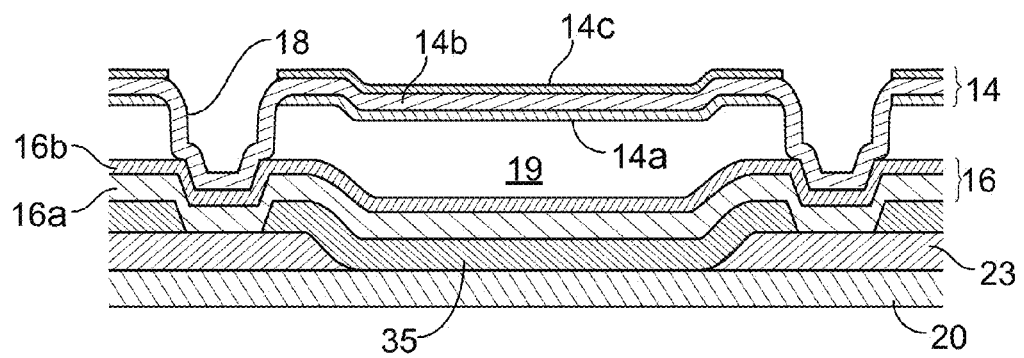

FIG. 6E shows another example of an IMOD, where the movable reflective layer 14 is self supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as, e.g., patterning.

Figure 7:
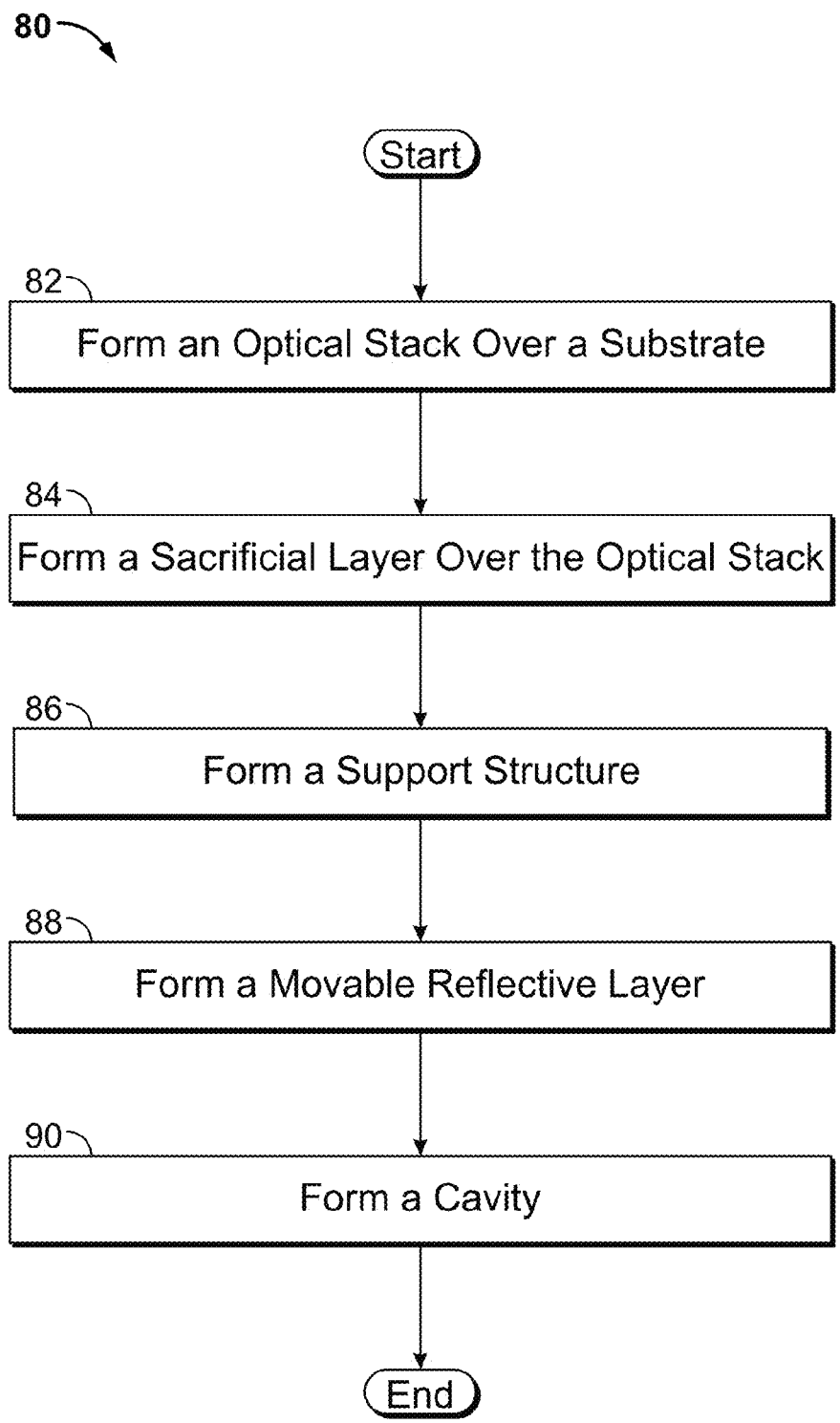
FIG. 7 shows an example of a flow diagram illustrating a manufacturing process for an interferometric modulator.
Figure 8A:
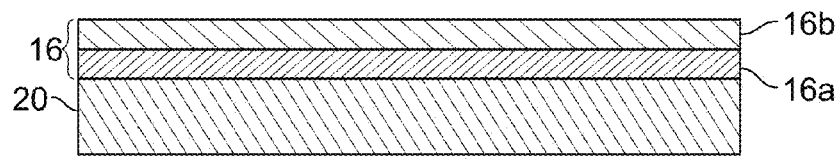
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
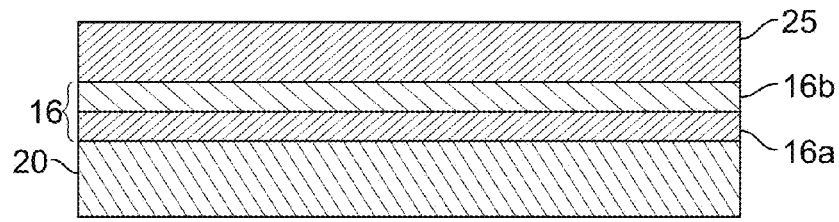

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride (XeF$_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
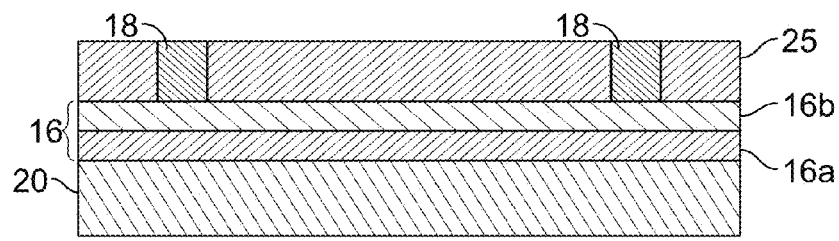

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
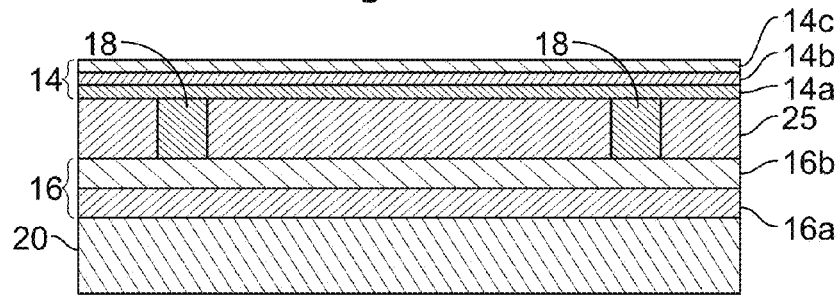
Figure 8E:
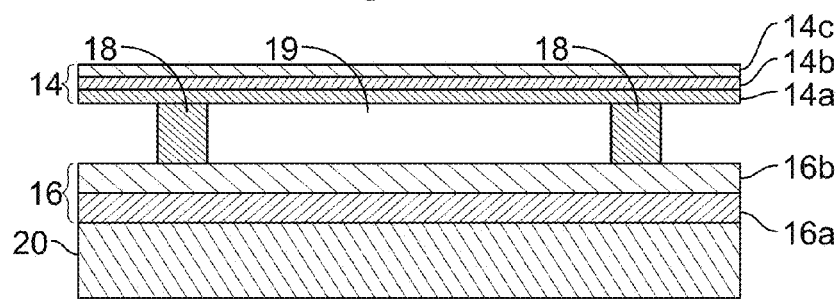

The process 80 continues at block 88 with the formation of a movable reflective layer or membrane such as the movable reflective layer 14 illustrated in FIGS. 1, 6 and 8D. The movable reflective layer 14 may be formed by employing one or more deposition processes, e.g., reflective layer (e.g., aluminum, aluminum alloy) deposition, along with one or more patterning, masking, and/or etching processes. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 may also be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as Mo or amorphous Si may be removed by dry chemical etching, e.g., by exposing the sacrificial layer 25 to a gaseous or vaporous etchant, such as vapors derived from solid XeF$_2$ for a period of time that is effective to remove the desired amount of material, typically selectively removed relative to the structures surrounding the cavity 19. Other combinations of etchable sacrificial material and etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Description of Micromachined Piezoelectric X-Axis and Y-Axis Gyroscope Implementations Some disclosed micromachined piezoelectric gyroscope structures provide an improved mechanical sensing element that overcomes some performance-related limitations of conventional piezoelectric tuning-fork gyroscopes.

Prior Art Gyroscopes

Figure 9A:
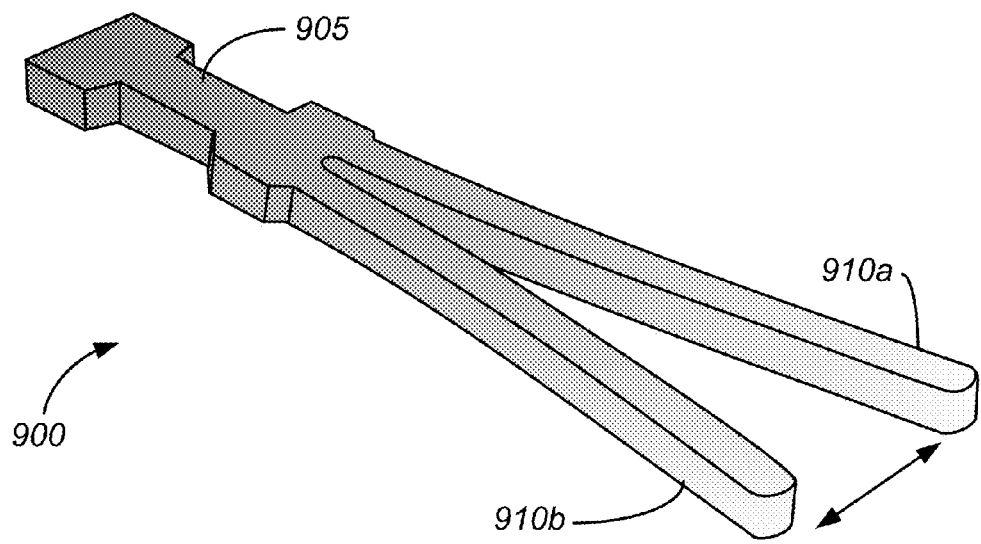
FIGS. 9A and 9B show examples of the drive and sense modes of a single-ended tuning-fork gyroscope.
Figure 9B:
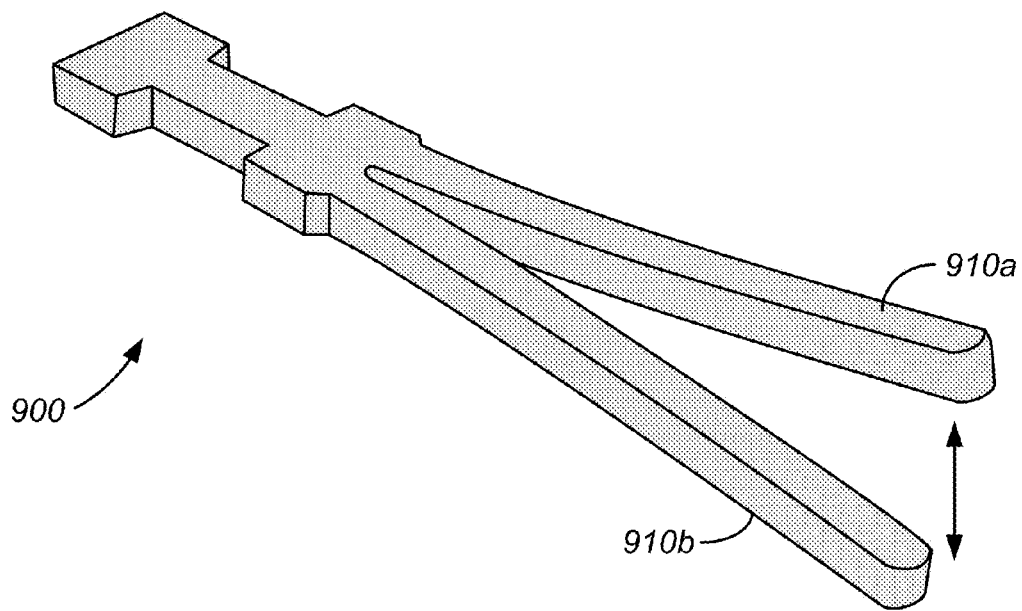

Conventional piezoelectric gyroscopes utilize either a single-ended or a double-ended tuning-fork structure. FIGS. 9A and 9B show examples of the drive and sense modes of a single-ended tuning-fork gyroscope. As shown in FIGS. 9A and 9B, single-ended tuning forks consist of two tines that are used for both drive and sense functions. In FIGS. 9A and 9B, the dark areas indicate portions of a gyroscope 900 that are at rest and the light areas indicate portions of the gyroscope 900 that are in motion. The tines 910a and 910b are piezoelectrically driven anti-phase, usually in-plane as shown in FIG. 9A. In response to an applied rotation, Coriolis forces cause the tines 910a and 910b to oscillate out of plane and in opposite directions (see FIG. 9B). The resulting sense-mode oscillations generate a sense charge on piezoelectric material of gyroscope 900, which may be bulk material or a piezoelectric layer deposited on the structural material of gyroscope 900.

The primary limitation of such tuning-fork systems is that the tines 910a and 910b that are used for sense pick-up also experience the drive motion, which may be orders of magnitude larger than the sense motion. Thus, mechanical imperfections and asymmetries in the tines 910a and 910b can result in a significant level of drive interference in the sense signal, which can cause quadrature and bias errors.

Another disadvantage of such tuning-fork systems is that parasitic resonant modes below operation frequencies are inevitable. In-phase translational modes are generally lower than anti-phase operational modes and can be easily excited with vibration.

In double-ended tuning-fork systems (not shown), separate tines are used for drive and sense functions. Two tines are driven anti-phase. The Coriolis forces induced on the drive tines excite a common torsional sense mode, which in turn causes vibration on the sense tines. The double-ended tuning forks reduce the drive interference on the sense tines, but the efficiency for a given device size is reduced. Furthermore, many undesired parasitic modes occur below and above the operational frequency, even more than those that occur in single-ended tuning forks.

Piezoelectric X-Axis Gyroscope Structure

The architecture of some micromachined piezoelectric gyroscopes disclosed herein includes a proof mass that can oscillate torsionally in-plane (about the z axis) when operating in a drive mode and torsionally out-of-plane (about the y axis for an x-axis gyroscope and about the x axis for a y-axis gyroscope) when operating in a sense mode.

FIG. 10A shows an example of a gyroscope 1000 having a proof mass suspended by drive beams attached to a central anchor. Here, the proof mass 1020 is suspended by flexures 1010a and 1010b attached to a central anchor 1005. The drive electrodes 1015*a-d* may be patterned on the top and/or the bottom sides of the flexures. The proof mass 1020, the flexures 1010*a* and 1010*b*, and the central anchor 1005 can be made from a variety of materials such as thick, plated metal alloys (e.g., nickel alloys such as Ni—Co, or Ni—Mn), single-crystal silicon, polycrystalline silicon, etc. In this example, the overall x and y dimensions of the gyroscope 1000 are on the order of several millimeters or less. For example, in some implementations, the width may be in the range of 0.25 mm to 1 mm and the length may be in the range of 1 mm to 4 mm. The thickness may range from less than a micron to fifty microns or more.

In this illustrated example, the drive electrodes 1015*a-d* are arranged symmetrically on each side of a center line 1017*a*. Center line 1017*a* corresponds with the x axis in this example. Here, the drive electrodes 1015 include piezoelectric films that are disposed on the flexures 1010*a* and 1010*b*, allowing the flexures 1010*a* and 1010*b* to function as drive beams. The piezoelectric film can be aluminum nitride (AlN), zinc oxide (ZnO), lead zirconate titanate (PZT), or other thin films. In some implementations, the drive electrodes 1015 (as well as other drive electrodes described herein) may include a piezoelectric film disposed between two metal layers that are used to provide a voltage across the piezoelectric film. The piezoelectric film may, for example, be a non-conducting piezoelectric film. Providing a voltage across the metal layers can cause movement of the drive electrodes. Alternatively, the piezoelectric material may be single-crystal materials such as quartz, lithium niobate, lithium tantalate, etc.

In the implementation depicted in FIG. 10A, the sense electrodes 1025*a* and 1025*b* are piezoelectric films that are formed along the center line 1017*a*. In alternative implementations, the sense electrodes 1025*a* and 1025*b* may be formed on the proof mass 1020. Alternatively, the sense electrodes 1025*a* and 1025*b* may be formed on the flexures 1010*a* and 1010*b*, on the same side as that on which the drive electrodes 1015 are formed, but in a layer either above or below the drive electrodes 1015. In some other implementations, the sense electrodes 1025*a* and 1025*b* may be formed on the opposing side of the flexures 1010*a* and 1010*b*. In some implementations, the sense electrodes 1025*a* and 1025*b* (as well as other sense electrodes described herein) may include a piezoelectric film disposed between two metal layers that are used to provide a voltage across the piezoelectric film. The piezoelectric film may, for example, be a non-conducting piezoelectric film. Movement of the sense electrodes can cause a voltage change across the metal layers.

FIG. 10B shows an example of a gyroscope implementation similar to that of FIG. 10A, but having a gap between the drive electrodes. In this example, gyroscope 1000*a* includes slots 1012*a* and 1012*b* in the flexures 1010*c* and 1010*d*. Here, the slots 1012*a* and 1012*b* are symmetrical about the center line 1017*b*. Including the slots 1012*a* and 1012*b* may make flexures 1010*c* and 1010*d* relatively more compliant to in-plane forces.

When anti-phase signals are applied to the drive electrodes 1015*a-d*, a bending moment is generated in the flexures 1010*a-d*. For example, referring to FIG. 10A, if a positive drive voltage is applied to electrode 1015*a* and a negative drive voltage is applied to electrode 1015*b*, one electrode will expand and the other will contract. A bending moment will be generated in the flexure 1010*a*. Similarly, if a positive drive voltage is applied to electrode 1015*d* and a negative drive voltage is applied to electrode 1015*c*, one electrode will expand and the other will contract, and a bending moment will be generated in the flexure 1010*b*. When the flexures 1010*a* and 1010*b* are actuated in opposite directions, a torsional in-plane drive mode is excited. The sense electrodes 1025*a* and 1025*b* detect out-of-plane torsional movement of the proof mass 1020 in response to an applied rotation about the x axis. Similarly, the sense electrodes 1025*c* and 1025*d* disposed on the proof mass 1020 of FIG. 10B may be used to detect applied angular rotation about the x axis.

Figure 11A:
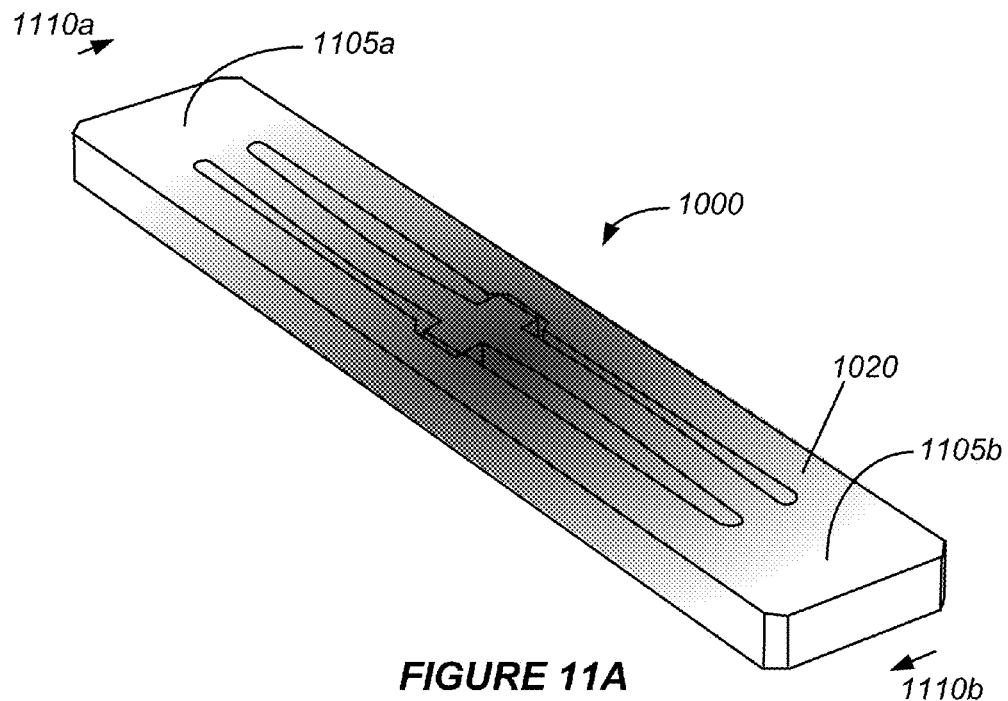
FIG. 11A shows an example of a drive mode of a gyroscope implementation such as that shown in FIG. 10A.
Figure 11B:
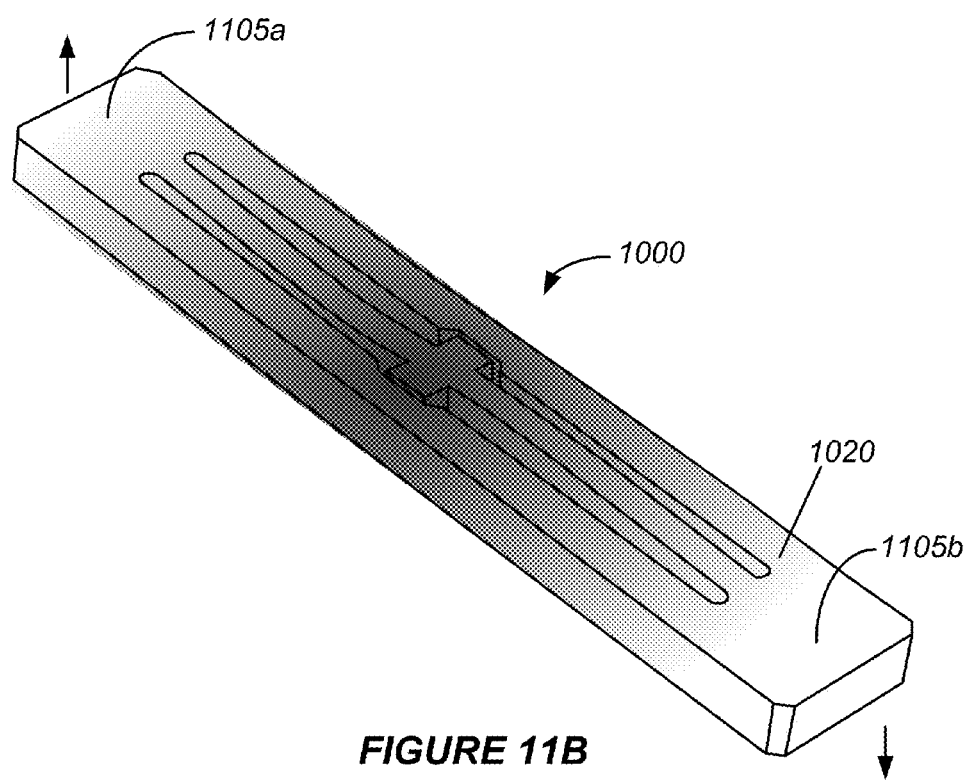
FIG. 11B shows an example of a sense mode of a gyroscope implementation being driven as shown in FIG. 11A.

In FIGS. 11A and 11B, the darkest areas indicate portions of the gyroscope 1000 that are substantially at rest and the light areas indicate portions of the gyroscope 1000 that are in motion. FIG. 11A shows an example of a drive mode of an implementation such as that shown in FIG. 10A. In FIG. 11A, the side 1105*a* of the gyroscope 1000 is driven in the direction indicated by arrow 1110*a* while the side 1105*b* of the gyroscope 1000 is driven in the direction indicated by arrow 1110*b*. When the polarities of the drive voltages are reversed, the sides 1105*a* and 1105*b* are driven in directions opposite to that shown. In this manner, the proof mass 1020 may be driven in an oscillatory torsional mode at a frequency nominally equal to the frequency of the drive voltages.

FIG. 11B shows an example of a sense mode of an implementation being driven as shown in FIG. 11A. In the presence of an applied rotation about the x axis, a net Coriolis moment about the y-axis may be induced on the proof mass 1020. As shown in FIG. 11B, the Coriolis moment excites the out-of-plane sense mode, which bends the sides 1105*a* and 1105*b* out-of-plane in opposite directions. This sense motion can generate a piezoelectric charge on the sense electrodes 1025*a-d* as depicted in FIGS. 10A and 10B.

Implementations such as those depicted in FIGS. 10A and 10B can substantially eliminate the in-phase modes that are inherent in a conventional tuning-fork system. Some such implementations may further enhance performance by utilizing a large proof mass 1020.

Drive and Sense Decoupling

In the simple implementations described above, the sense electrodes 1025*a-d* may be subject to the drive motion. Even though the effects of the drive motion may be common-mode rejected, asymmetries and imperfections may cause coupling of the drive motion into the sense signal path. In some high performance applications, the resulting errors could cause less-than-optimal performance.

In order to reduce the drive interference when sensing, the drive and sense beams can be separated by utilizing a frame structure. Two general approaches for decoupling the drive and sense modes are described below. The gyroscopes described below may have overall lengths and widths that are on the order of several millimeters or less. For example, some implementations have lengths in the range of 0.5 mm to 3 mm and widths in the range of 0.3 mm to 1.5 mm, with thicknesses between about one and fifty microns or more.

Drive Frame Implementations

Some drive frame gyroscope implementations include a drive frame that oscillates only in the drive mode. The drive frame may be disposed between a central anchor and a proof mass. Such implementations may more effectively decouple the drive motion from the sense motion, as compared to the implementations shown in FIGS. 10A and 10B.

Figure 12:
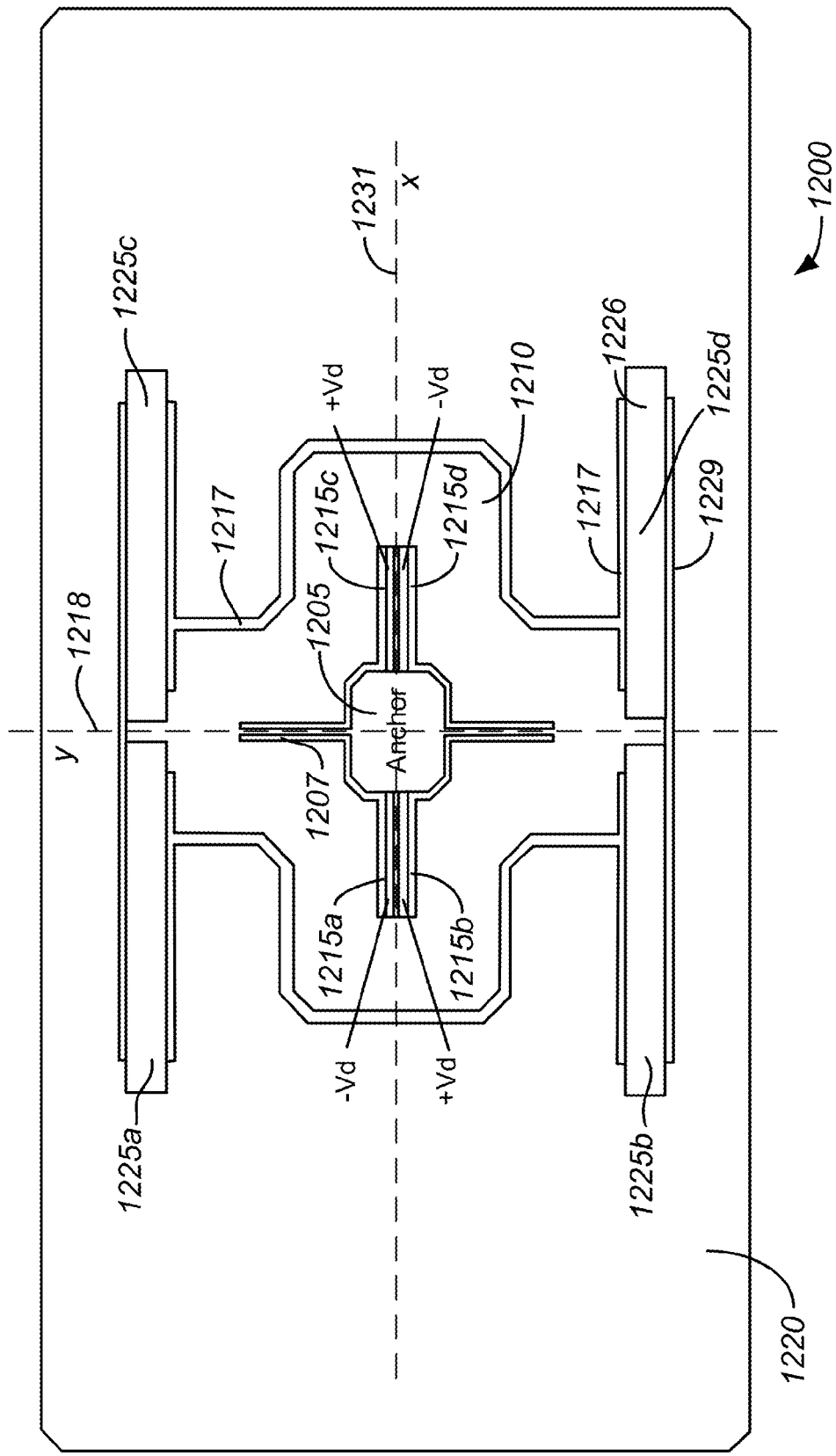
FIG. 12 shows an example of a drive frame gyroscope implementation in which a drive frame is attached to a central anchor via drive beams.

FIG. 12 shows an example of a drive frame gyroscope implementation in which a drive frame is attached to a central anchor via drive beams: here, a drive frame 1210 of the gyroscope 1200 surrounds a central anchor 1205 and is attached to the central anchor 1205 via the drive beams 1215*a-d*. In this example, slots 1207 separate the drive frame 1210 from most of the central anchor 1205.

A proof mass 1220 surrounds the drive frame 1210. The proof mass 1220 is coupled to the drive frame 1210 by the sense beams 1225*a-d*. In this example, the proof mass 1220 is only coupled to the drive frame 1210 at distal ends 1226 of the sense beams 1225a-d, away from a central axis 1218, which corresponds with the y axis in this example. The slots 1217 and 1229 separate other portions of the sense beams 1225a-d from the proof mass 1220. Slots 1217 also separate the drive frame 1210 from the proof mass 1220.

Drive beams 1215a-d are disposed symmetrically about a center line 1231, which corresponds with the x axis in this example. To generate drive oscillations, a differential drive can be used. In such implementations, two drive beams on one side of the anchor 1205 may be actuated with anti-phase signals in one direction, and another two beams on the other side of the anchor 1205 may be actuated in the opposite direction to generate a net rotation about the z axis. Here, a negative voltage is applied to drive electrodes (not shown) of the drive beams 1215a and 1215d at the same time that a positive voltage is applied to drive electrodes of the drive beams 1215b and 1215c.

In this example, the drive and sense electrodes include piezoelectric films that may be seen more clearly in FIGS. 13A and 13B. FIG. 13A shows an example of a cross-section of a gyroscope implementation such as that shown in FIG. 12. In this view of the gyroscope 1200, the piezoelectric sense electrode 1305a of the sense beam 1225a and the piezoelectric sense electrode 1305b of the sense beam 1225b may clearly be seen. The piezoelectric sense electrodes 1305c and 1305d of the sense beams 1225c and 1225d, respectively, may also be seen. FIG. 13B shows an example of an enlarged pair of drive beams of the gyroscope implementation shown in FIG. 13A. In FIG. 13B, the piezoelectric drive electrodes 1305e and 1305f may be seen on the drive beams 1215a and 1215b, respectively. As discussed in detail below with reference to FIG. 41 et seq., in some implementations a single layer may be deposited and patterned to form the piezoelectric film of the electrodes 1305a-f.

Although the piezoelectric drive and sense electrodes described herein are often illustrated on top of gyroscope drive and sense frames, proof masses, etc., such illustrations are primarily made for the purpose of clarity. In alternative implementations, such drive and sense electrodes may be positioned "underneath" (closer to the substrate than) the drive and sense frames, proof masses, etc. As described below with reference to FIGS. 41 through 46B, it can be advantageous to form the drive and sense electrodes before forming the drive frames, sense frames, proof masses, etc. Such fabrication methods may produce gyroscopes wherein the drive and sense electrodes are disposed underneath the drive frames, sense frames, proof masses, etc.

Figure 14A:
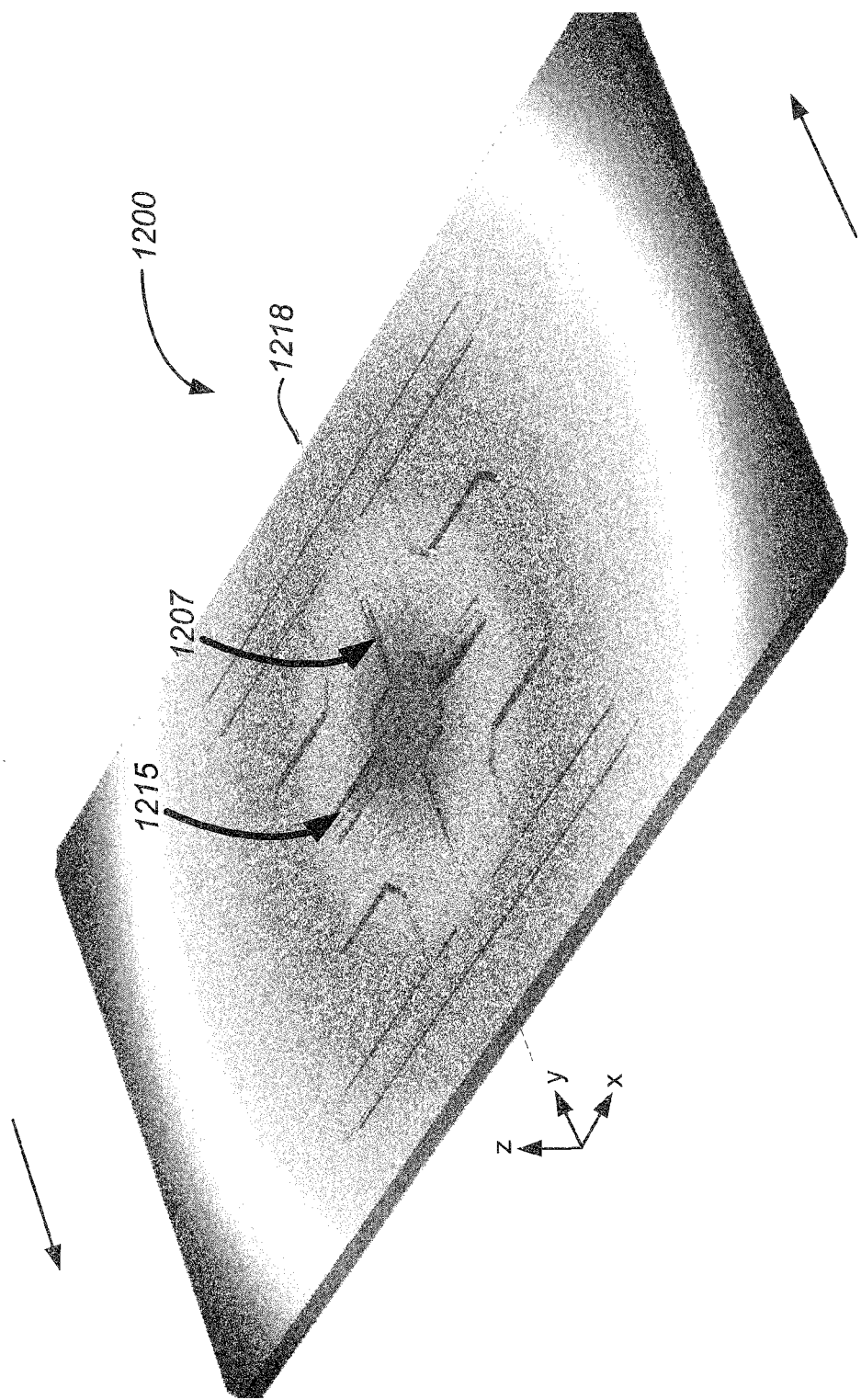
FIG. 14A shows an example of a drive mode of a gyroscope implementation such as that shown in FIG. 12.
Figure 14B:
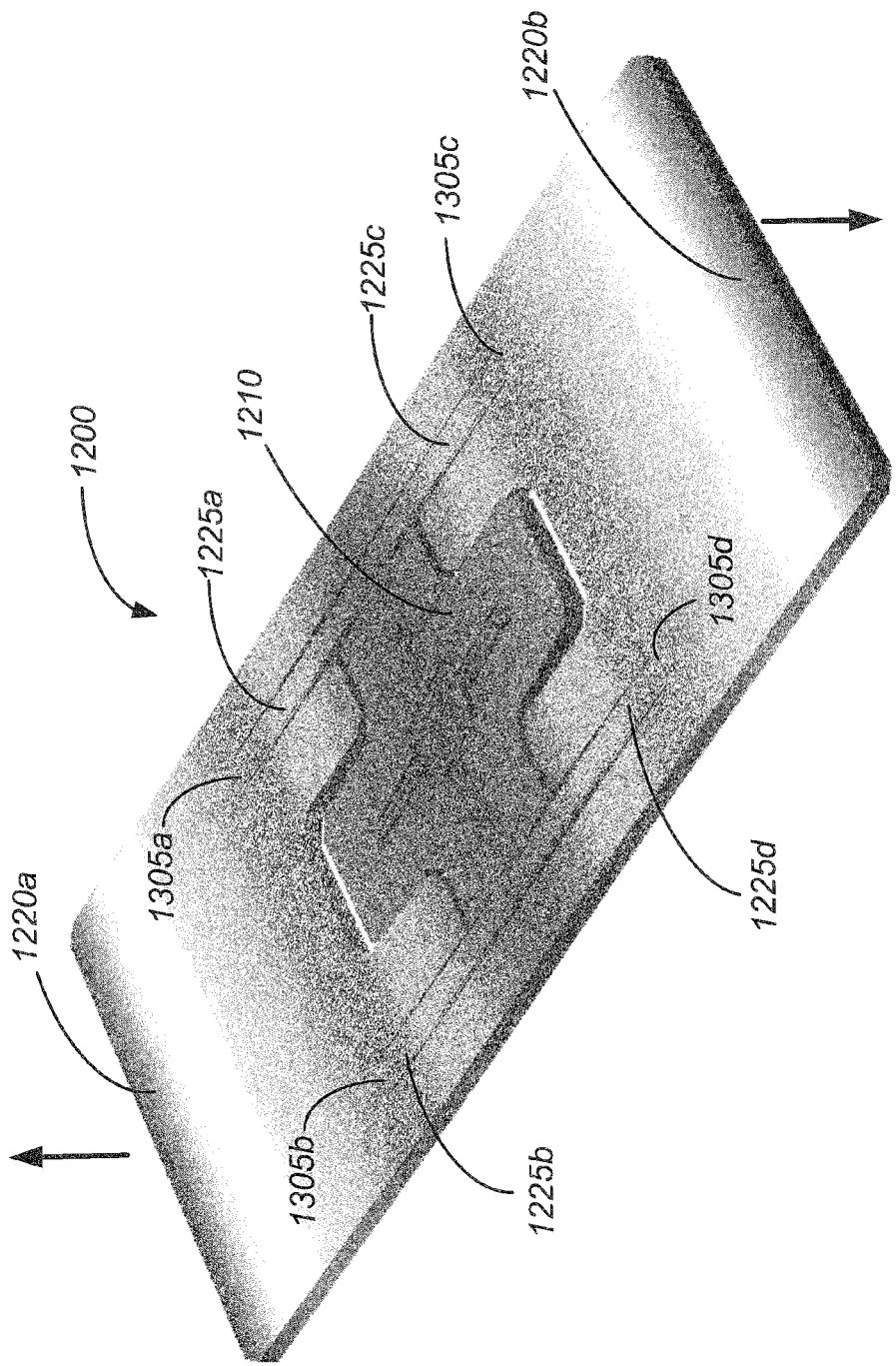
FIG. 14B shows an example of a sense mode of a gyroscope implementation being driven as shown in FIG. 14A.

FIG. 14A shows an example of a drive mode of a gyroscope implementation such as that shown in FIG. 12. In FIGS. 14A and 14B, the cool-colored portions of the gyroscope 1200 are moving relatively less than the hot-colored portions: the blue portions of the gyroscope 1200 are substantially at rest, whereas the red- and orange-colored portions are moving more than the other portions of the gyroscope 1200. Here, the drive beams 1215 are being driven via a differential piezoelectric drive, as described above.

The drive beams 1215 are relatively compliant to in-plane motion, which allows the gyroscope 1200 to rotate about the z axis. The drive beams 1215 may be made relatively stiff in all other directions, thus substantially constraining the drive frame to rotate only in the drive mode (i.e., the x-y plane). Here, for example, the drive beams 1215 are relatively stiff along the x axis, in order to suppress undesirable modes of oscillation. For example, the portions of slots 1207 that parallel center line 1218 create perforations along the y axis of the drive frame 1210. Without the extra stiffness, those perforations would tend to form a compliant hinge along the y axis, allowing the drive frame 1210 to bend around the hinge.

FIG. 14B shows an example of a sense mode of a gyroscope implementation being driven as shown in FIG. 14A. In the sense mode, the proof mass 1220 oscillates about the y axis, which induces a stress on the sense beams 1225a-d. Here, the proof mass side 1220a is moving upwards at the same time that the proof mass side 1220b is moving downwards. This out-of-plane sense motion causes the sense beams 1225a-d to bend out-of-plane and causes a piezoelectric charge to be generated by the corresponding sense electrodes 1305a-d. At the moment depicted in the example of FIG. 14B, the sense beams 1225c and 1225d bend downwards, while the sense beams 1225a and 1225b bend upwards. Thus, the top surface of the sense beams 1225c and 1225d expands, and the top surface of the sense beams 1225a and 1225b contracts. When the drive motion is in the opposite direction, the sense beams 1225c and 1225d bend upwards, while the sense beams 1225a and 1225b bend downwards. Such implementations can provide a differential detection mechanism, wherein the sensor output is the sum of the electrodes of the sense beams 1225a and 1225b minus the sum of the electrodes of the sense beams 1225c and 1225d, or vice versa, depending on the orientation.

In this configuration of the gyroscope 1200, the sense motions of the proof mass 1220 are substantially decoupled from the drive frame 1210. Decoupling the drive and sense motions helps to keep the sense electrodes quieter, in part because the sense electrodes do not undergo the large-amplitude drive motions. In some such implementations, the sense beams may be only axially loaded due to the drive motion.

Figure 17:
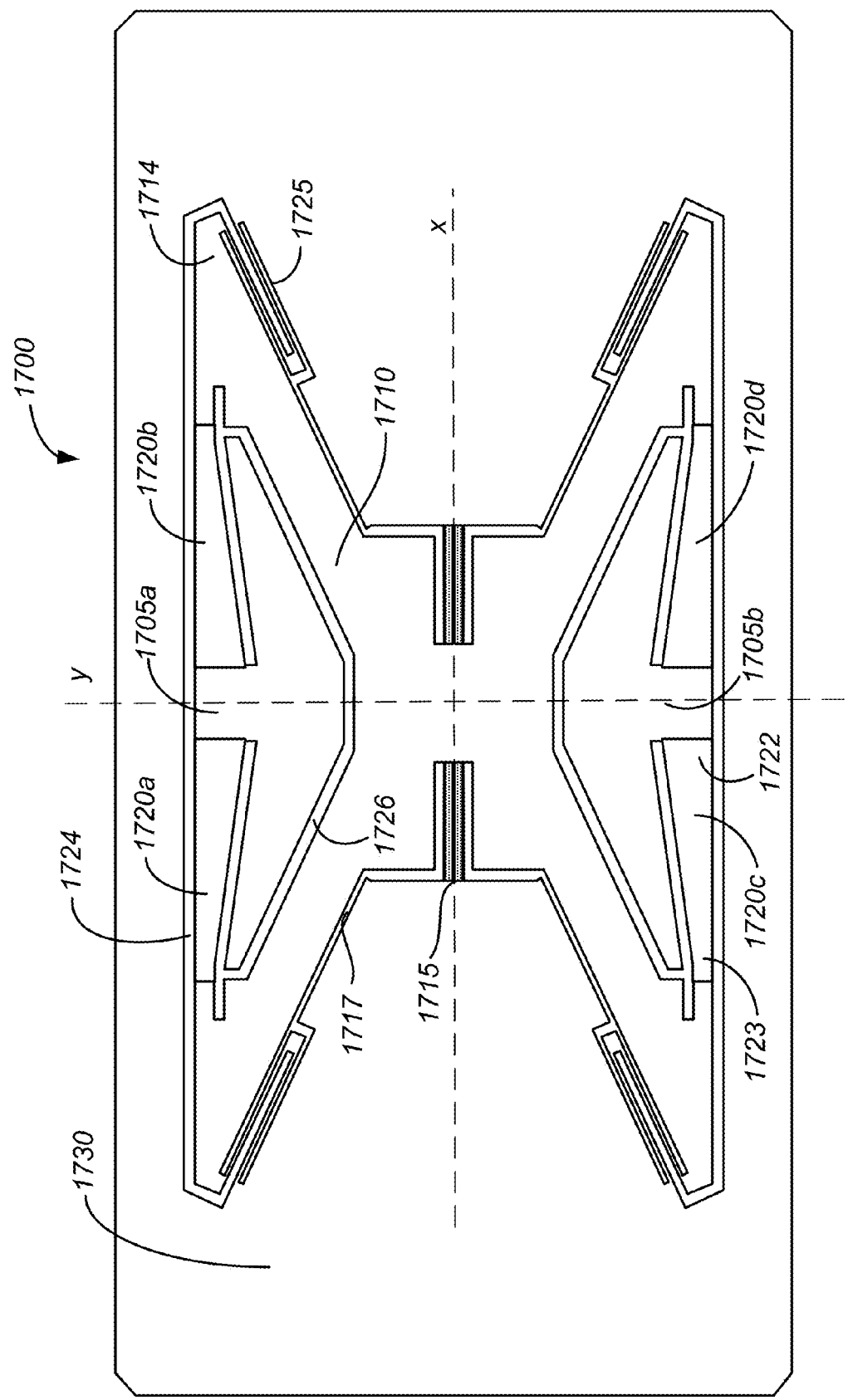
FIG. 17 shows an example of an alternative sense frame gyroscope implementation having tapered sense beams.

In the configurations depicted in FIGS. 12 through 14B, the sense beams 1225a-d are substantially rectangular in the x-y plane. However, in alternative implementations, the sense beams 1225a-d have other shapes. In some such implementations, the sense beams 1225a-d are tapered, e.g., as shown in FIG. 17.

Sense Frame Implementations

Figure 15:
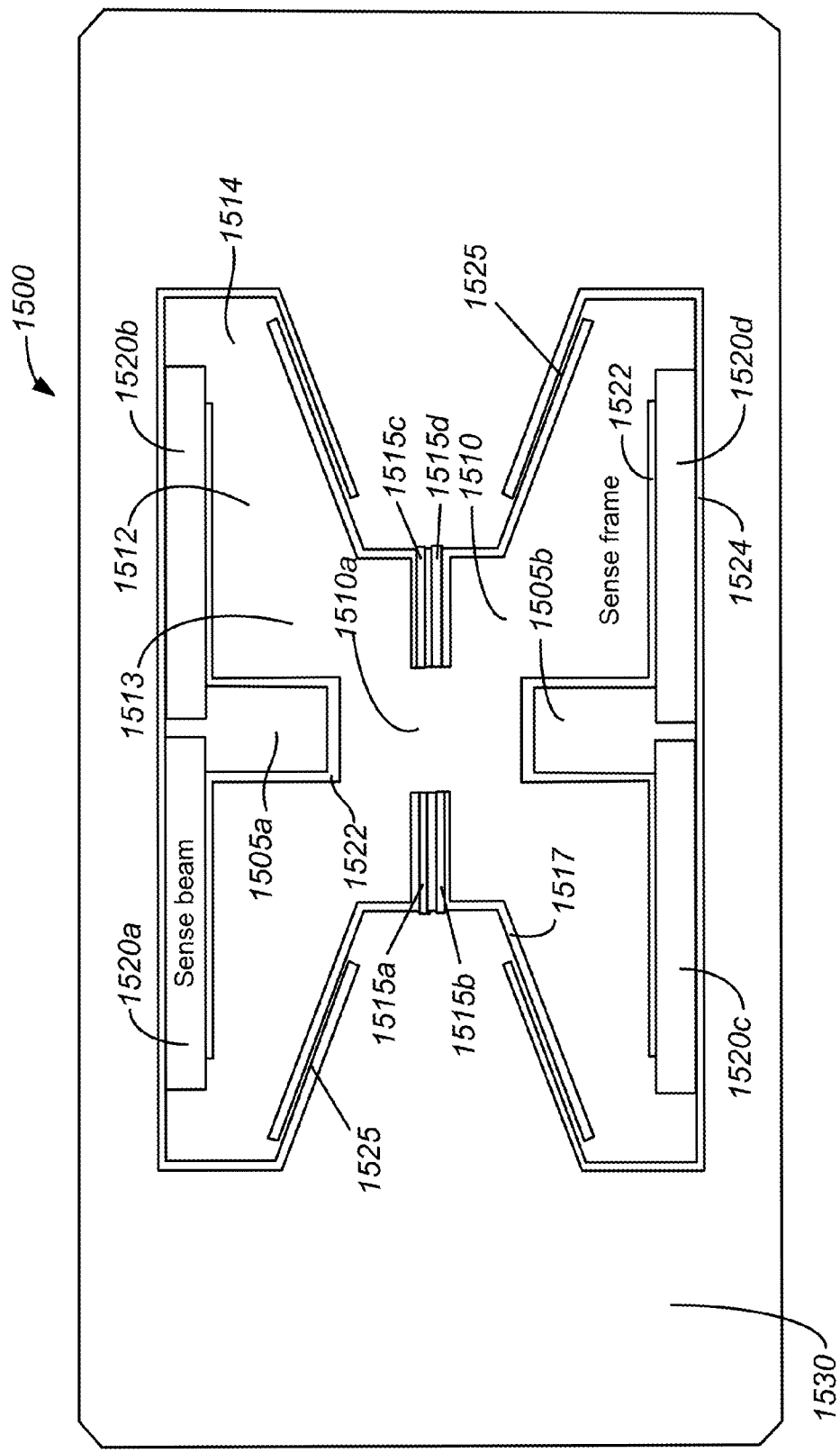
FIG. 15 shows an example of a sense frame gyroscope implementation.

Various sense frame gyroscope implementations described herein include a sense frame that oscillates in the sense mode, but is substantially stationary in the drive mode. FIG. 15 shows an example of a sense frame gyroscope implementation. The sense frame 1510 may be connected to the proof mass 1530 via drive beams 1515a-d. Here, the drive beams 1515a-d connect a central portion 1510a of the sense frame 1510 to the proof mass 1530. Central portion 1510a is disposed between a pair of anchors 1505a and 1505b. Here, the anchors 1505a and 1505b are separated from the central portion 1510a by slots 1522.

The gyroscope 1500 features a sense frame 1510 that is connected to the anchors 1505a and 1505b via the sense beams 1520a-d. In this example, the sense frame 1510 includes tapering portions 1512, each of which are wider at a first end 1513 near one of the anchors 1505a or 1505b and narrower at a second end 1514 away from the anchors 1505a or 1505b. Each of the sense beams 1520a-d extends from one of the anchors 1505a or 1505b to one of the second ends 1514. Here, the sense beams 1520a-d are only connected to the sense frame 1510 at the second ends 1514. The sense beams 1520a-d are separated from the first ends 1513 by slots 1522.

The proof mass 1530 is separated from the sense beams 1520 and from the sense frame 1510 by the slots 1524. Moreover, the proof mass 1530 is separated from the sense frame 1510 by the slots 1517. Accordingly, the sense frame 1510 is substantially decoupled from the drive motions of the proof mass 1530.

Figure 16A:
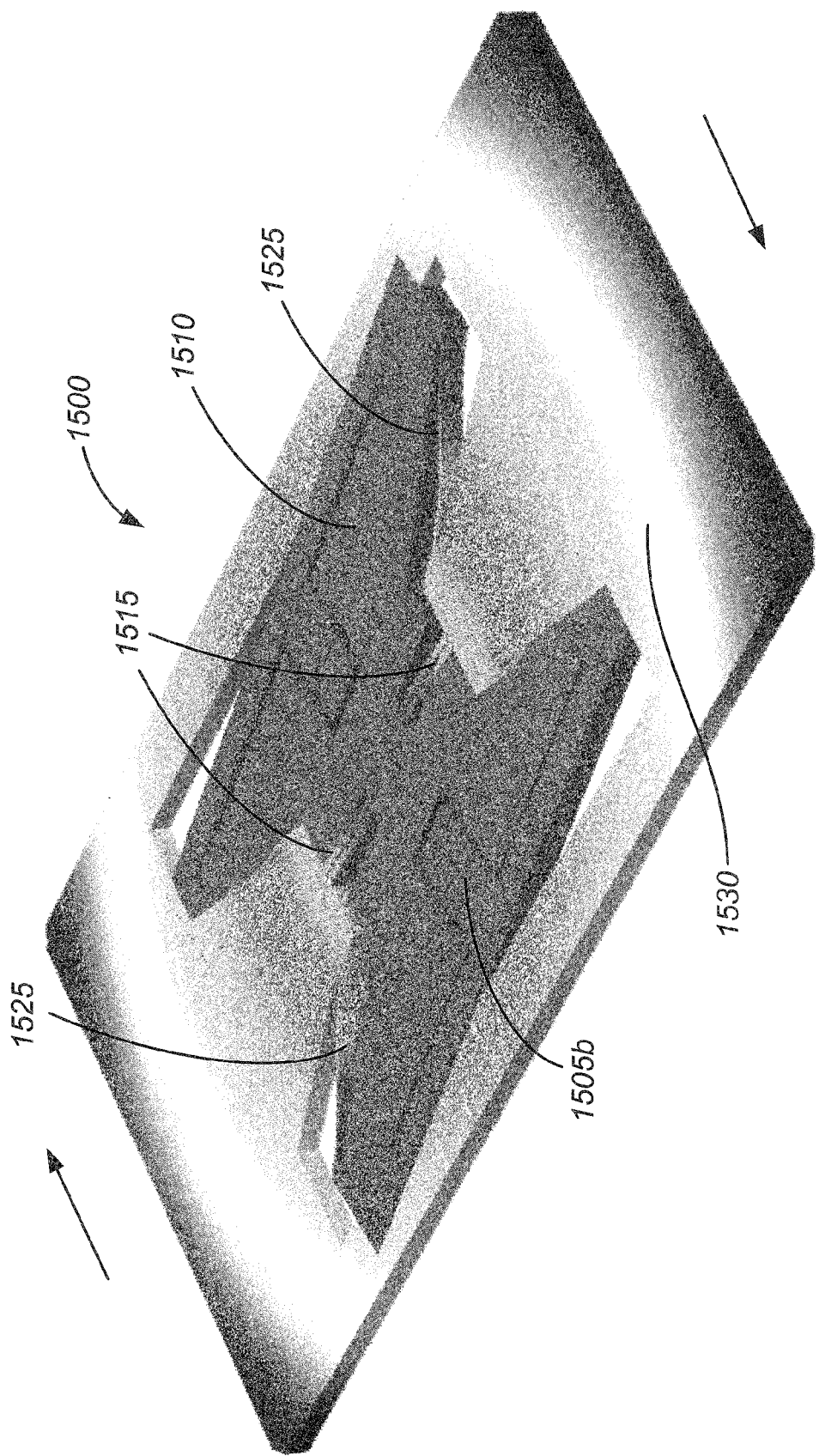
FIG. 16A shows an example of a drive mode of the gyroscope implementation shown in FIG. 15.

FIG. 16A shows an example of a drive mode of the gyroscope implementation shown in FIG. 15. In FIG. 16A, the displacement of the proof mass 1530 with respect to the sense frame 1510 is exaggerated in order to see their relative motions more clearly. The dark blue portions of the gyroscope 1500 are substantially at rest, whereas the red- and orange-colored portions are moving more than the other portions of the gyroscope 1500. Here, the sense frame 1510 is shown in a uniformly dark blue shade, indicating that the sense frame 1510 is not substantially in motion. The displacement of the proof mass 1530 increases with increasing distance from the anchors 1505, as indicated by the color progression from light blue to red.

The sense frame 1510 is coupled to the proof mass 1530 not only by the drive beams 1515, but also by the linkage beams 1525. The drive beams 1515 and the linkage beams 1525 are compliant to in-plane deformation and allow the proof mass 1530 to rotate in-plane in the drive mode with respect to the sense frame. However, the sense frame 1510 is substantially decoupled from the drive motions of the proof mass 1530.

Figure 16B:
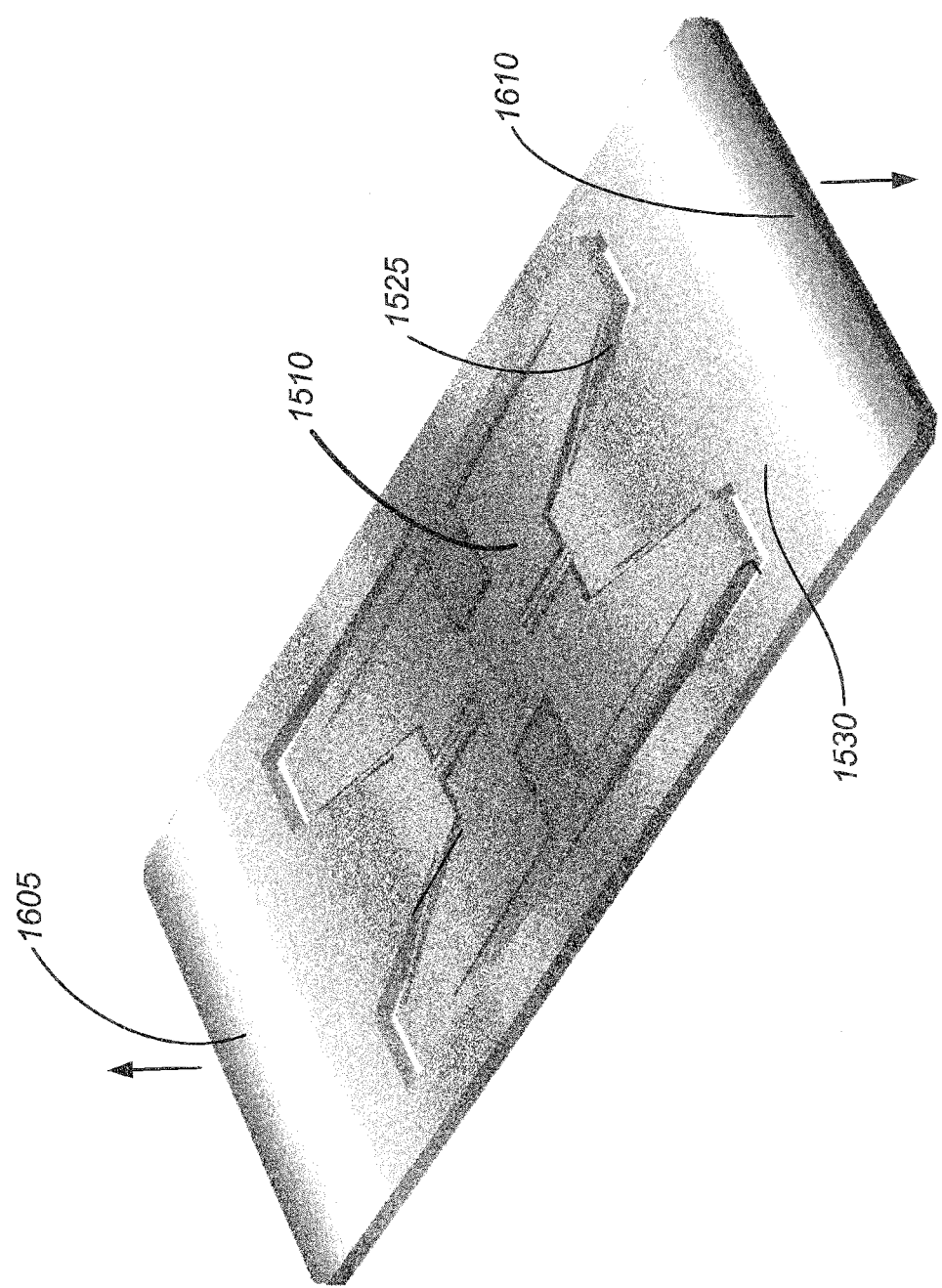
FIG. 16B shows an example of a sense mode of the gyroscope implementation being driven as shown in FIG. 16A.

FIG. 16B shows an example of a sense mode of the gyroscope implementation being driven as shown in FIG. 16A. During sense mode operations, the proof mass 1530 and the sense frame 1510 can oscillate together torsionally out-of-plane. At the moment depicted in FIG. 16B, an end 1605 of the proof mass 1530 is bending upwards and an end 1610 of the proof mass 1530 is bending downward. Here, the linkage beams 1525 are stiff with regard to out-of-plane forces. Therefore, the linkage beams 1525 increase the transfer of the sense motions of the proof mass 1530 to the sense frame 1510.

Tapered Sense Beams

The electrical sensitivity of the piezoelectric gyroscope system can be increased by improving the stress uniformity on the sense beams. For some implementations of a rectangular sense beam, the maximum bending stress on the sensing beam is at the anchor connection and reduces linearly with the distance from the anchor. This configuration can result in reduced total piezoelectric charge at the sense electrode.

By using a tapered sense beam profile, the reduction in bending stress can be compensated by the stress increase due to a gradually reducing beam width. Thus, a uniform stress profile may be achieved along the sense beam, and the charge generated throughout the sense electrode may be maximized.

FIG. 17 shows an example of an alternative sense frame gyroscope implementation having tapered sense beams. Many features of the gyroscope 1700 are similar to corresponding features of the gyroscope 1500. For example, the drive beams 1715 connect a central portion of the sense frame 1710 to the proof mass 1730. The sense beams 1720a-d extend from the anchors 1705a and 1705b to the distal ends 1714 of the sense frame 1710, away from the anchors 1705a and 1705b.

The proof mass 1730 is separated from the sense beams 1720a-d by the slots 1724. Moreover, the proof mass 1730 is separated from most of the sense frame 1710 by the slots 1717. Like the sense frame 1510 of the gyroscope 1500, the sense frame 1710 is substantially decoupled from the drive motions of the proof mass 1730.

In the example shown in FIG. 17, however, a tapered sense beam design is incorporated into the decoupled sense-frame implementation. In the gyroscope 1700, the sense beams 1720a-d have widths that decrease with increasing distance from the anchors 1705a and 1705b. For example, tapered sense beam 1720c includes a wider end 1722 that is attached to the anchor 1705b and a narrower end 1723 that is attached to the sense frame 1710.

Figure 18:
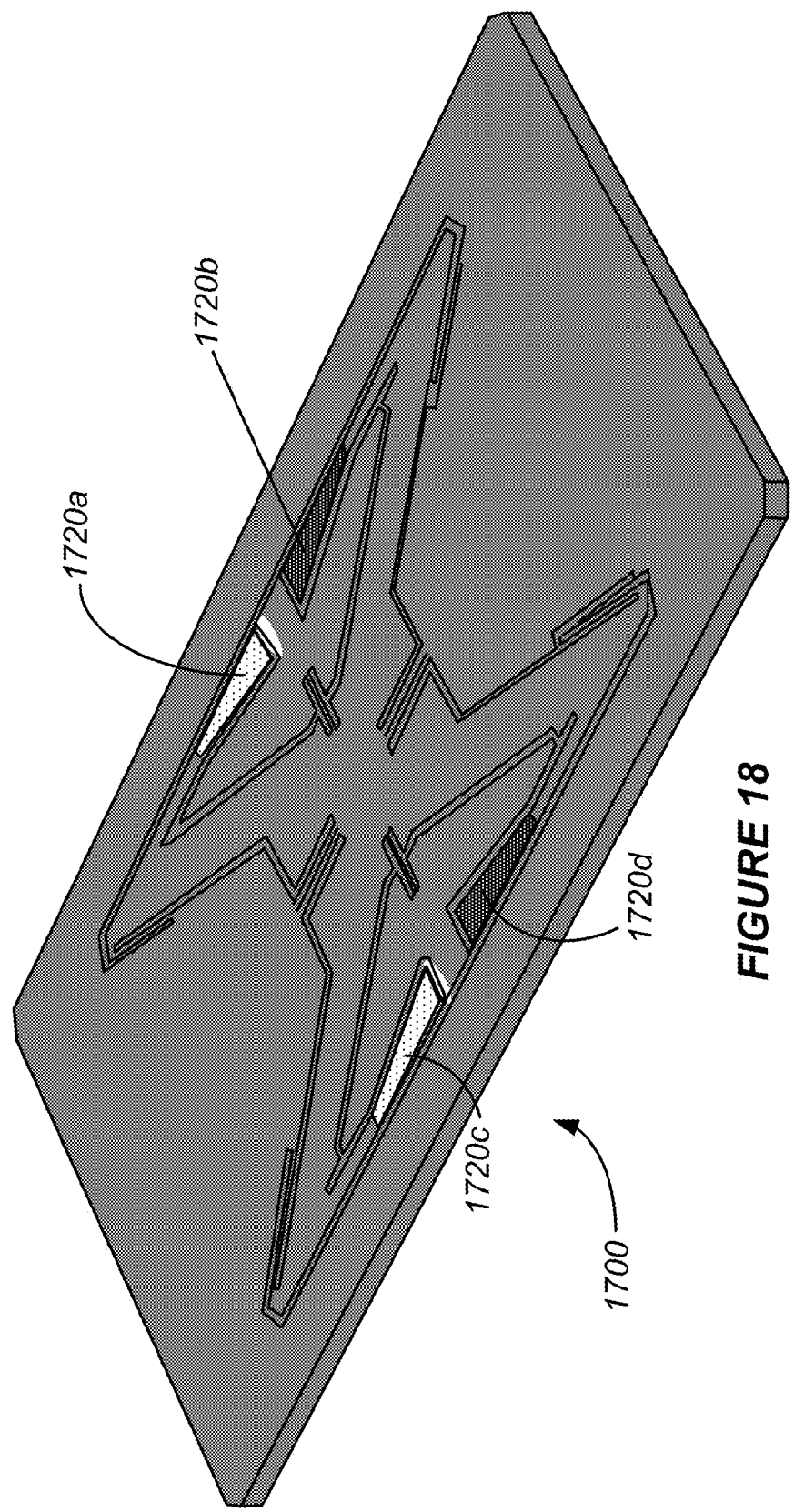
FIG. 18 shows an example of a finite element analysis superimposed upon a gyroscope implementation such as that of FIG. 17, showing substantially uniform stresses on the tapered sense beams when operating in a sense mode.

When the stresses on the sense beams during the sense motion are modeled according to a finite element analysis (FEA), it may be observed that some implementations of the tapered sense beam design provide more uniform stresses along the sense beam. FIG. 18 shows an example of a finite element analysis superimposed upon a gyroscope implementation such as that of FIG. 17, showing substantially uniform stresses on the tapered sense beams when operating in a sense mode. The substantially uniform light shading on tapered sense beams 1720a and 1720c indicates substantially uniform compression, whereas the substantially uniform dark shading on tapered sense beams 1720b and 1720d indicates substantially uniform tension.

Figure 19:
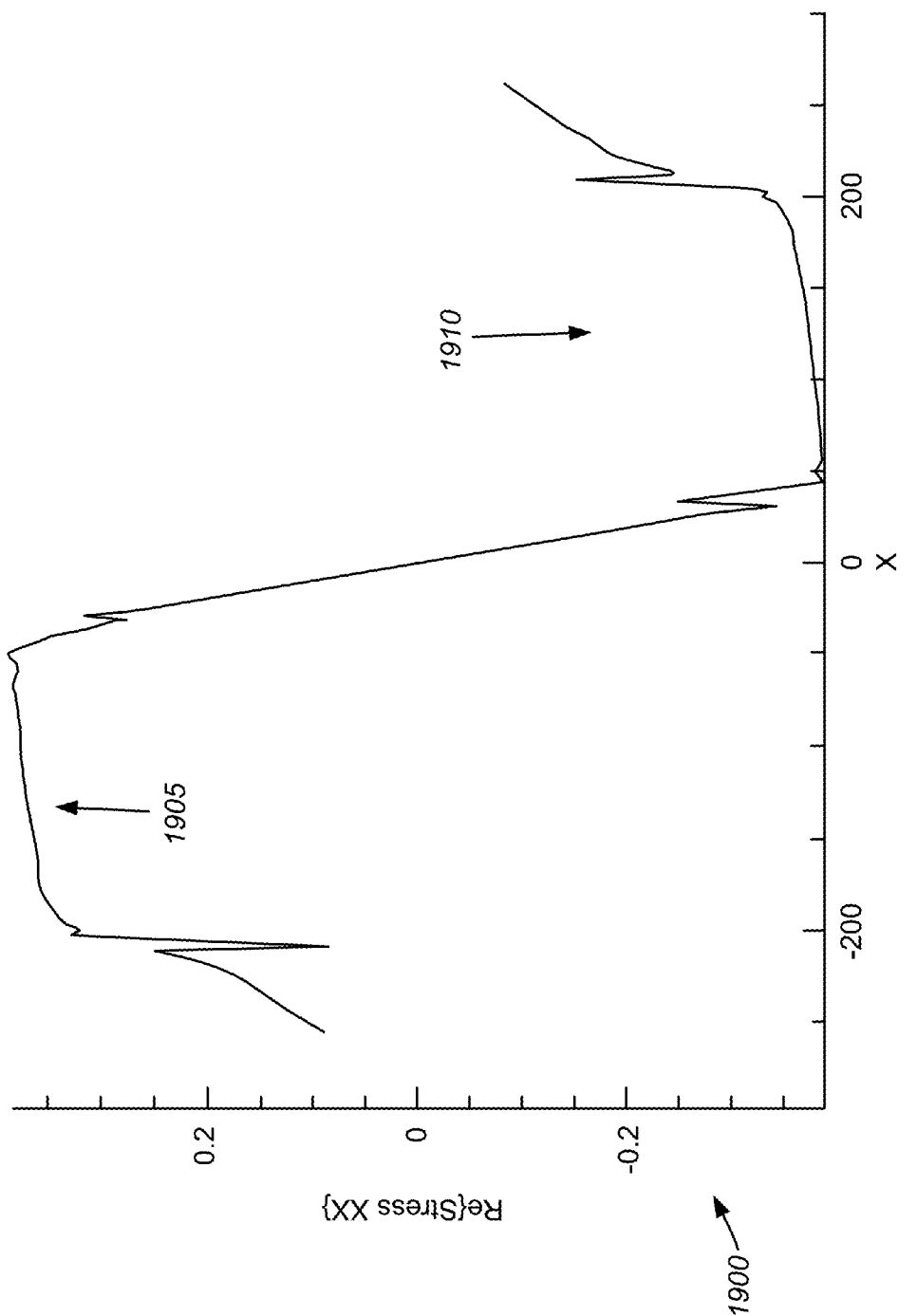
FIG. 19 shows an example of a plot of the stress level on the tapered sense beams versus the distance from the center for a gyroscope implementation such as that of FIG. 17.

FIG. 19 shows an example of a plot of the stress level on the tapered sense beams versus the distance from the center (y axis) for a gyroscope implementation such as that of FIG. 17. In FIG. 19, the stresses along the sense beams 1720c and 1720d are plotted with respect to distance along the x axis. It may be observed from FIG. 19 that the stress level in this implementation remains relatively constant and does not substantially reduce with position along each sense beam. Region 1905 corresponds with the substantially uniform tension of the tapered sense beam 1720d, whereas region 1910 corresponds with the substantially uniform compression of the tapered sense beam 1720c. With an optimal taper angle, a substantially constant stress level across each sense beam 1720a-d can be achieved. The optimal taper angle will vary according to the gyroscope design and may be determined by repeated FEA modeling. The optimal taper angle will correspond to the "flattest" or least varying curve in areas 1905 and 1910.

Although tapered sense beams have been shown herein in the context of sense frame gyroscope implementations, tapered sense beams also can be used to improve sensitivity in other implementations. For example, tapered sense beams can be used in drive frame gyroscope implementations such as those described above with reference to, e.g., FIG. 15.

Aside from the tapered sense beams 1720, there are some additional differences between the gyroscope 1500 and the gyroscope 1700. Referring again to FIG. 17, it may be observed that the linkage beams 1725 are serpentine flexures and are connected to distal portions of the sense frame 1710, relatively farther from the y axis than in the gyroscope 1500. This is a slight improvement over the configuration of the gyroscope 1500 in terms of coupling the sense motion of the proof mass 1730, because forces are being applied farther away from y axis, nearer to the point of maximum amplitude of the sense motion of the proof mass 1730. Moving the applied force closer to the tip of the wing-shaped sense frame 1710 imparts relatively more force from the proof mass 1730 to the sense frame 1710.

Moreover, in the gyroscope 1700, portions of the slots 1726 (which separate the anchors 1705a and 1705b from the sense frame 1710) are substantially parallel to corresponding portions of the slots 1717 (which separate the sense frame 1710 from the proof mass 1730). This modification can help to provide sufficient stiffness in the corresponding portions of the sense frame 1710.

Description of Micromachined Piezoelectric Z-Axis Gyroscope Implementations

Some implementations described herein provide a z-axis gyroscope with low quadrature and bias errors. Some implementations include a drive proof mass that is piezoelectrically driven in a substantially linear, x-directed motion (in-plane). The drive proof mass may be mechanically coupled to a sense proof mass, which vibrates torsionally in the presence of an angular rotation about the z axis. Motion of the sense proof mass can induce charge in a piezoelectric film disposed above or below sense beams that connect the sense mass to the substrate anchor. The induced charge can cause a change in voltage of piezoelectric sense electrodes, which may be recorded and processed electronically.

The proof masses can be made from a variety of materials such as thick, plated metal alloys (e.g., nickel alloys such as Ni—Co, Ni—Mn, etc.), single crystal silicon from the device layer of an SOI wafer, glass, and others. The piezoelectric film can be aluminum nitride (AlN), zinc oxide (ZnO), lead zirconate titanate (PZT), or other thin films, or single crystal materials such as quartz, lithium niobate, lithium tantalate, and others. Some implementations are well suited for manufacturing on flat-panel display glass.

Some implementations also involve the use of an array of electrostatic actuators to tune the mechanical mode shape of the drive motion in order to suppress coupling of quadrature into the sense frame. For example, in some implementations, the electrostatic actuators include an array of comb-finger electrodes to fine-tune an in-plane motion of the proof mass and/or an electrostatic gap between the substrate and proof mass to suppress undesired vertical motion, as described more fully below with reference to FIG. 23.

Z-Axis Gyroscope Architecture

Figure 20A:
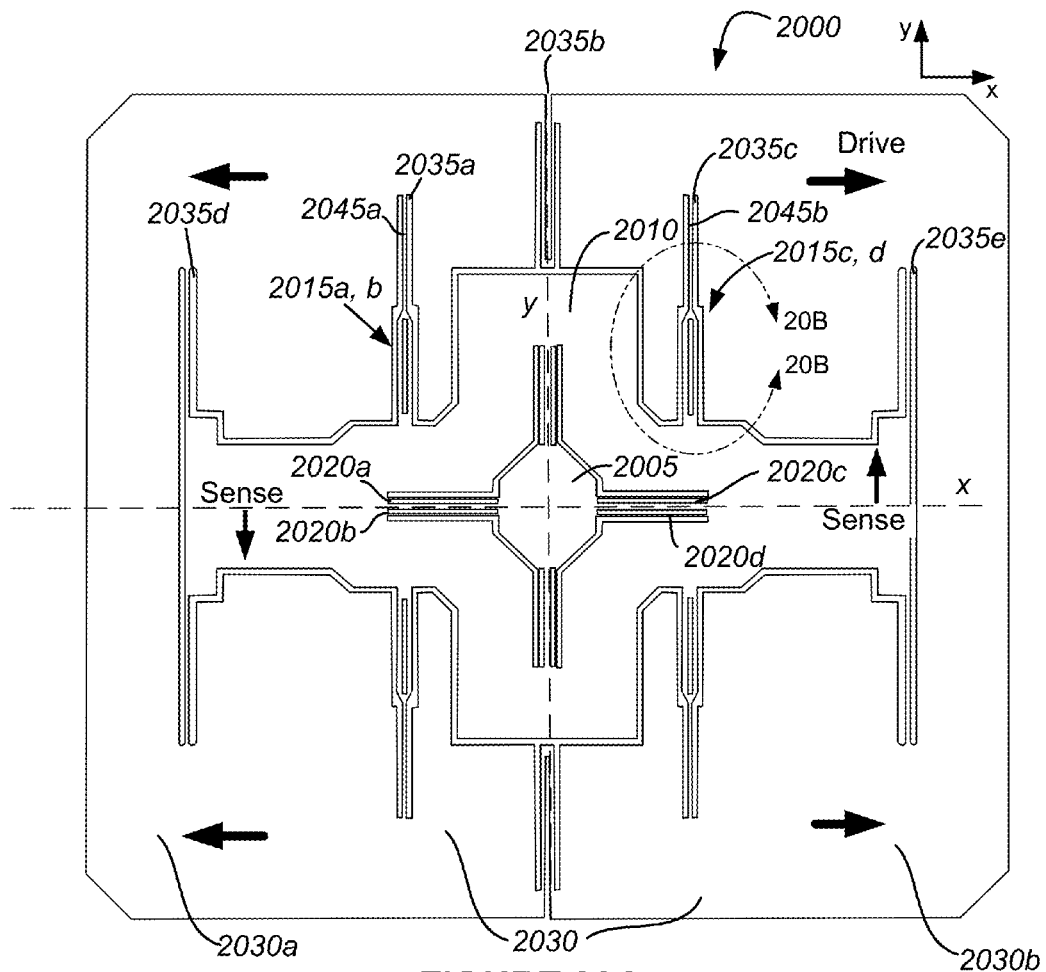
FIG. 20A shows an example of a plan view of a z-axis gyroscope implementation.

FIG. 20A shows an example of a plan view of a z-axis gyroscope 2000 implementation. The gyroscope 2000 includes a sense frame 2010 disposed around a central anchor 2005. The sense frame 2010 is connected to the central anchor 2005 via the sense beams 2020a-d.

A drive frame 2030 is disposed around and connected to the sense frame 2010. In this example, the drive beams 2015a-d piezoelectrically drive the drive frame 2030 in a substantially linear, x-directed motion (in-plane). Here, the drive frame 2030 is composed of the drive frame portions 2030a and 2030b. The drive frame 2030 can be actuated by applying anti-phase voltages to each pair of adjacent drive beams, e.g., a positive voltage to the drive beam 2015a and a negative voltage to the drive beam 2015b.

Figure 20B:
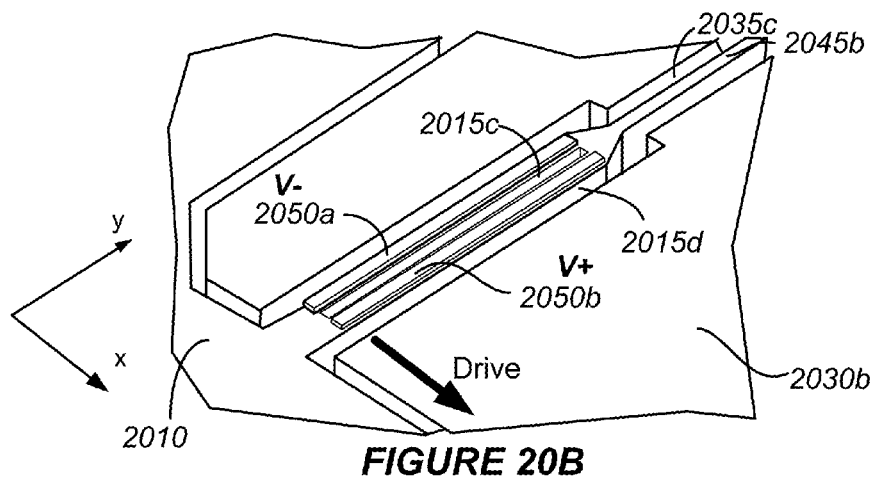
FIG. 20B shows an example of an enlarged view of the drive beams of the z-axis gyroscope implementation shown in FIG. 20A.

FIG. 20B shows an example of an enlarged view of the drive beams 2015c and 2015d of the z-axis gyroscope implementation shown in FIG. 20A. In this enlarged view, the drive beams 2015c and 2015d may be seen more clearly. The drive beams 2015c and 2015d are joined to the drive frame portion 2030b by flexure 2045b, which is disposed within slot 2035c. The electrodes 2050a and 2050b (each of which includes a piezoelectric film) are disposed on the drive beams 2015c and 2015d, respectively. In this example, a positive voltage is being applied to the electrode 2050b at the same time that a negative voltage is being applied to the electrode 2050a. The applied voltages cause compressional stress to be applied to the drive beam 2015d and a tensional stress to be applied to the drive beam 2015c. The opposing axial strains induced by the piezoelectric material cause a net moment that moves the drive frame portion 2030b in a positive x direction.

Figure 21A:
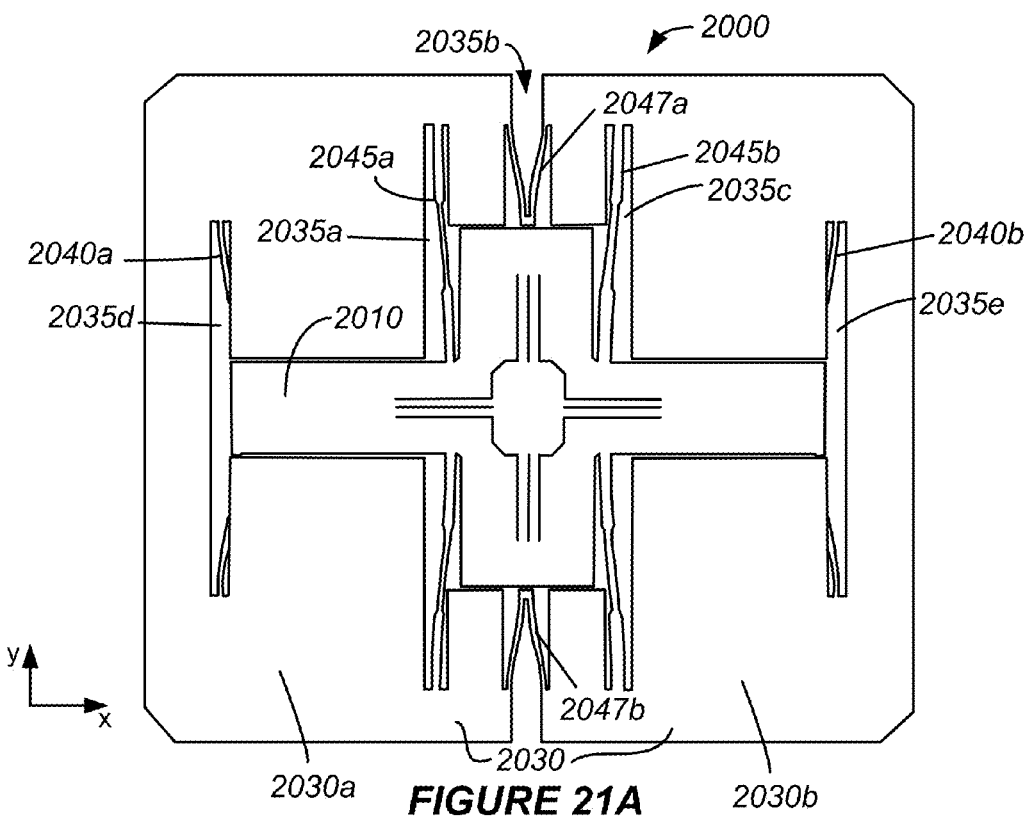
FIG. 21A shows an example of a drive mode of a z-axis gyroscope implementation such as that depicted in FIG. 20A.
Figure 21B:
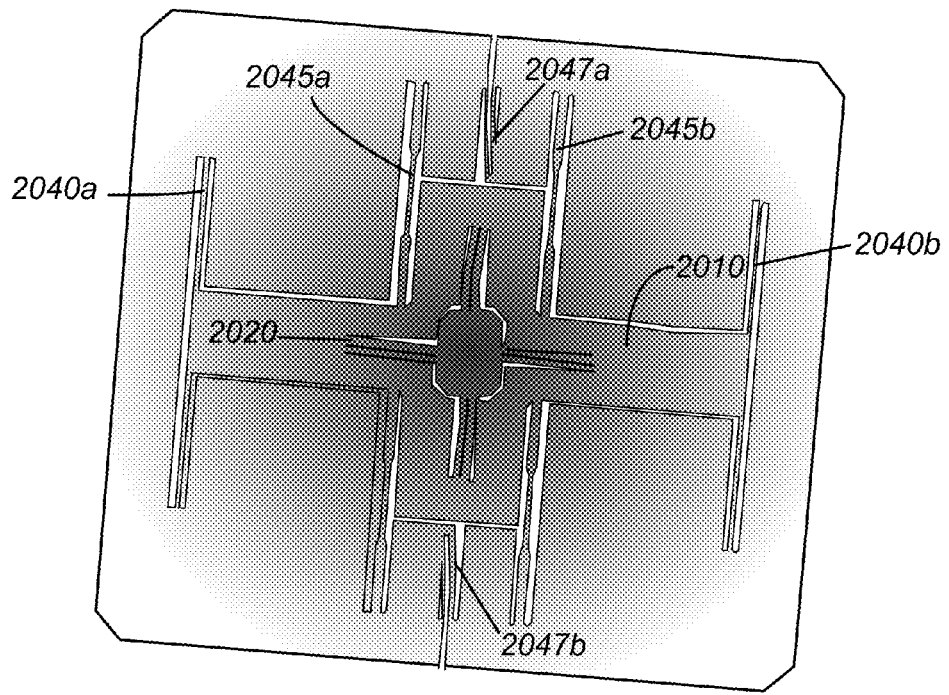
FIG. 21B shows an example of a sense mode of a z-axis gyroscope implementation driven as depicted in FIG. 20A.

FIG. 21A shows an example of a drive mode of a z-axis gyroscope implementation such as that depicted in FIG. 20A. In FIGS. 21A and 21B, the displacements are exaggerated to facilitate ease of viewing. In FIG. 21A, the drive frame portion 2030b has moved in a positive x direction and the drive frame portion 2030a has moved in a negative x direction. However, the drive motion is substantially decoupled from the sense frame 2010. Therefore, the sense frame 2010 does not translate along the x axis. Instead, the sense frame 2010 remains substantially stationary in the absence of rotation about the z axis.

The functionality of the gaps 2035a-e and the flexures disposed therein are apparent in FIG. 21A. The gaps 2035a-e are substantially parallel to the y axis. The gap 2035b, which extends substantially along the y axis, has opened. Flexures 2047a and 2047b, which span the gap 2035b and which connect the drive frame portions 2030a and 2030b, also have opened. The flexures 2040a and 2040b, which extend along the gaps 2035d and 2035e, are compliant to in-plane bending and allow the sense frame 2030 to remain in substantially the same position when the drive frame portions 2030a and 2030b are driven. Similarly, the flexures 2045a and 2045b, which extend along the gaps 2035a and 2035b, also allow the sense frame 2010 to remain in substantially the same position when the drive frame 2030 is driven.

FIG. 21B shows an example of a sense mode of a z-axis gyroscope implementation driven as depicted in FIG. 21A. The sense beams 2020 are compliant to rotation around the z axis. Accordingly, the sense frame 2010 can vibrate torsionally in the presence of an angular rotation. These torsional sense motions of the sense frame 2010 can induce strain and charge in piezoelectric films disposed on the sense beams 2020. It may be observed from FIG. 21B that flexures 2047a and 2047b also can be deformed by the sense motion of the sense frame 2010. However, flexures 2040a, 2040b, 2045a and 2045b are not substantially deformed.

In the z-axis gyroscope implementations disclosed herein, the drive and sense frames may be designed with mechanically orthogonal modes of vibration. As shown in FIG. 21A, in some implementations, the drive suspension can restrict the drive motion to that of a substantially linear displacement along the x-axis.

In contrast, the sense frame suspension may be compliant to torsional rotations about the z axis, but may be comparatively stiff to translational motion in the x or y directions. The flexures connecting the drive frame 2030 and the sense frame 2010 may be made compliant to x-directed (quadrature) forces, but comparatively stiff to the y-directed, Coriolis-coupled torsional forces. Such configurations may substantially reduce drive motion quadrature coupling from the drive motion to the sense motion.

Moreover, in some implementations the elements of the gyroscope differential drive frame may be mechanically coupled to reduce the number of parasitic resonances and to separate frequencies of the symmetric and anti-symmetric modes. Consequently, these implementations resist quadrature-induced parasitic resonances.

Sense Beam Optimization

The electrical sensitivity of the piezoelectric gyroscope system can be increased by improving the stress uniformity on the sense beams. For a sense beam with a uniform rectangular cross-section, the bending stress on the sensing beam is a maximum at the anchor connection and reduces linearly as a function of the distance from the anchor. This results in a less-than-optimal integrated piezoelectric charge, and consequently voltage, on the sense electrode.

Figure 22:
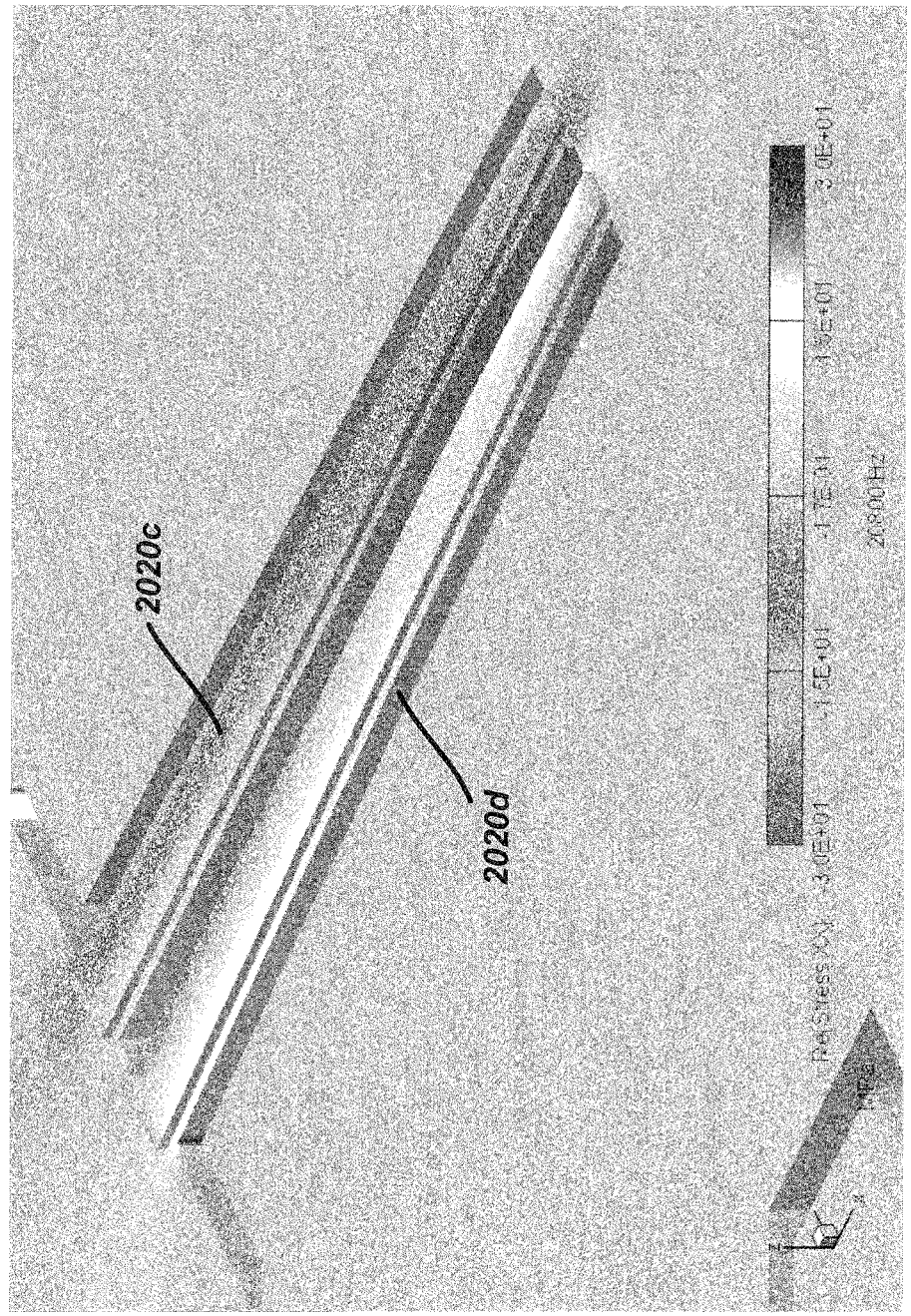
FIG. 22 shows an example of a close-up view of one implementation of a tapered sense beam from a z-axis gyroscope.

FIG. 22 shows an example of a close-up view of one implementation of a tapered sense beam from a z-axis gyroscope. As shown in FIG. 22, by utilizing a tapered sense beam profile, a substantially uniform stress profile may be achieved along the sense beams 2020c and 2020d. Accordingly, the total charge generated on the sense electrode may be enhanced.

Fabrication on Flat-Panel Display Glass

Some x-axis, y-axis and z-axis gyroscopes disclosed herein are well suited to manufacturing on large-area flat panel display glass. In some implementations using plated metal alloy proof masses and a sputtered piezoelectric AlN film, processing could occur at less than 400° C. A plated metal proof mass can have high mass density (as compared to silicon), and the absence of deep reactive-ion etching (DRIE) sidewall slope, which is common to silicon-based electrostatic designs and induces quadrature. Details of some fabrication processes are described below with reference to FIG. 41 et seq.

In some implementations, glass may serve as both the substrate and the package, resulting in a reduction in component cost. A z-axis gyroscope can be integrated with a number of other sensors and actuators, such as accelerometers, x-axis and/or y-axis gyroscopes, magnetometers, microphones, pressure sensors, resonators, actuators and/or other devices.

Quadrature Tuning with Electrostatic Actuators

Some implementations described herein involve the use of an array of electrostatic actuators to actively fine-tune the mechanical mode shape of the drive and/or sense frames in order to suppress quadrature and bias errors. Quadrature can be caused by unwanted deflections in the drive frame coupling to the sense frame.

Figure 23:
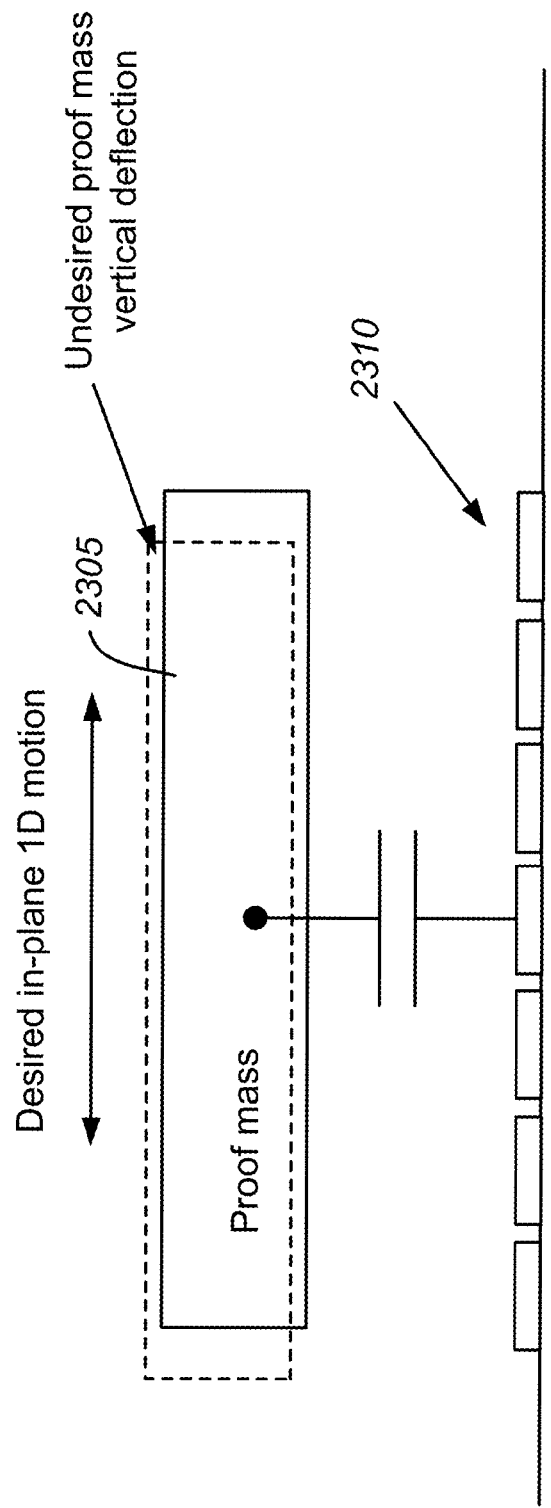
FIG. 23 shows an example of an electrode array that may be configured to apply corrective electrostatic forces to fine-tune the vibrational mode shapes of a proof mass.

FIG. 23 shows an example of an electrode array that may be configured to apply corrective electrostatic forces to fine-tune the vibrational mode shapes of a proof mass. FIG. 23 depicts a proof mass 2305, which may be a gyroscope or an accelerometer proof mass. The desired motion of the proof mass 2305 is in-plane, as shown. However, the vibrational modes of the proof mass 2305 may have out-of-plane components. One example of such an out-of-plane component, a small, vertical, undesired deflection (shown as the dashed outline of the proof mass 2305), is shown in FIG. 23 as being superimposed on the primary in-plane translation drive mode. The electrode array 2310 can be configured for applying an electrostatic correcting force to the proof mass 2305. By controlling the electrode array 2310 to actively apply an electrostatic force that cancels the undesired vertical component of motion of the proof mass 2305, quadrature-inducing accelerations that couple to the sense frame can be reduced.

The concept can be applied to a number of other implementations as well. For example, the electrostatic actuators may be composed of comb fingers configured to apply an electrostatic force for canceling out an undesired y-directed motion.

Description of Accelerometer Implementations

Various implementations described herein provide novel three-axis accelerometers, as well as components thereof. Such three-axis accelerometers have sizes, performance levels and costs that are suitable for use in a wide variety of consumer electronic applications, such as portable navigation devices and smart phones. Some such implementations provide a capacitive stacked lateral overlap transducer (SLOT) based three-axis accelerometer. Some implementations provide three-axis sensing using two proof masses, whereas other implementations provide three-axis sensing using only one proof mass. Different flexure types may be optimized for each axis.

Implementations of the accelerometer may be fabricated on large-area substrates, such as large-area glass panels. As described in detail below, the fabrication processes used in forming SLOT-based three-axis accelerometers on large-area substrates can be compatible with processes for fabricating gyroscopes on large-area substrates. Combining such processes can enable the monolithic integration of six inertial sensing axes on a single glass substrate.

For x-y axis in-plane sensing, some implementations provide a conductive proof mass and patterned electrodes on either side of a sacrificial gap. In-plane applied acceleration translates the proof mass laterally, which decreases the overlap between the first electrode and the proof mass and increases the overlap between the second electrode and the proof mass. In-plane bending flexures may provide structural support for a suspended proof mass.

For z-axis out-of-plane sensing, moment imbalances on either side of a pivot may be created by making one side of the proof mass relatively more (or less) massive than the other side of the proof mass. For example, moment imbalances on either side of the pivot may be created by perforating one side of the proof mass and/or by forming the proof mass with a different width and/or length on either side. In some implementations, a negative z-acceleration rotates the proof mass clockwise, which increases the gap between the first electrode and the proof mass and decreases the gap between the second electrode and the proof mass. The z-axis accelerometer may include torsional flexures. In some implementations, three-axis sensing can be achieved using one or two proof masses. Some examples are described below.

Figure 24:
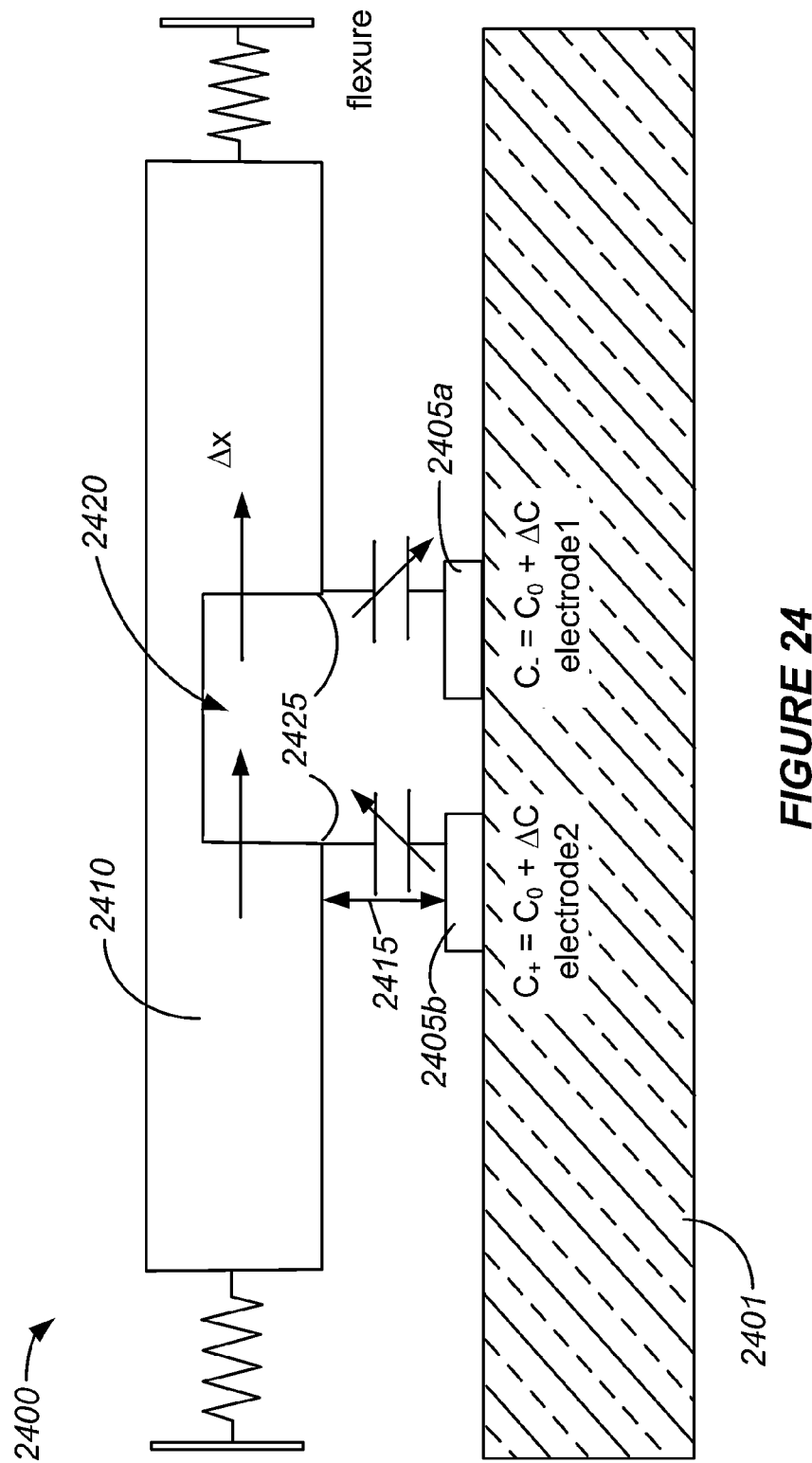
FIG. 24 shows an example of an accelerometer for measuring in-plane acceleration.

FIG. 24 shows an example of an accelerometer for measuring in-plane acceleration. The accelerometer 2400 includes electrodes 2405a and 2405b formed on the substrate 2401. The electrodes 2405a and 2405b may be formed from any convenient conducting material, such as metal. The accelerometer 2400 includes a conductive proof mass 2410 that is separated from the electrodes 2405a and 2405b by a gap 2415. The gap 2415 may, for example, by on the order of microns, e.g., 0.5 or 2 microns, or can be considerably smaller or larger.

Figure 32:
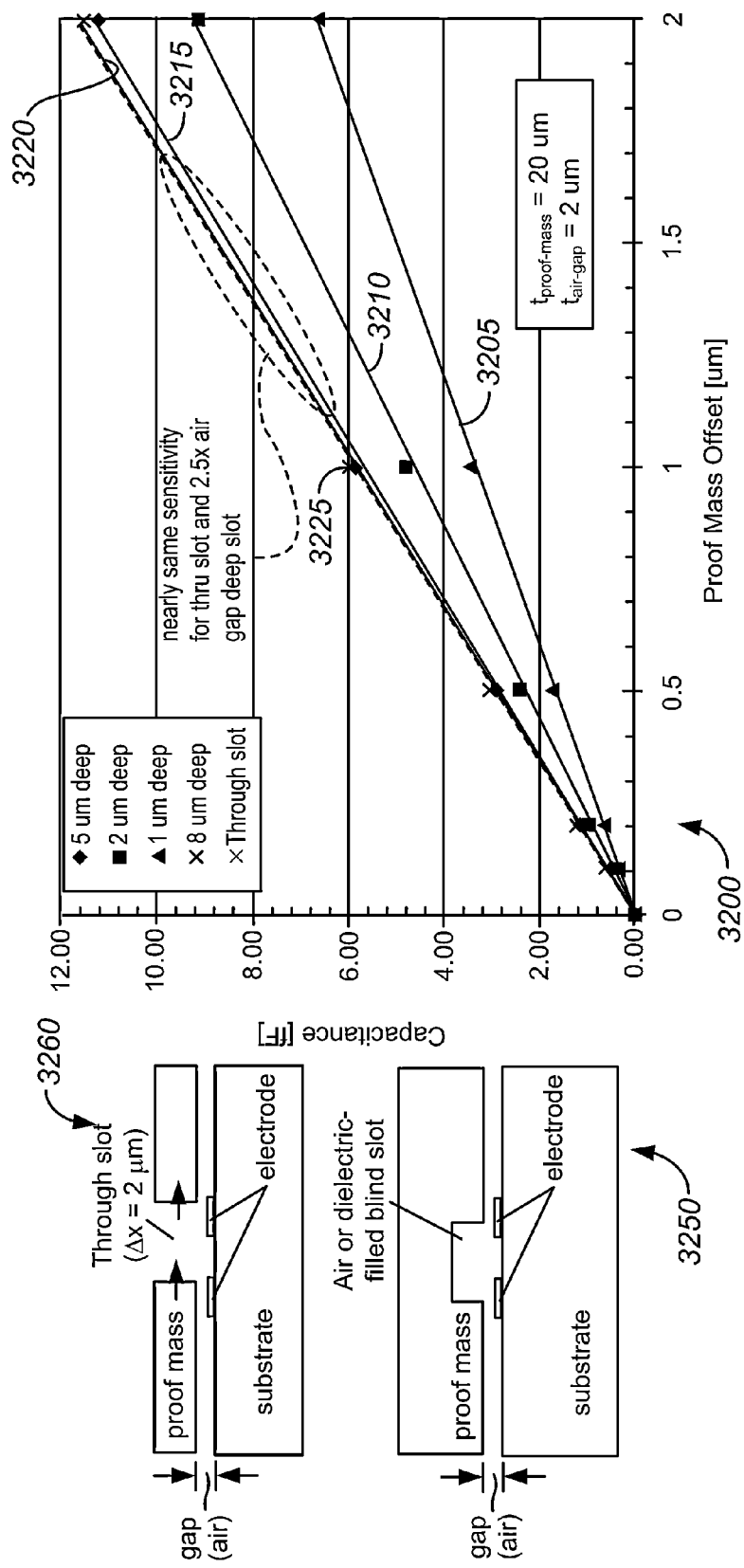
FIG. 32 shows a graph depicting the performance of SLOT-based accelerometers having slots of various depths, including a through slot.

The conductive proof mass 2410 includes a slot 2420. In this example, the edges 2425 of the slot 2420 are suspended over the electrodes 2405a and 2405b when the accelerometer 2400 is at rest. The slot 2420 may extend partially or completely through the conductive proof mass 2410, depending on the implementation. The capacitance of various conductive proof masses 2410 having different slot depths is shown in FIG. 32, which is described below. Accelerometers having the general configuration of the accelerometer 2400 may be referred to herein as stacked lateral overlap transducer (SLOT)-based accelerometers.

A positive x-acceleration translates the conductive proof mass 2410 laterally, which shifts the position of the slot 2420. More of the slot 2420 is positioned over the electrode 2405a, which causes more air and less conductive material to be positioned near the electrode 2405a. This decreases the capacitance at the electrode 2405a by $\Delta C$. Conversely, less of the slot 2420 is positioned over the electrode 2405b, which causes less air and more conductive material to be positioned near the electrode 2405b. This increases the capacitance at the electrode 2405b by $\Delta C$. A corresponding in-plane acceleration differential output signal that is proportional to $2\Delta C$ results from the change in overlap caused by the translation of the conductive proof mass 2410.

Figure 25:
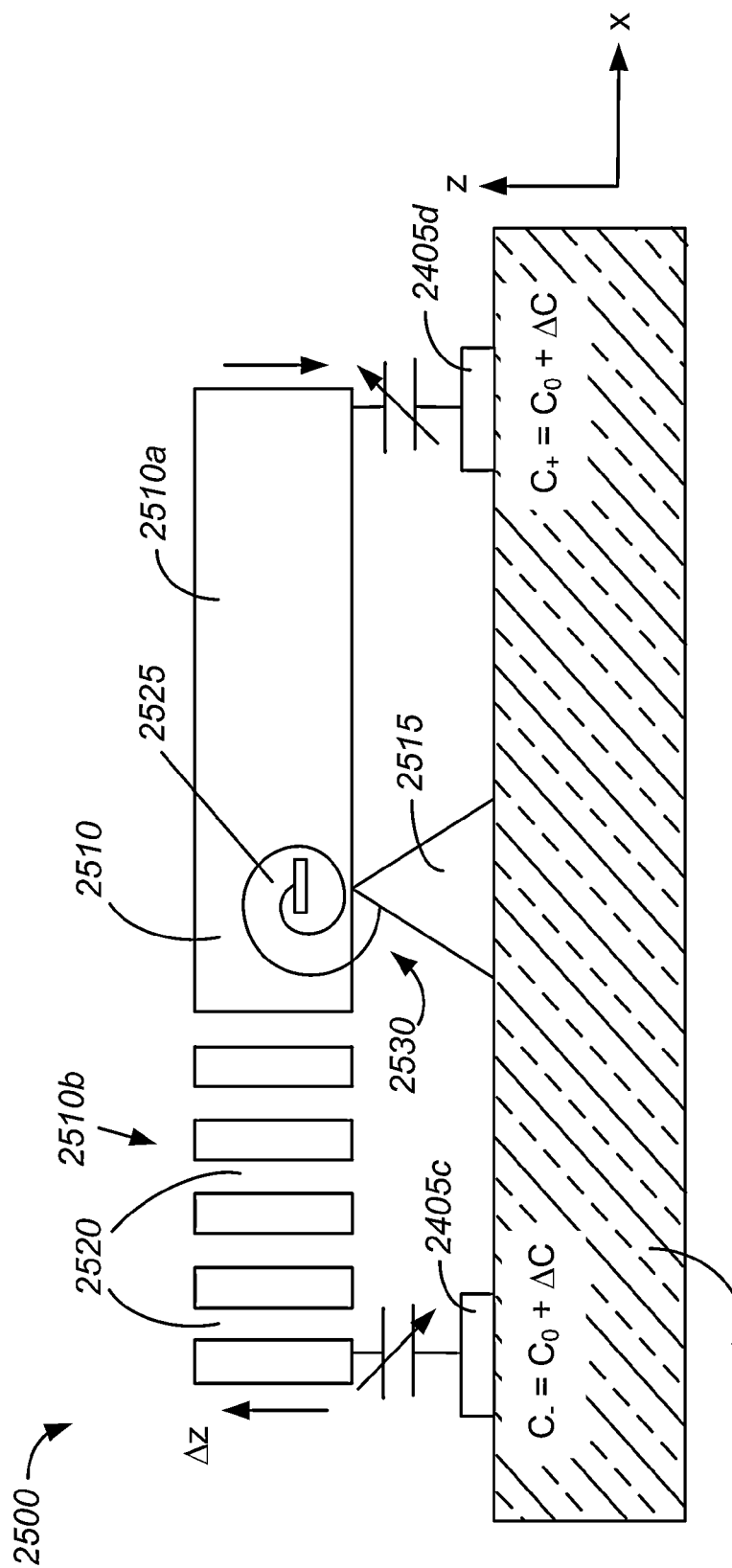
FIG. 25 shows components of an example of an accelerometer for measuring out-of-plane acceleration.

FIG. 25 shows an example of an accelerometer for measuring out-of-plane acceleration. In this example, the accelerometer 2500 includes a conductive proof mass 2510 that is attached to a substrate 2401 by a support 2515 and a torsional flexure 2525. The support 2515 and the torsional flexure 2525 form a pivot 2530. A moment imbalance can be created on either side of the support 2515, e.g., by perforating one side of the conductive proof mass 2510, by making the conductive proof mass 2510 a different width and/or length on either side the support 2515, or by combinations thereof. A moment imbalance also may be created by making one side of the conductive proof mass 2510 from material that is relatively more or less dense than the material used to form the other side of the conductive proof mass 2510. However, such implementations may be relatively more complex to fabricate. In this example, a moment imbalance has been created by making perforations 2520 in the side 2510b.

A negative z-acceleration rotates the conductive proof mass 2510 clockwise, which increases a gap between the electrode 2405c and the conductive proof mass 2510 and decreases a gap between the electrode 2405d and the conductive proof mass 2510. This decreases the capacitance at the electrode 2405c by ΔC and increases the capacitance at the electrode 2405d by ΔC. A corresponding out-of-plane acceleration output signal proportional to 2ΔC results.

Figure 26A:
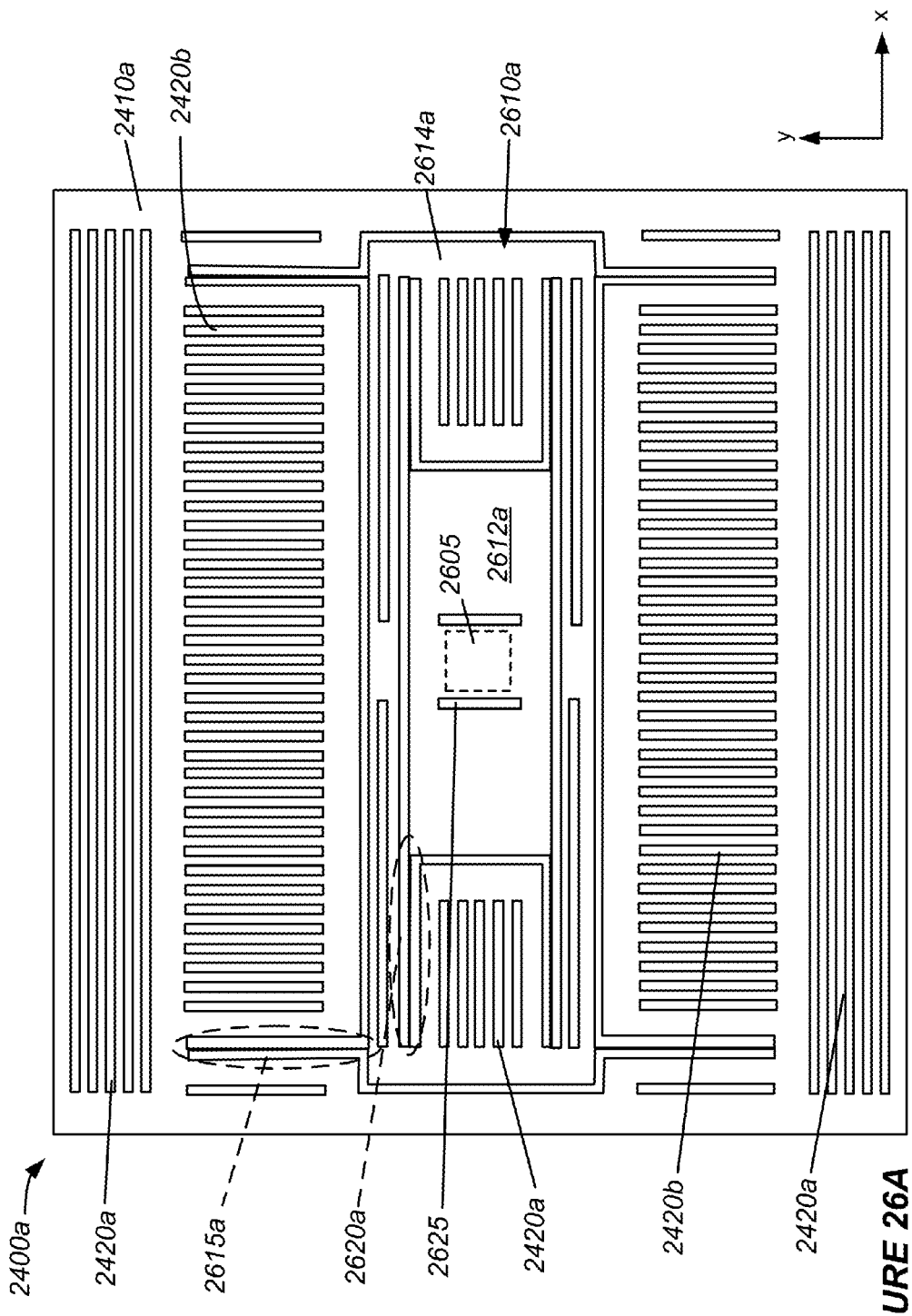
FIG. 26A shows components of an example of an accelerometer for measuring in-plane acceleration.

FIG. 26A shows an example of an accelerometer for measuring in-plane acceleration. The accelerometer 2400a may have overall x and y dimensions on the order of a few millimeters. In some implementations, the accelerometer 2400a may have x and y dimensions of less than a millimeter.

In this example, the accelerometer 2400a includes a conductive proof mass 2410a disposed around an inner frame 2610a. The conductive proof mass 2410a includes slots 2420a that extend substantially along a first axis, which is the x axis in this example. The conductive proof mass 2410a also includes slots 2420b that extend substantially along a second axis, which is the y axis in this example. As described in more detail below, the conductive proof mass 2410a is constrained to move substantially along the x axis, the y axis, or a combination of the x and y axes.

The inner frame 2610a includes a substantially stationary portion 2612a, which is connected to a substrate via an anchor 2605. The anchor 2605 is disposed underneath the plane depicted in FIG. 26A. Here, the stationary portion 2612a also includes a pair of stress isolation slits 2625, which extend substantially along the y axis in this example. The stress isolation slits 2625 can desensitize acceleration measurements to stresses in the film, substrate and/or package. The inner frame 2610a also includes a movable portion 2614a. The flexures 2615a connect the movable portion 2614a to the conductive proof mass 2410a. The flexures 2620a connect the movable portion 2614a to the stationary portion 2612a. The flexures can be folded flexures, which can increase bending compliance. In some embodiments, the flexures may be serpentine flexures. In this example, the inner frame 2610a includes a plurality of slots 2420a. Additional slots 2420a may be formed in proof mass 2410a, as shown in FIG. 26A.

Figure 26B:
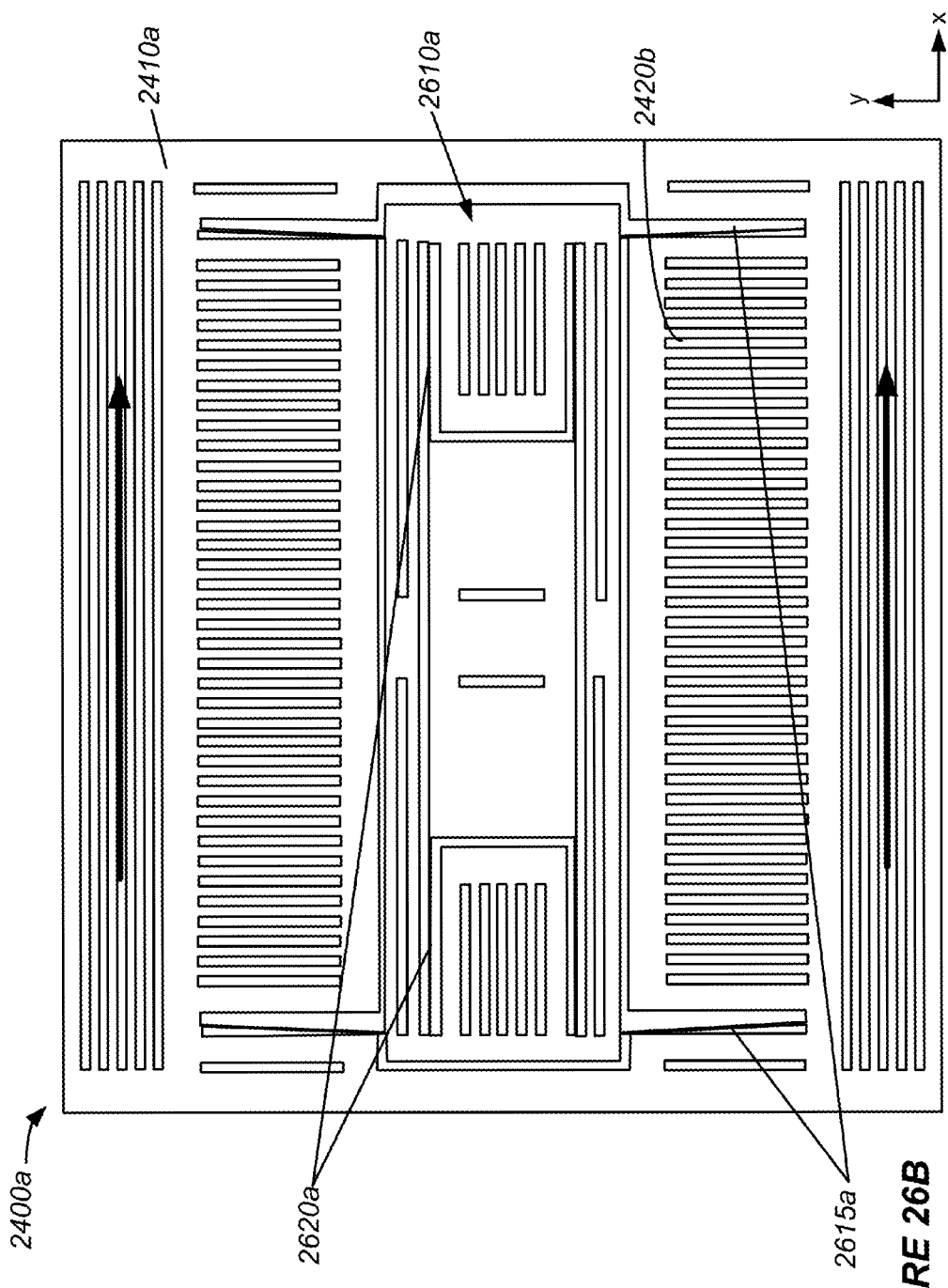
FIG. 26B shows an example of the response of the accelerometer of FIG. 26A to acceleration along a first axis.
Figure 28:
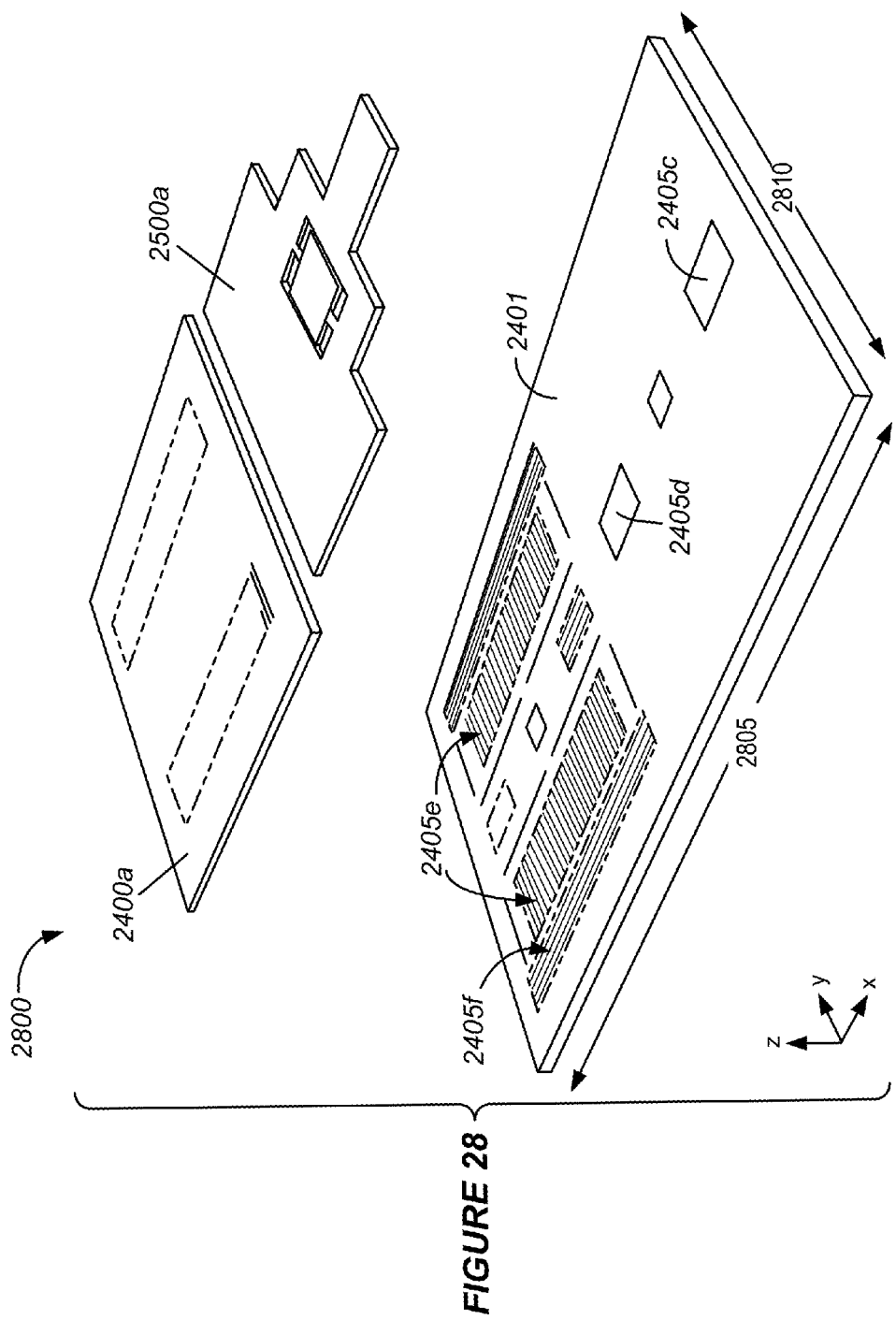
FIG. 28 shows an example of an alternative accelerometer implementation for measuring in-plane and out-of-plane acceleration.

FIG. 26B shows an example of the response of the accelerometer of FIG. 26A to acceleration along a first axis. Here, the conductive proof mass 2410a of the accelerometer 2400a is moving along the x axis. The slots 2420b are shifted along the x axis, which causes a change in capacitance to be detected by the corresponding electrodes 2405, as described above with reference to FIG. 24. The electrodes 2405 are disposed on a substrate 2401 (not shown) underlying the plane illustrated in FIG. 26B. The special relationships between accelerometer 2400a, the substrate 2401 and the electrodes 2405 are illustrated in FIG. 28 and are described below. The flexures 2615a, which are deformed in FIG. 26B, allow the conductive proof mass 2410a to move along the x axis while the inner frame 2610a remains substantially stationary. In this implementation, the flexures 2620a are not substantially deformed. The capacitance associated with slots 2420a is substantially unchanged under x translation of the proof mass.

Figure 26C:
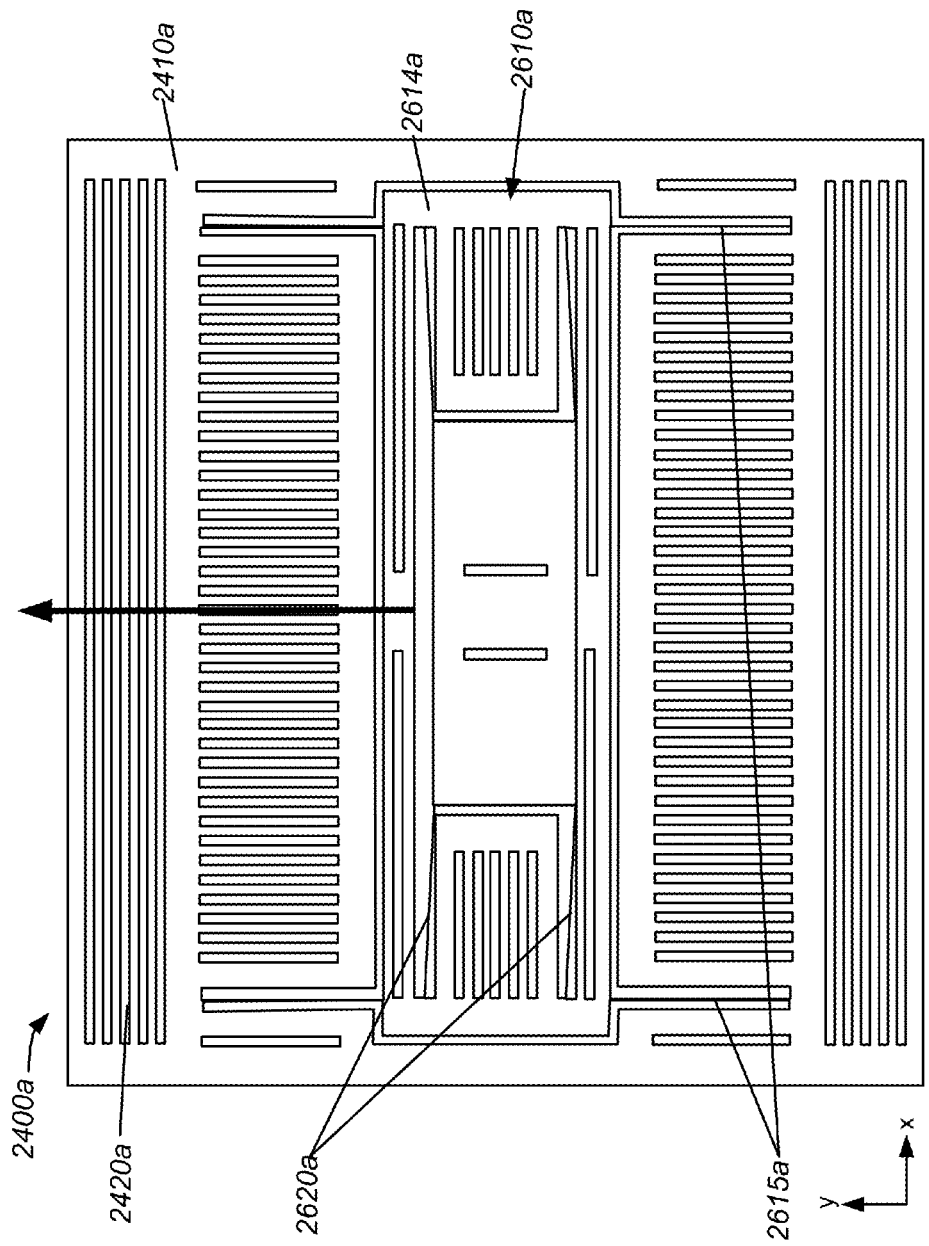
FIG. 26C shows an example of the response of the accelerometer of FIG. 26A to acceleration along a second axis.

FIG. 26C shows an example of the response of the accelerometer of FIG. 26A to acceleration along a second axis. Here, the conductive proof mass 2410a and the movable portion 2614a of the inner frame 2610a are moving along the y axis. The slots 2420a are shifted along the y axis, which causes a change in capacitance to be detected by the corresponding electrodes 2405, as described above. The flexures 2620a, which are deformed in FIG. 26C, allow the movable portion 2614a to move along the y axis with the conductive proof mass 2410a. In this implementation, the flexures 2615a are not substantially deformed. The capacitance associated with the slots 2420b is substantially unchanged under y translation of the proof mass 2410a and the movable portion 2614a.

Figure 26D:
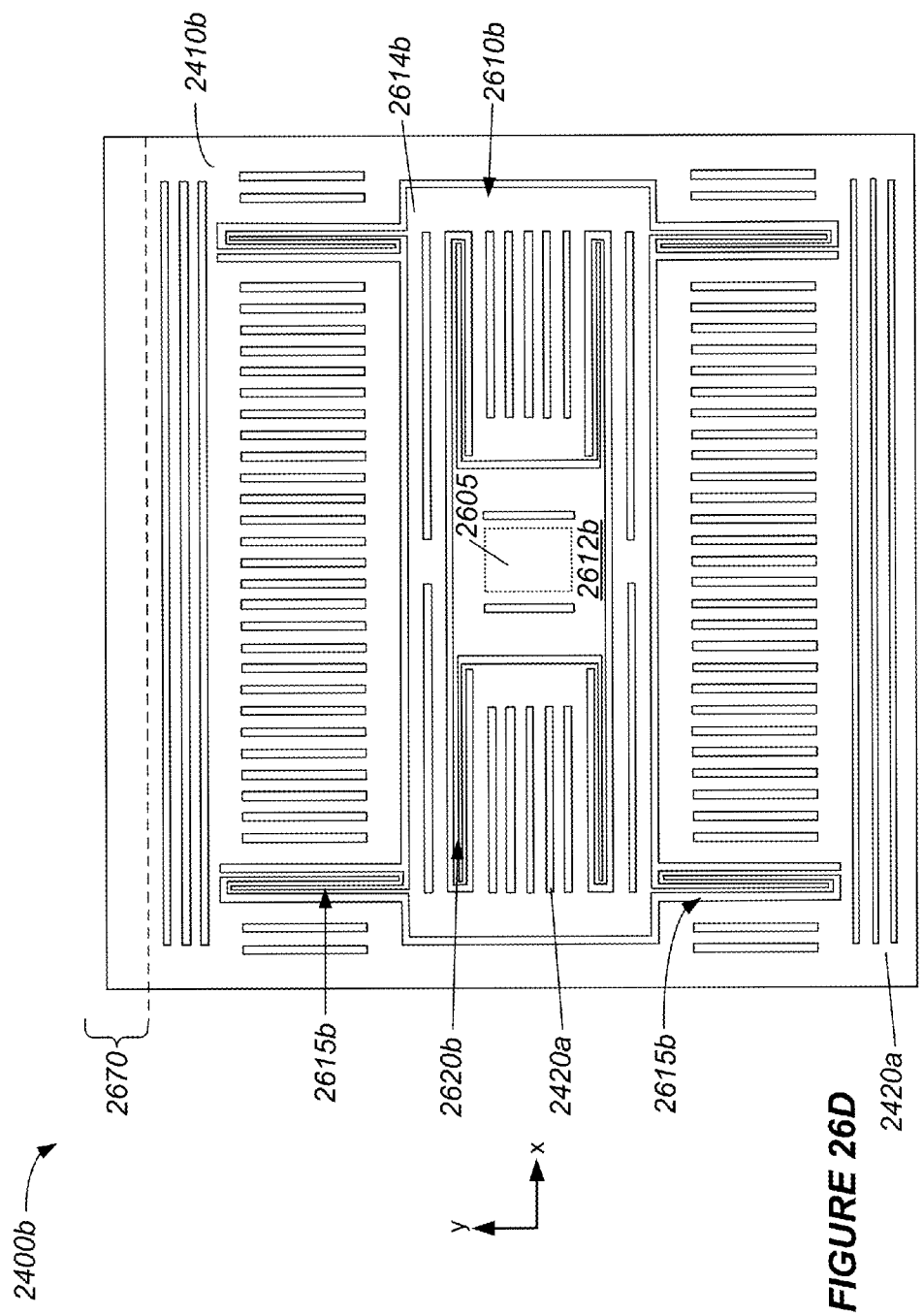
FIG. 26D shows an example of an accelerometer for measuring in-plane and out-of-plane acceleration.

FIG. 26D shows an example of an accelerometer for measuring in-plane and out-of-plane acceleration. In this example, the accelerometer 2400b includes a conductive proof mass 2410b having an extension 2670. The extension 2670 causes the portion of conductive proof mass 2410b that is on the side of the extension 2670 to be more massive than the portion of conductive proof mass 2410b that is on the other side of the anchor 2605. The extra mass of the extension 2670 creates a moment imbalance of the type described above with reference to FIG. 25, allowing the accelerometer 2400b to be sensitive to acceleration along the z axis.

There are other differences between the accelerometer 2400b and the accelerometer 2400a described in the previous drawings. In the implementation depicted in FIG. 26D, the stationary portion 2612b of the inner frame 2610b is relatively smaller than the stationary portion 2612a of the inner frame 2610a in the implementation depicted in, e.g., FIG. 26A. This configuration allows the slots 2420a to occupy relatively more area of the inner frame 2610b, which can result in greater sensitivity for measuring acceleration along the y axis. Moreover, in the implementation depicted in FIG. 26D, the flexures 2615b and 2620b are serpentine flexures.

Figure 27:
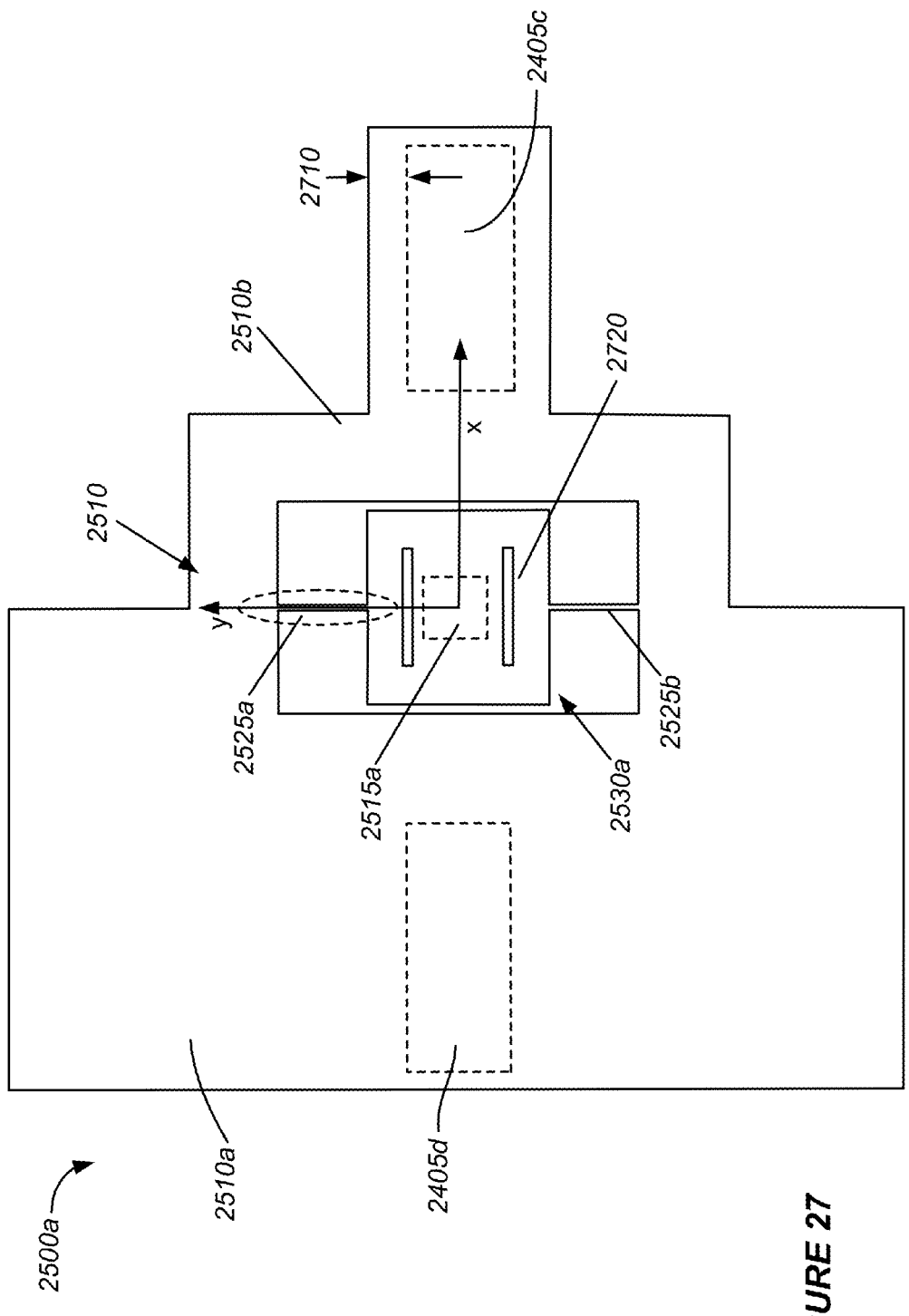
FIG. 27 shows an example of an accelerometer for measuring out-of-plane acceleration.

FIG. 27 shows an example of an accelerometer for measuring out-of-plane acceleration. The z-axis accelerometer 2500a is configured to operate according to the general principles of the accelerometer 2500, described above with reference to FIG. 25. Here, the conductive proof mass 2510 is attached to a substrate 2401 (not shown) by an anchor 2515a and a pair of torsional flexures 2525a that form a pivot 2530a. A moment imbalance has been created on either side of the pivot 2530a by making the side 2510b of the conductive proof mass 2510 relatively smaller than the other side 2510a.

The electrodes 2405c and 2405d are disposed in a plane below the accelerometer 2500a on the substrate 2401, as shown in FIGS. 25 and 28. In this example, the electrode 2405c is inset from an edge of the side 2510b of the conductive proof mass 2510 by a distance 2710. An acceleration along the z axis causes the conductive proof mass 2510 to rotate about the y axis and about the pivot 2530a, as described above with reference to FIG. 25. For example, an acceleration along the z axis rotates the side 2510a of the conductive proof mass 2510 in a negative z direction (towards the electrode 2405d) and rotates the side 2510b in a positive z direction (away from the electrode 2405c). This rotation of the conductive proof mass 2510 about the pivot 2530a decreases the capacitance at the electrode 2405c by ΔC and increases the capacitance at the electrode 2405d by ΔC, as described above with reference to FIG. 25. A corresponding out-of-plane acceleration output signal proportional to 2ΔC results. The change in capacitance at the electrodes 2405c and 2405d may depend on various factors, such as the size of the electrodes 2405c and 2405d, the magnitude of the acceleration along the z axis, etc. In some implementations, the change in capacitance at the electrodes 2405c and 2405d may be in the range of femtofarads.

FIG. 28 shows an example of an alternative accelerometer implementation for measuring in-plane and out-of-plane acceleration. In this example, a three-axis accelerometer 2800 combines the z-axis accelerometer 2500a (FIG. 27) with the x-y axis accelerometer 2400a (FIGS. 26A-C). In some implementations, the accelerometer 2800 may have a length 2805 and a width 2810 that are on the order of a few millimeters or less. For example, the length 2805 may be in the range of 0.5 to 5 mm, whereas the width may be in the range of 0.25 to 3 mm.

The electrodes 2405c-f are disposed on areas of the substrate 2401 next to which the accelerometer 2500a and the accelerometer 2600a will be fabricated. The electrodes 2405c and 2405d can be configured to measure the responses of accelerometer 2500a to z-axis acceleration. The electrodes 2405e can be configured to detect acceleration of the accelerometer 2600a along the x axis, whereas the electrodes 2405f can be configured to detect acceleration of the accelerometer 2600a along the y axis.

Figure 29:
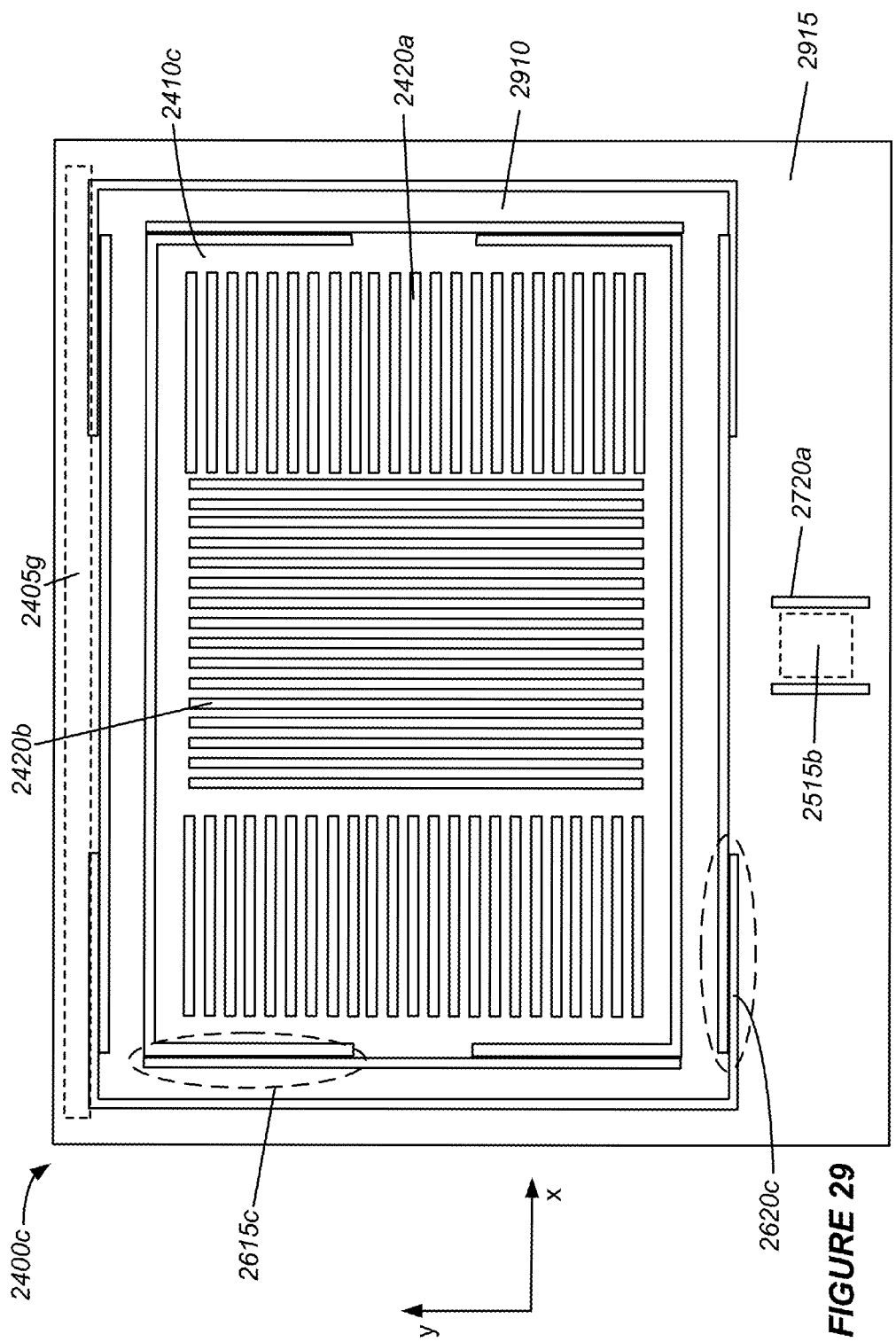
FIG. 29 shows an example of another alternative accelerometer implementation for measuring in-plane and out-of-plane acceleration.

FIG. 29 shows an example of another alternative accelerometer implementation for measuring in-plane and out-of-plane acceleration. In this example, the accelerometer 2400c includes a conductive proof mass 2410c disposed within a decoupling frame 2910. The flexures 2615c connect the conductive proof mass 2410c to the decoupling frame 2910 and allow the conductive proof mass 2410c to translate along the x axis. Electrodes disposed on an adjacent substrate (not shown) can detect acceleration along the x axis according to changes of capacitance caused by the movements of one or more slots 2420b.

The decoupling frame 2910 can be disposed within an anchoring frame 2915. The flexures 2620c connect the decoupling frame 2910 to the anchoring frame 2915 and allow the decoupling frame 2910 and the conductive proof mass 2410c to move along the y axis. Electrodes disposed on an adjacent substrate (not shown) can detect acceleration along the y axis according to changes of capacitance caused by the movements of one or more slots 2420a.

A pivot 2515b can connect the anchoring frame 2915 to a substrate 2401 (not shown in FIG. 29). A moment imbalance has been created by fabricating most of the accelerometer 2600c on one side of the pivot 2515b. An acceleration along the z axis rotates the accelerometer 2600c either towards or away from an electrode 2405g on the substrate 2401. This rotation either increases or decreases the capacitance at the electrode 2405g by ΔC, as described above with reference to FIGS. 25 and 27. Due to the rotation, a corresponding out-of-plane acceleration output signal proportional to ΔC results. The stress isolation slits 2720a may help desensitize acceleration measurements to stresses in the film, substrate and/or package.

Some accelerometer implementations feature plated stops that place boundaries on the motions of the proof mass and/or flexures in order to protect the proof mass and adjacent structures from potentially damaging overtravel and stiction. For example, referring to FIG. 28, posts may be fabricated on the substrate 2401 around the perimeter of accelerometer 2400a, in order to limit the x and/or y displacement of the accelerometer 2400a. Similar structures may be formed under accelerometer 2500a, in order to prevent accelerometer 2500a from contacting the electrode 2405c, the electrode 2405d or the substrate 2101. Such implementations thereby improve reliability and shock survivability. These features may be fabricated during the same photolithography and plating processes that are used to fabricate the proof mass and flexures.

Figure 30:
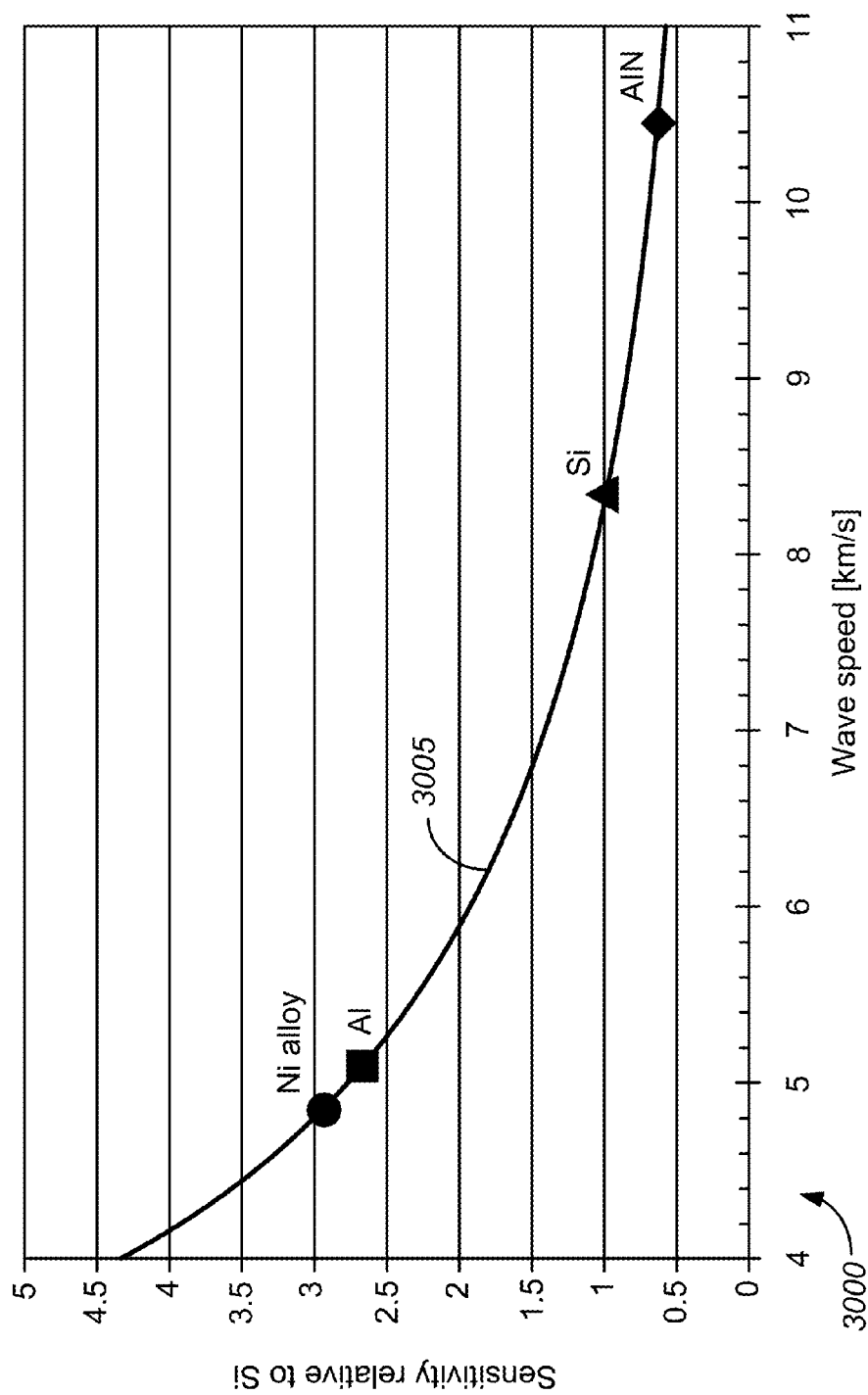
FIG. 30 shows a graph depicting the relative sensitivity enabled by various materials that may be used to form an accelerometer or a gyroscope.

FIG. 30 shows a graph depicting the relative sensitivity enabled by of various materials that may be used to form an accelerometer or a gyroscope. The relative sensitivity indicated in graph 3000 is based on the theoretical comparison of sensors with identical topologies but different materials, normalized to the sensitivity of a sensor made from silicon. The curve 3005 indicates that using a plated nickel alloy as a structural material can yield approximately three times greater sensitivity than using silicon as a structural material for a device having the same design, assuming that dimensions of the two devices are the same. The data points of the graph 3000 are based on the assumption that the same material is used for the proof mass and the flexures. The wave speed is defined as the square root of: (Young's modulus/mass density). A low Young's modulus provides a large displacement for a given inertial force, whereas a high mass density provides a large inertial force for a given acceleration.

Figure 31A:
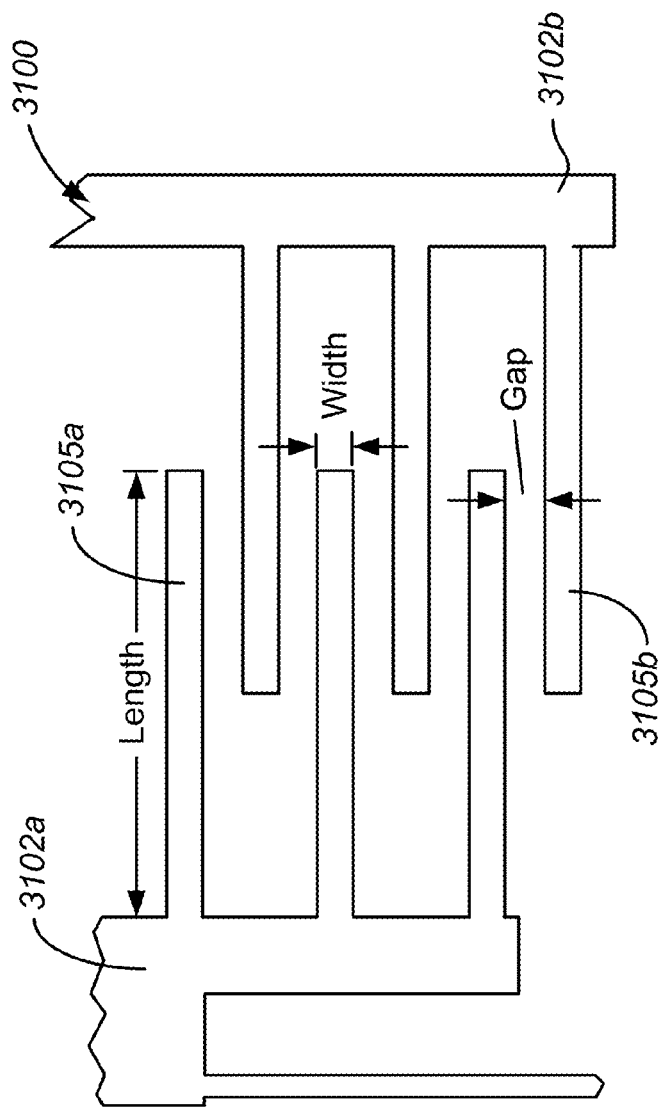
FIG. 31A shows an example of a comb-finger accelerometer.

FIG. 31A shows an example of a comb-finger accelerometer. Comb-finger accelerometers are also known as interdigitated-capacitor accelerometers or comb-drive accelerometers. The comb-finger accelerometer 3100 includes the members 3102a and 3102b, on which the electrode "fingers" 3105a and 3105b, respectively, are disposed. In this example, the member 3102a is a movable member that is constrained to move substantially along the x axis. When the member 3102a moves toward the stationary member 3102b, an overlap between the fingers 3105a and 3105b increases. Accordingly, motion of the member 3102a in a positive x direction results in increased capacitance between the fingers 3105a and 3105b.

Figure 31B:
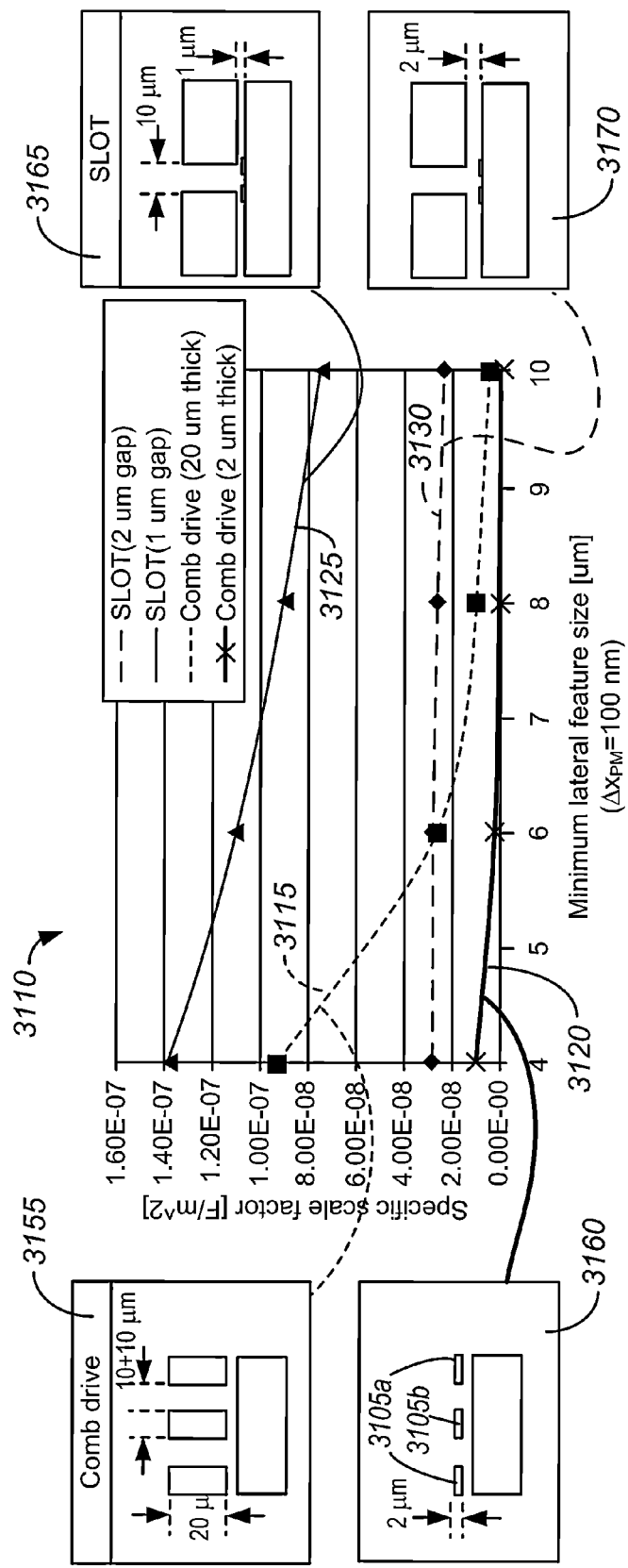
FIG. 31B shows a graph depicting the performance of comb drive and SLOT-based accelerometers.

FIG. 31B is a graph that depicts the performance of comb-drive and SLOT-based accelerometers. The relative effect of changing sacrificial gap height and proof mass thickness on the sensitivity of capacitive-SLOT and comb-finger based accelerometers may be observed in FIG. 31B. The curve 3115 corresponds to the comb-finger based accelerometer of the inset 3155, whereas the curve 3120 corresponds to the comb-finger based accelerometer of the inset 3160. The inserts 3155 and 3160 depict cross-sectional views of the comb-finger based accelerometers, with the fingers shown above a substrate. Insets 3155 and 3160 also show examples of the dimensions and spacing of the fingers 3105a and 3105b. The curve 3125 corresponds to the SLOT-based accelerometer of the inset 3165 and the curve 3130 corresponds to the SLOT-based accelerometer of the inset 3170.

The resulting graph 3110 indicates that the disclosed SLOT transducer topologies can enable high sensitivity without the need for high-aspect-ratio structural features. Moreover, SLOT-based accelerometer implementations gain efficiency over comb drive devices with increasing feature size. The minimum lateral feature size indicated on the horizontal axis refers to the finger width and spacing in the case of comb finger-type accelerometers and the width of the slot in the case of SLOT-based accelerometers. The specific scale factor on the vertical axis refers to the change in capacitance per unit area of an accelerometer in response to a 100 nm lateral translation of the proof mass. For relatively larger minimum lateral feature sizes (here, minimum lateral feature sizes greater than 6 microns), both examples of SLOT-based accelerometers provide a larger change in capacitance per unit area than the comb-finger accelerometers. The SLOT-based accelerometer with a 1 micron gap provides a larger change in capacitance per unit area for all depicted minimum lateral feature sizes.

FIG. 32 shows a graph that depicts the performance of SLOT-based accelerometers having slots of various depths, including a through slot where the slot extends completely through the proof mass. The curves 3205, 3210, 3215 and 3220 correspond to inset 3250, in which the proof mass includes a blind slot, where the slot extends partially into the proof mass. The curves 3205, 3210, 3215 and 3220 correspond to increasing depths of such a blind slot. The curve 3225 corresponds to the inset 3260, in which the proof mass includes a through slot.

As illustrated in FIG. 32, the performance of some of the SLOT-based in-plane accelerometers may be enhanced by replacing the through slots in the proof mass with blind slots. Replacing a slot that extends completely through the proof mass with a slot that does not extend completely through the proof mass can reduce the required plating aspect ratio (the height to width ratio of the slot). Increasing the proof mass areal density can improve the sensitivity for a given sensor area. Therefore, having relatively shallower slots also can improve accelerometer sensitivity for a given area. From simulations, it has been determined that essentially no sensitivity ($\Delta C/\Delta x$) is lost if an air-filled groove is at least twice the depth of the gap between the proof mass and the underlying electrode. Sensitivity decreases with increasing permittivity of optional groove-filling dielectric.

Figure 33:
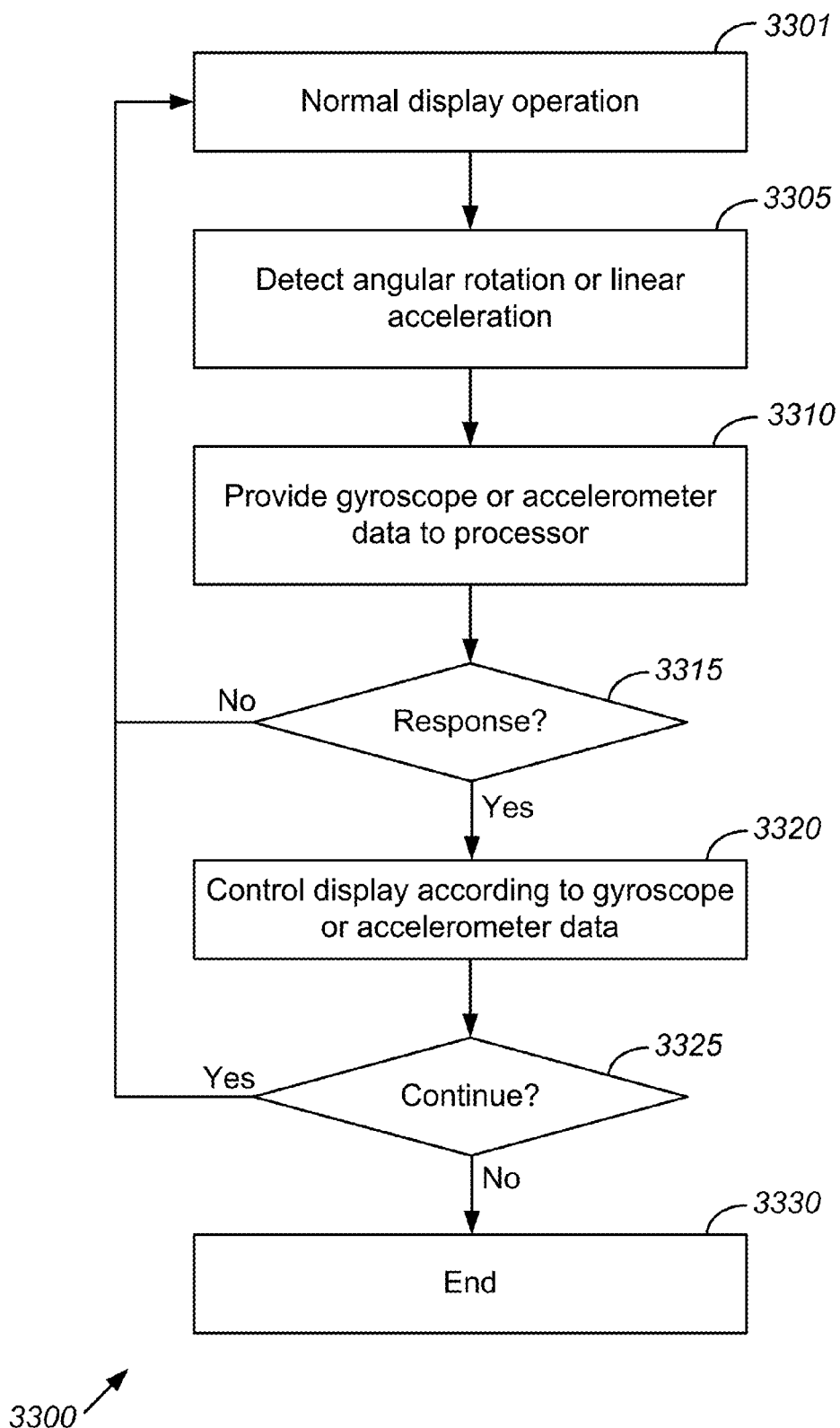
FIG. 33 shows an example of a flow diagram that outlines stages of a method involving the use of one or more gyroscopes or accelerometers in a mobile device.

FIG. 33 shows an example of a flow diagram that outlines stages of a method 3300 involving the use of one or more gyroscopes or accelerometers in a mobile device. The components of some such mobile devices are described below with reference to FIGS. 47A and 47B. These mobile devices may include a display, a processor that is configured to communicate with the display and a memory device that is configured to communicate with the processor. The processor may be configured to process image data.

However, the processor (and/or another such component or device) also may be configured for communication with one or more accelerometers and/or gyroscopes. The processor may be configured to process and analyze gyroscope data and/or accelerometer data. In some implementations, the mobile device may include accelerometers and gyroscopes that collectively provide an inertial sensor that is responsive to movement corresponding to six degrees of freedom, including three linear degrees of freedom and three rotational degrees of freedom.

In block 3301, the processor may control the display for normal display operation. When angular rotation or linear acceleration is detected (block 3305), gyroscope data and/or accelerometer data may be provided to the processor (block 3310). In block 3315, the processor determines whether to respond to the gyroscope data and/or accelerometer data. For example, the processor may decide that no response will be made unless the gyroscope data and/or accelerometer data indicate an angular rotation or a linear acceleration is greater than a predetermined threshold level of acceleration. If the gyroscope data and/or accelerometer data do not indicate a value greater than a predetermined threshold, the processor may control the display according to procedures for normal display operation, e.g., as described above with reference to FIGS. 2 through 5B.

However, if the gyroscope data and/or accelerometer data do indicate a value greater than the predetermined threshold (or if the processor determines that a response is required according to another criterion), the processor will control the display, at least in part, according to the gyroscope data and/or accelerometer data (block 3320). For example, the processor may control a state of the display according to accelerometer data. The processor may be configured to determine whether the accelerometer data indicate, e.g., that the mobile device has been dropped or is being dropped. The processor may be further configured to control a state of the display to prevent or mitigate damage when the accelerometer data indicate the display has been or is being dropped.

If the accelerometer data indicate that the mobile device has been dropped, the processor also may save such accelerometer data in the memory. The processor also may be configured to save time data associated with the accelerometer data when the accelerometer data indicate that the mobile device has been dropped. For example, the mobile device also may include a network interface. The processor may be configured to obtain the time data from a time server via the network interface. Alternatively, the mobile device may include an internal clock.

Alternatively, or additionally, the processor may be configured to control the display of a game according to accelerometer and/or gyroscope data. For example, the accelerometer and/or gyroscope data may result from a user's interaction with the mobile device during game play. The user's interaction may, for example, be in response to game images that are being presented on the display.

Alternatively, or additionally, the processor may be configured to control the orientation of the display according to gyroscope or accelerometer data. The processor may, for example, determine that a user has rotated the mobile device to a new device orientation and may control the display according to the new device orientation. The processor may determine that displayed images should be re-oriented according to the rotation or direction of the mobile device when a different portion of the mobile device is facing upward.

The processor may then determine whether the process 3300 will continue (block 3325). For example, the processor may determine whether the user has powered off the device, whether the device should enter a "sleep mode" due to lack of user input for a predetermined period of time, etc. If the process 3300 does continue, the process 3300 may then return to block 3301. Otherwise, the process will end (block 3330).

Figure 34:
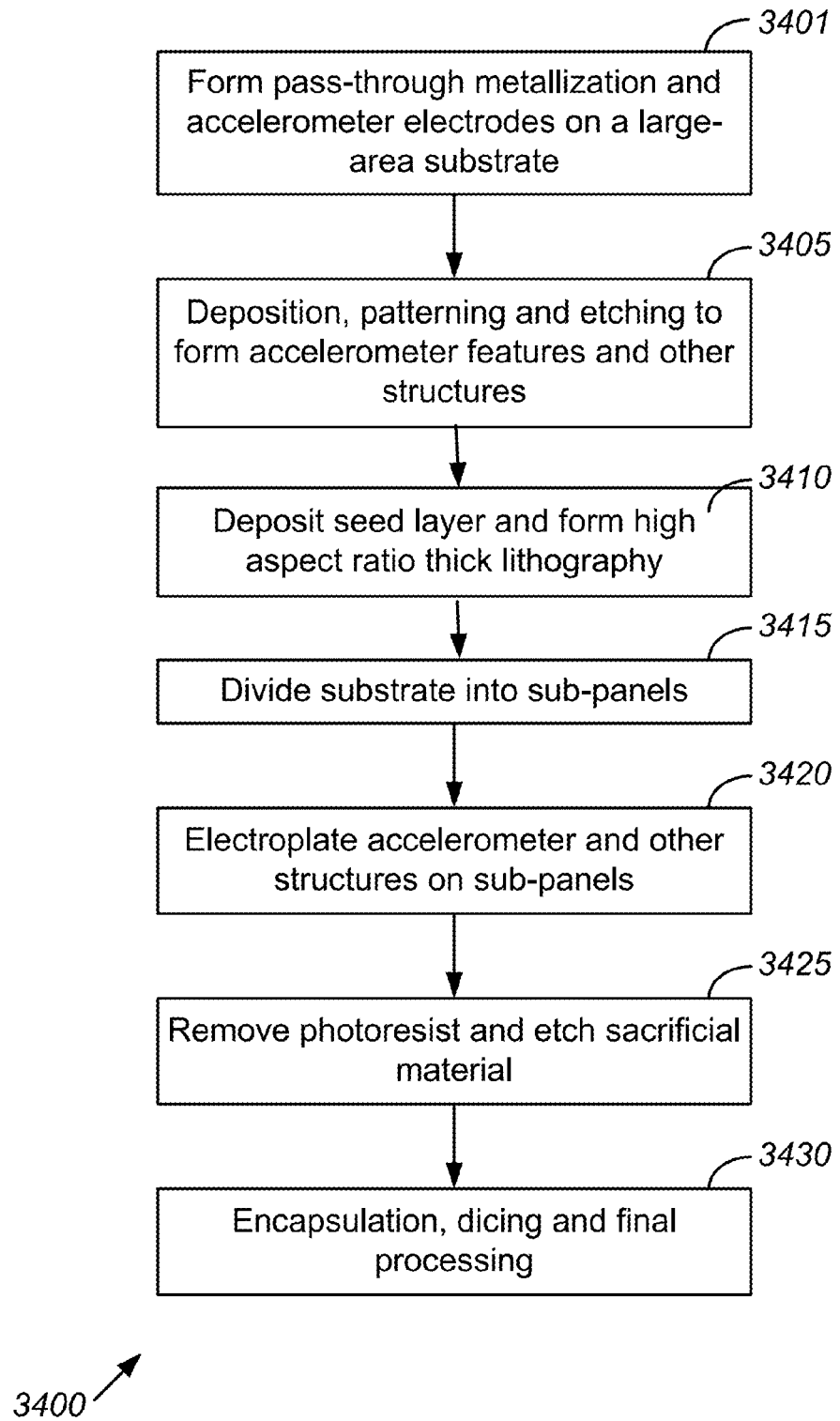
FIG. 34 shows an example of a flow diagram that provides an overview of a method of fabricating accelerometers.

An example of a process for fabricating accelerometers and related apparatus will now be described with reference to FIGS. 34 through 40C. FIG. 34 shows an example of a flow chart that provides an overview of a method of fabricating accelerometers. FIGS. 35A through 39B show examples of cross-sections through a substrate, a portion of an accelerometer and portions of structures for packaging the accelerometer and making electrical connections with the accelerometer, at various stages during the fabrication process. FIGS. 40A through 40C show examples cross-sectional views of various blocks in a process of forming a device that includes a MEMS die and an integrated circuit.

Referring to FIG. 34, some operations of a method 3400 will be described. The process flow of method 3400 allows a first set of operations to be performed at, e.g., a facility having the ability to build MEMS devices (or similar devices) on large-area substrates, such as large-area glass panels. Such a facility may, for example, be a Gen 5 "fab," having the capability of fabricating devices on 1100 mm by 1300 mm substrates, or a Gen 6 fab, having the capability of fabricating devices on 1500 mm by 1850 mm substrates.

Accordingly, in block 3401, pass-through metallization and accelerometer electrodes are formed on a large-area substrate, which is a large-area glass substrate in this example. In block 3405 a plurality of features for accelerometers and related structures are formed on the large-area substrate. In some implementations, the features for hundreds of thousands or more of such devices may be formed on a single large-area substrate. In some implementations, the accelerometers and gyroscopes may have a die size less than about 1 mm on a side to 3 mm on a side or more. The related structures may, for example, include electrodes, electrical pads, structures for encapsulation (such as seal ring structures), etc. Examples of such processes will be described below with reference to FIGS. 35A through 38D.

In block 3410 of FIG. 34, the partially-fabricated accelerometers and other devices are prepared for a subsequent electroplating process. As described below with reference to FIG. 38A, block 3410 may involve depositing a seed layer such as nickel, a nickel alloy, copper, or chrome/gold and the formation of thick layers of high aspect ratio lithography material for subsequent plating.

According to method 3400, the accelerometers and other structures are only partially fabricated on the large-area glass substrates. One reason for this partial fabrication is that there are currently few plating facilities that could process even Gen 4 or Gen 5 substrate sizes. However, there are many plating facilities that can handle smaller substrates, such as Gen 2 substrates (350 mm by 450 mm). Therefore, in block 3415, the large-area glass substrate on which the accelerometers and other structures have been partially fabricated is divided into sub-panels for the electroplating process(es).

In block 3420, the electroplating process(es) are performed. These processes are described below with reference to FIG. 38B. The electroplating process may, in some implementations, involve depositing most of the metal of each accelerometer's proof mass, frame, anchor(s) and other structures. The high aspect ratio lithography material may then be removed and the sacrificial material may be removed to release each accelerometer's proof mass and frame (block 3425). Examples of these operations are described below with reference to FIGS. 38C and 38D.

Block 3430 involves optional accelerometer encapsulation, as well as singulation (e.g., by dicing) and other processes. In some implementations, the method 3400 may involve attaching an integrated circuit to an encapsulated accelerometer, forming electrical connections with another substrate, molding and singulation. These processes are described below with reference to FIGS. 39A through 40C.

Referring now to FIG. 35A, a process of fabricating accelerometers will be described in more detail. FIG. 35A depicts a cross-section through one small portion (e.g., on the order of a few millimeters) of a large-area substrate 3505, which is a glass substrate in this example. At this stage, a metallization layer 3510 such as a chromium (Cr)/gold (Au) layer has been deposited on the large-area substrate 3505. Other conductive materials may be used instead of Cr and/or Au, such as one or more of aluminum (Al), titanium (Ti), tantalum (Ta), tantalum nitride (TaN), platinum (Pt), silver (Ag), nickel (Ni), doped silicon or TiW.

The metallization layer 3510 may then be patterned and etched, e.g. as shown in FIG. 35B. In this example, the central portion of the metallization layer 3510 has been patterned and etched to form the electrode area 3510b, which will form part of an accelerometer. The accelerometer and/or other devices may, for example, be sealed inside a cavity formed between the metallization areas 3510a. The metallization areas 3510a can form the "pass through" electrical connection from inside such packaging to outside the packaging. The metallization areas 3510a also can allow an electrical connection to be made between these devices and other devices outside the packaging.

FIG. 35C depicts a dielectric layer 3515 that is deposited over the metallization layer 3510. The dielectric layer 3515, which may be $SiO_2$ SiON, $Si_3N_4$ or another suitable dielectric, may then be patterned and etched to form openings 3605a, 3605b, 3605c and 3605d through the dielectric layer 3515 to the metallization areas 3510a (see FIG. 36A).

Figure 36A:
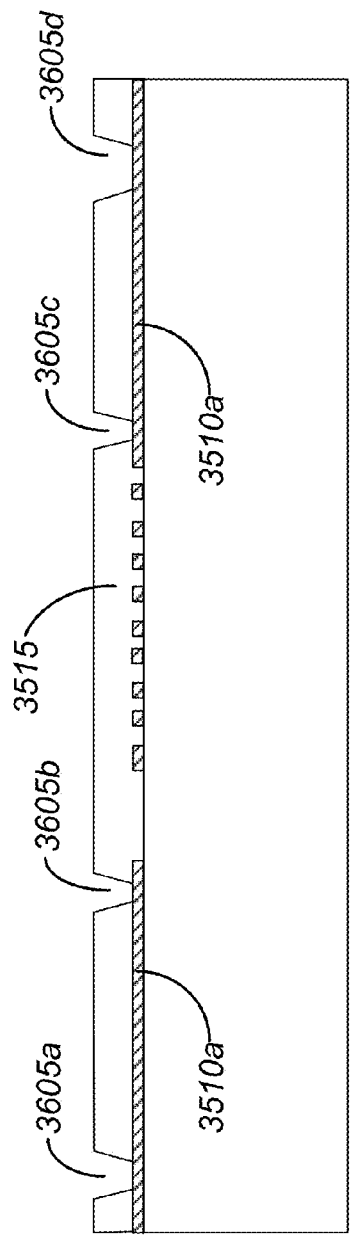
Figure 36B:
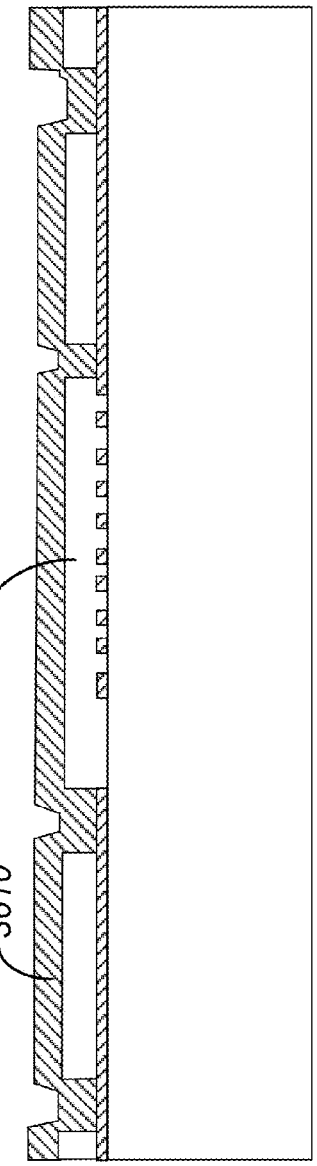

At the stage depicted in FIG. 36B, a metallization layer 3610 has been deposited on the dielectric layer 3515 and into the openings 3605a, 3605b, 3605c and 3605d. The metallization layer 3610 may be formed of any appropriate conductive material, such as Cr, Au, Al, Ti, Ta, TaN, Pt, Ag, Ni, doped silicon or TiW.

Figure 36C:
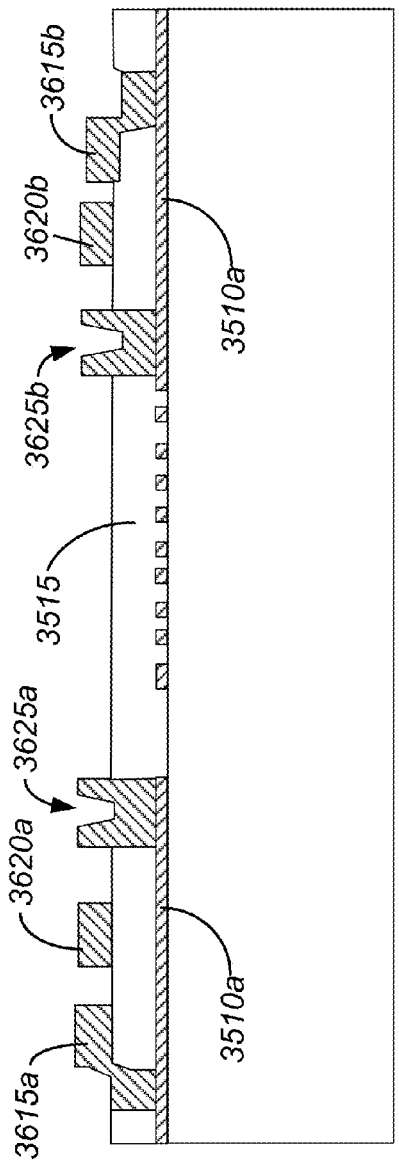
Figure 36D:
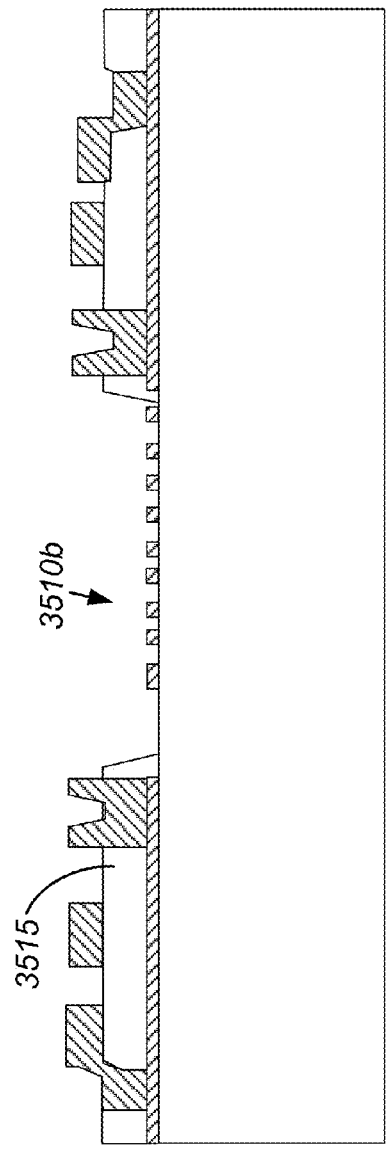

The metallization layer 3610 is then patterned and etched, as shown in FIG. 36C. As a result, the lead areas 3615a and 3615b are exposed above the surface of the dielectric layer 3515 and are configured for electrical connectivity with the metallization areas 3510a. Similarly, the accelerometer base areas 3625a and 3625b (which may be anchor areas in some implementations) also remain above the surface of the dielectric layer 3515 and configured for electrical connectivity with the metallization areas 3510a. The seal ring areas 3620a and 3620b also can be above the surface of the dielectric layer 3515, but are not electrically connected to the metallization areas 3510a. At the stage shown in FIG. 36D, the dielectric layer 3515 has been removed from the electrode area 3510b.

Figure 37A:
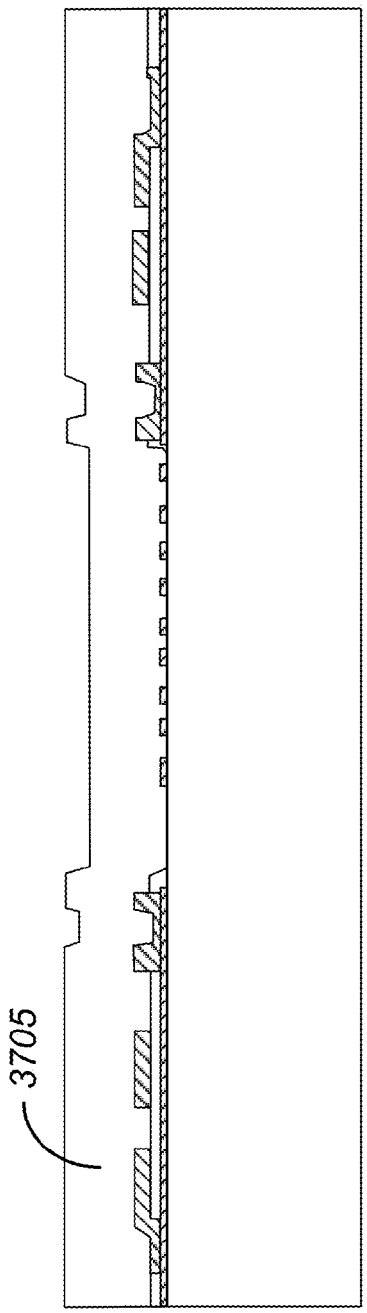
Figure 37B:
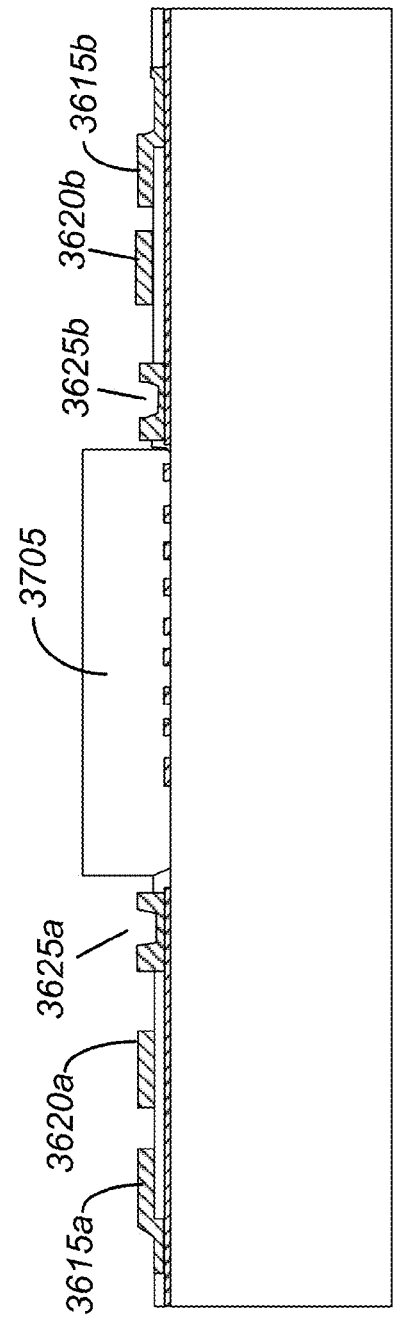

FIG. 37A illustrates a stage after which a sacrificial layer 3705 has been deposited. In this example, the sacrificial layer 3705 is formed of MoCr, but other materials may be used for the sacrificial layer 3705, such as Cu. FIG. 37B illustrates a stage of the process after the sacrificial layer 3705 has been patterned and etched. At this stage, the lead areas 3615a and 3615b, the seal ring areas 3620a and 3620b, and the accelerometer base areas 3625a and 3625b are exposed. A portion of the sacrificial layer 3705 remains over the electrode area 3510b.

The partially-fabricated accelerometer and related structures are then prepared for electroplating. In some implementations, a plating seed layer may be deposited prior to the electroplating process(es) as described above. The seed layer may, for example, be formed by a sputtering process and may be formed of nickel, a nickel alloy (such as nickel iron, nickel cobalt or nickel manganese), copper, or chrome/gold. As shown in FIG. 38A, a thick layer of high aspect ratio lithography material 3805 such as photoresist is formed over areas on which metal will not subsequently be electroplated. The high aspect ratio lithography material 3805 may be selectively exposed through a photomask and developed to form a mold that will define the shapes of metal structures that are subsequently plated up through the mold during the electroplating process(es). According to some implementations, the layer of high aspect ratio lithography material 3805 is tens of microns thick, e.g., 10 to 50 microns thick or more. In other implementations, the layer of high aspect ratio lithography material 3805 can be thicker or thinner depending on the desired configuration of the, e.g., accelerometer. The high aspect ratio lithography material 3805 may be any of various commercially-available high aspect ratio lithography materials, such as KMPR® photoresist provided by Micro-Chem or MTF™ WBR2050 photoresist provided by DuPont®.

The thick layers of the high aspect ratio lithography material 3805 can be formed over the lead areas 3615a and 3615b, the seal ring areas 3620a and 3620b, and over selected areas of the portion of the sacrificial layer 3705 that is still remaining. The selected areas are areas of the sacrificial layer 3705 that will not be electroplated. The gaps 3810 expose accelerometer base areas 3625a and 3625b, as well as other areas above the sacrificial layer 3705.

The large-area substrate on which the above-described structures have been partially formed may be divided into smaller sub-panels prior to the electroplating process. In this example, the large-area glass substrate is scribed and broken, but the large-area glass substrate may be divided in any appropriate manner, such as by sawing or dicing.

FIG. 38B depicts the apparatus after a thick metal layer 3815 has been electroplated in the areas between structures formed by the high aspect ratio lithography material 3805. In some implementations, the thick metal layer 3815 may be tens of microns thick, e.g., 5 to 50 microns thick. In other implementations, the thick metal layer 3815 can be thicker or thinner depending on the desired configuration of the, e.g., accelerometer. In this example, the thick metal layer 3815 is formed of a nickel alloy, but in other implementations, the thick metal layer 3815 may be formed of plated nickel, electroless nickel, CoFe, Fe based alloys, NiW, NiRe, PdNi, PdCo or other electroplated materials. In some implementations, a thin gold layer may be deposited on the thick metal layer 3815, primarily to resist corrosion.

FIG. 38C depicts the deposition of the thick metal layer 3815 and the removal of the high aspect ratio lithography material 3805. Removing the high aspect ratio lithography material 3805 exposes the lead areas 3615a and 3615b, the seal ring areas 3620a and 3620b, and selected areas of the sacrificial layer 3705. The sacrificial layer 3705 may then be etched, e.g., by a wet etching process or a plasma etching process, to release the moveable area 3840 of the accelerometer 3850 (see FIG. 38D) using, for example, $XeF_2$ for a molybdenum or molychrome sacrificial layer or a copper etchant for a copper sacrificial layer. Wet etching of Cu to selectively etch Cu without etching nickel alloys, Cr or Au may, for example, be accomplished either by using a combination of hydrogen peroxide and acetic acid, or by using ammoniacal Cu etchants that are commonly used in the printed circuit board industry. The moveable area 3840 may, for example, include a proof mass and/or frame such as those described above. During the operation of the accelerometer 3850, motion of the gaps 3860 may induce changes in capacitance that are detected by the electrodes 3510b.

Figure 39A:
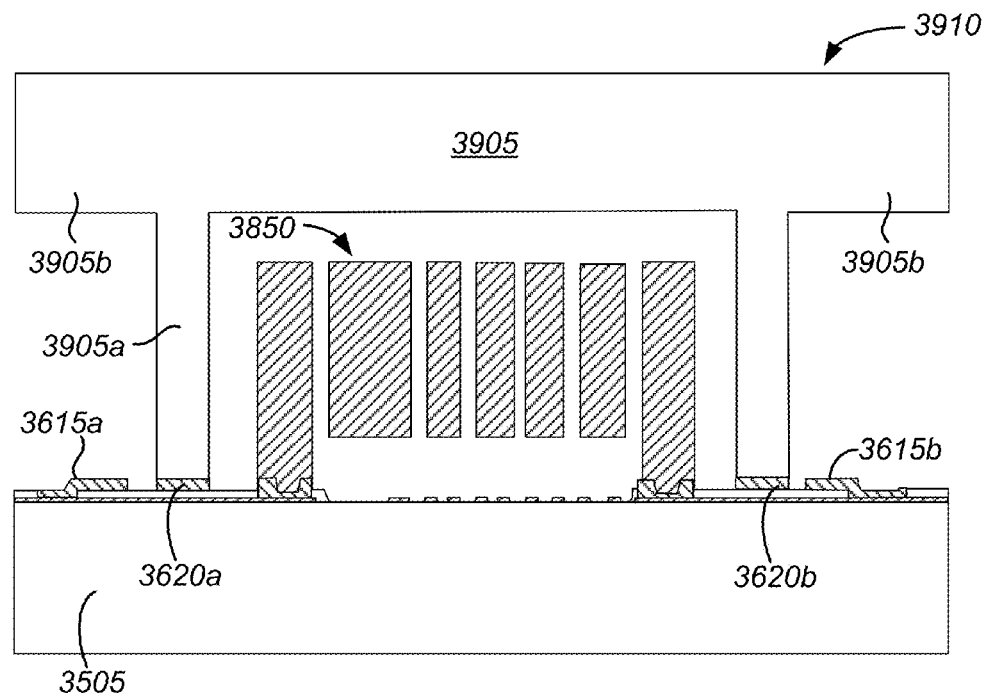
Figure 39B:
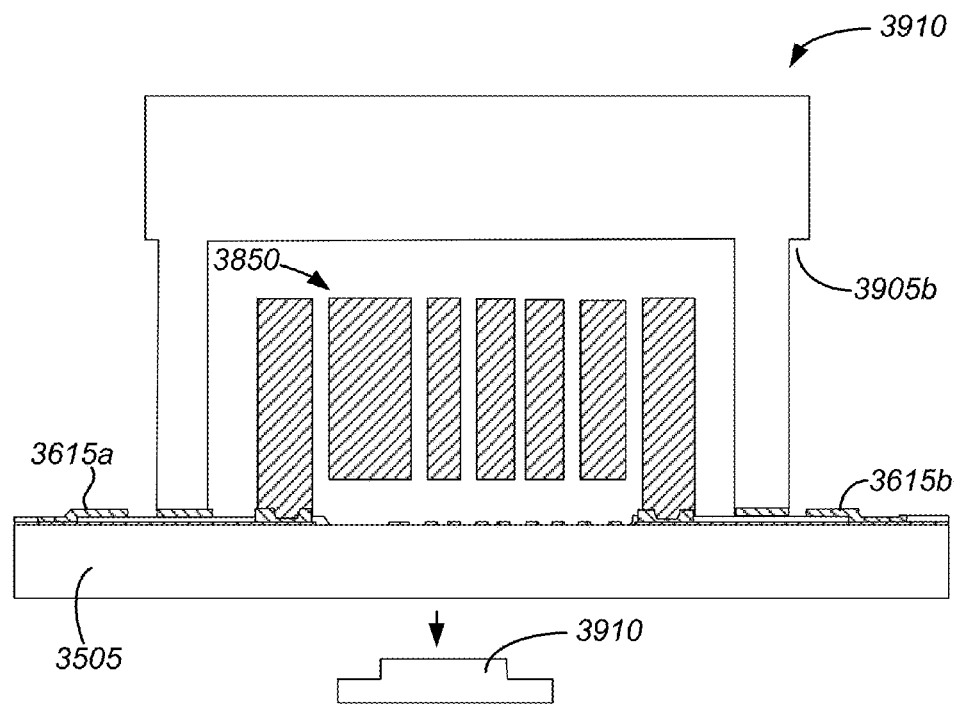
Figure 40A:
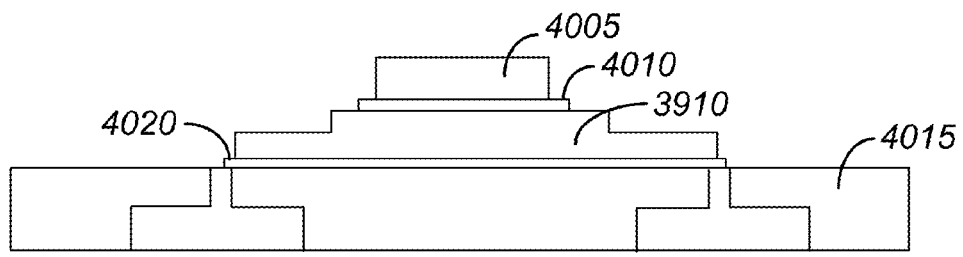
FIGS. 40A through 40C show examples of cross-sectional views of various blocks in a process of forming a device that includes a MEMS die and an integrated circuit.
Figure 40B:
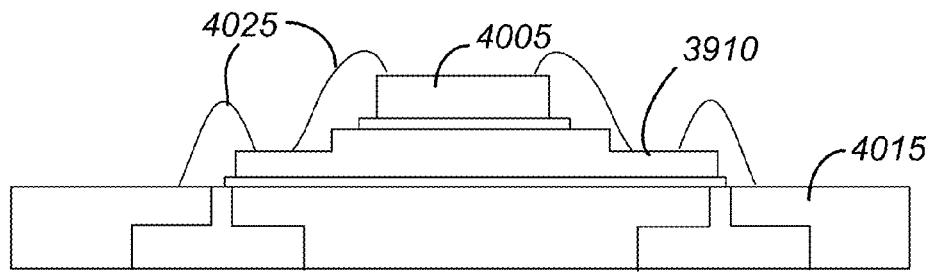
Figure 40C:
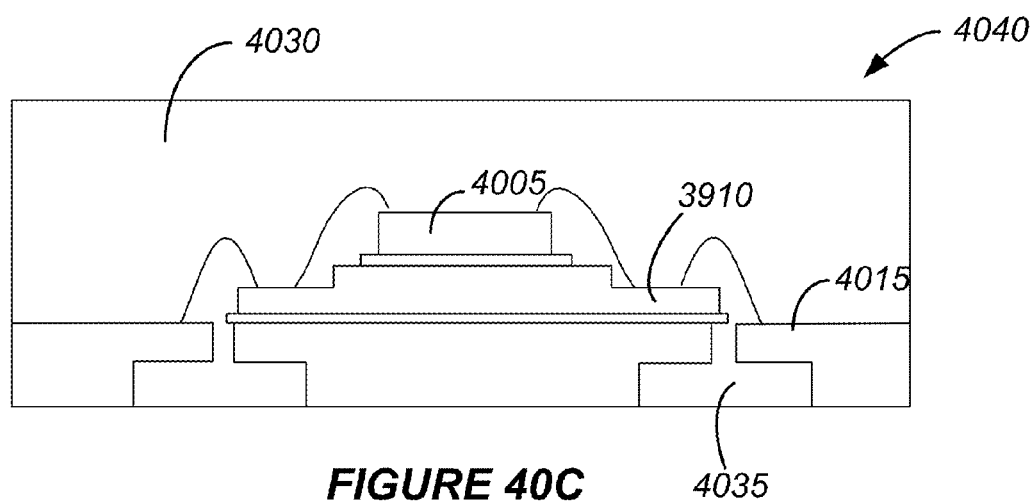

FIG. 39A illustrates the result of a subsequent encapsulation process according to one example. Here, a cover 3905 has been attached to the seal ring areas 3620a and 3620b in order to encapsulate the accelerometer 3850. In some implementations, the cover 3905 may be a glass cover, a metal cover, etc. The cover 3905 may be one of a plurality of covers formed on another substrate. In this example, the cover includes a plurality of cover portions 3905a that can form an enclosure around the accelerometer 3850. In this example, the cover portions 3905a are connected by the cover areas 3905b. The cover portions 3905a may be attached to the seal ring areas 3620a and 3620b, for example, by a soldering or eutectic bonding process, or by an adhesive such as an epoxy. In some implementations, the cover portions 3905a may completely enclose the accelerometer 3850, whereas in other implementations the cover portions 3905a may only partially enclose the accelerometer 3850. In this example, the lead areas 3615a and 3615b remain outside of the area encapsulated by the cover 3905, allowing a convenient electrical connection to the accelerometer 3850.

In some implementations, portions of the cover 3905 may be removed. For example, at least part of the cover areas 3905b may be removed (by a dicing process, for example) to allow more convenient access to the lead areas 3615a and 3615b (see FIG. 39B). The thickness of the resulting encapsulated accelerometer 3910 may also be reduced, if desired. In this example, a chemical-mechanical planarization (CMP) process is used to thin the substrate 3505. In some implementations, the encapsulated accelerometer 3910 may be thinned to an overall thickness of less than 1 mm, and more specifically to 0.7 mm or less. The resulting encapsulated accelerometer 3910 may be singulated, e.g., by dicing.

FIG. 40A depicts an apparatus formed by combining the encapsulated accelerometer 3910 with an integrated circuit 4005 and attaching both devices to another substrate 4015, which is a printed circuit board in this example. In this illustration, the integrated circuit 4005 is attached to the encapsulated accelerometer 3910 by a soldering process (see solder layer 4010). Similarly, the encapsulated accelerometer 3910 is attached to the substrate 4015 by a soldering process (see solder layer 4020). Alternatively, the integrated circuit 4005 may be attached to the accelerometer 3910 by an adhesive, such as epoxy.

FIG. 40B depicts wire bonds 4025, which are used to make electrical connections between the integrated circuit 4005 and the encapsulated accelerometer 3910, and between the encapsulated accelerometer 3910 and the substrate 4015. In alternative implementations, the encapsulated accelerometer 3910 may include vias through the substrate 3905 that are configured to form electrical connections by surface mounting.

At the stage depicted in FIG. 40C, the integrated circuit 4005 and the encapsulated accelerometer 3910 have been encapsulated with a protective material 4030, which may be a dielectric material such as a polymer, an injection molded material such as liquid crystal polymer (LCP), SiO2 or SiON. In this example, the substrate 4015 includes electrical connectors 4035 that are configured for mounting onto a printed circuit board or other apparatus. The resulting package 4040 is therefore configured for surface-mount technology.

Figure 41:
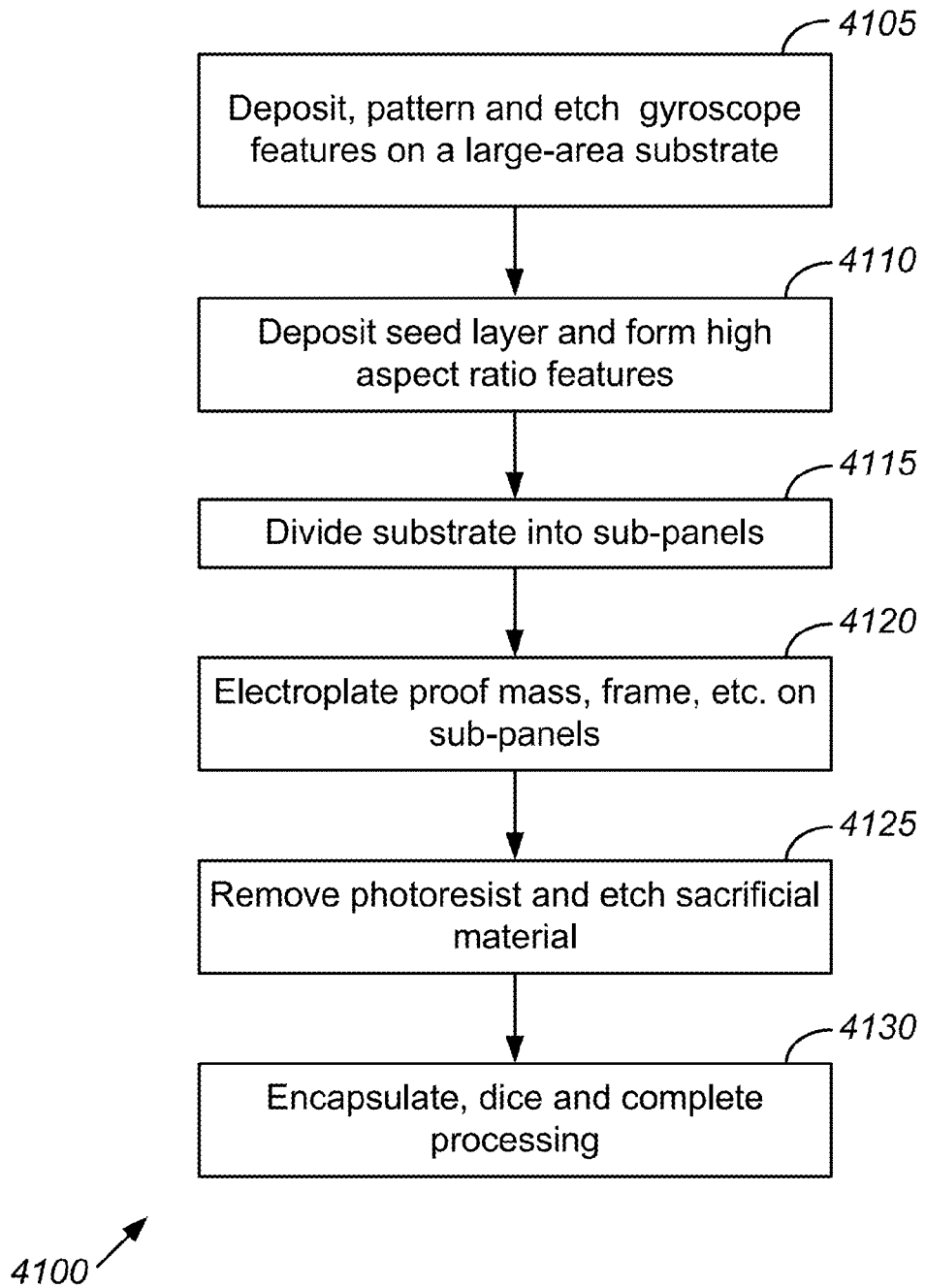
FIG. 41 shows an example of a flow diagram that provides an overview of a process of fabricating gyroscopes and related structures.

An example of a process for fabricating a gyroscope and related apparatus will now be described with reference to FIGS. 41 through 46B. FIG. 41 shows an example of a flow diagram that provides an overview of the process for fabricating gyroscopes and related structures. FIGS. 42A through 46B show examples of cross-sectional views through a substrate, a portion of a gyroscope and portions of structures for packaging the gyroscope and making electrical connections with the gyroscope, at various stages during the process outlined in FIG. 41.

Referring to FIG. 41, some operations of a method 4100 will be described. The process flow of method 4100 allows a first set of operations to be performed at a facility having the ability to build MEMS and similar devices on large-area substrates, such as large-area glass panels. Such a facility may, for example, be a Gen 5 fab or a Gen 6 fab. Accordingly, in block 4105 a large number of gyroscope features and related structures are formed on a large-area substrate. For example, hundreds of thousands or more of such structures could be fabricated on a large-area substrate. The related structures may include, for example, electrodes, electrical pads, structures for encapsulation (such as seal ring structures), etc. Examples of such processes will be described below with reference to FIGS. 42A through 44B.

In block 4110 of FIG. 41, the partially-fabricated gyroscopes and other devices are prepared for a subsequent electroplating process. As described below with reference to FIGS. 44B and 44C, block 4110 may involve plating seed layer deposition and the formation of thick layers of high aspect ratio lithography material such as photoresist.

According to the method 4100, the gyroscopes and other structures are only partially fabricated on the large-area glass substrates. One reason for this partial fabrication is that there are currently few plating facilities that could process the Gen 4 or Gen 5 substrate sizes. However, there are many plating facilities that can handle smaller substrates, such as Gen 2 substrates. Therefore, in block 4115, the large-area glass substrate on which the gyroscopes and other structures have been partially fabricated is divided into sub-panels for the electroplating procedure(s).

In block 4120, the electroplating process(es) will be performed. These processes are described below with reference to FIG. 45A. The electroplating process may, in some implementations, involve depositing most of the metal of each gyroscope's proof mass, frame and other structures. The high aspect ratio lithography material may then be removed and the sacrificial material may be removed to release each gyroscope's proof mass and frame (block 4125). Examples of these operations are described below with reference to FIGS. 45B and 46A.

Block 4130 may involve gyroscope encapsulation, as well as singulation (e.g., by dicing) and other processes. These processes are described below with reference to FIG. 46B.

Figure 42A:
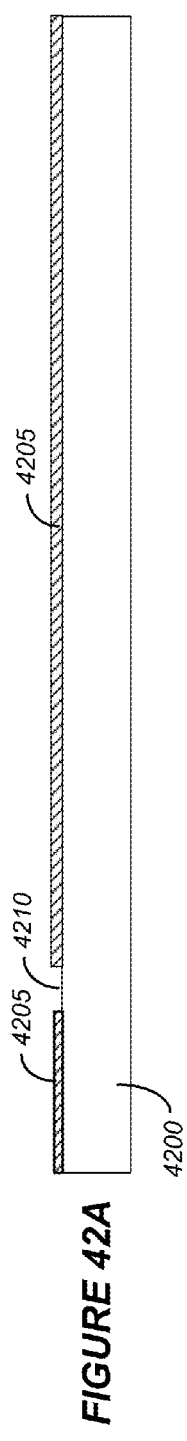

FIG. 42A depicts a cross-section through a large-area substrate 4200, which is a glass substrate in this example. The large-area glass substrate 4200 has a metallization layer 4205, which is a Cr/Au layer in this example, deposited on it. Other conductive materials may be used instead of chrome and/or gold, such as Al, TiW, Pt, Ag, Ni, nickel alloys in Co, Fe or Mn, Ti/Au, Ta/Au or doped silicon. The metallization layer 4205 may be patterned and etched, e.g. as shown in FIG. 42A. The metallization layer 4205 can be used to form the "pass through" electrical connection from inside the seal ring to outside the seal ring. Gyroscope(s) and/or other devices may, for example, be sealed inside a cavity inside the packaging. The metallization layer 4205 allows an electrical connection to be made between these devices and other devices outside the packaging.

Figure 42B:
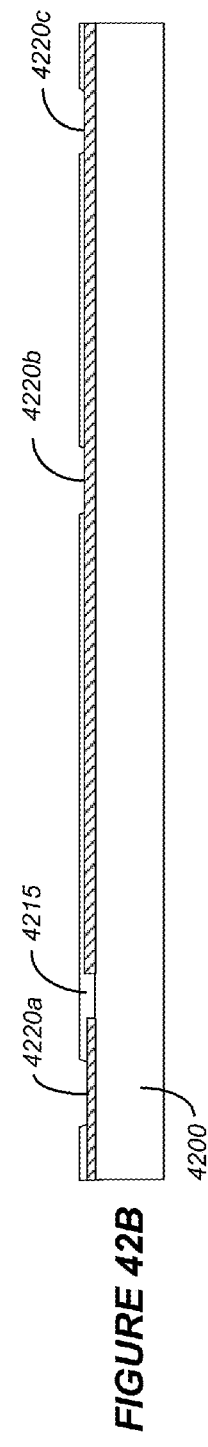

FIG. 42B depicts a dielectric layer 4215 such as $SiO_2$, SiON or other dielectric material that is deposited over the metallization layer 4205. The dielectric layer 4215 may then be etched to form openings 4220a, 4220b and 4220c through the dielectric layer 4215 to the metallization layer 4205.

Figure 42C:
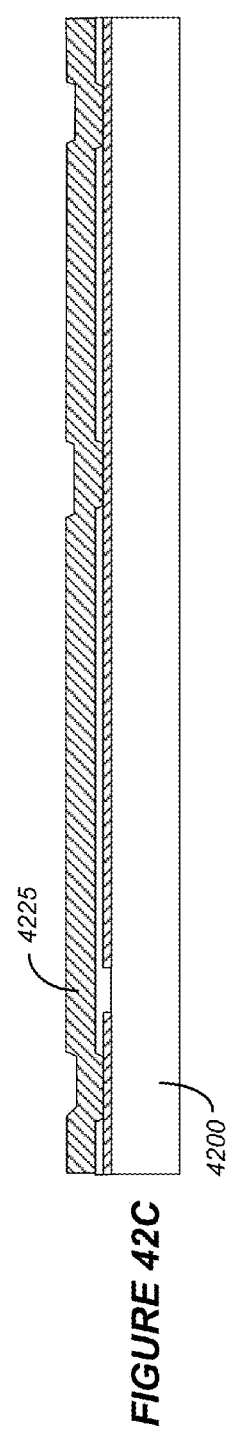
Figure 42D:
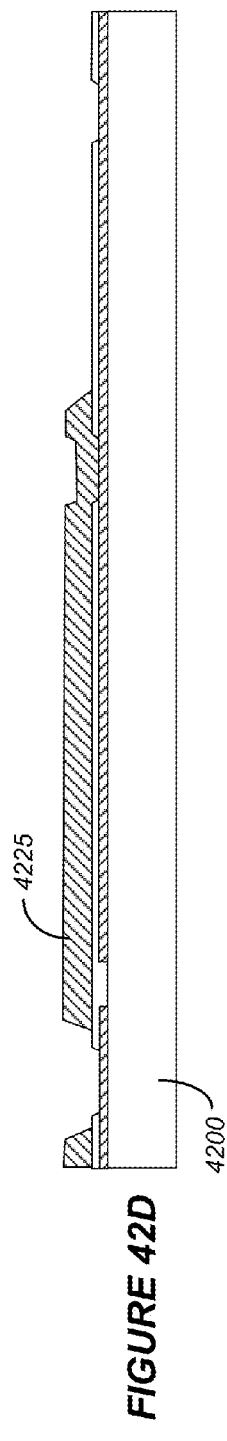

FIG. 42C illustrates a stage after which a sacrificial layer 4225 has been deposited. In this example, the sacrificial layer 4225 is formed of MoCr, but other materials may be used for the sacrificial layer 4225 such as copper or deposited amorphous or polycrystalline silicon. FIG. 42D illustrates areas of the sacrificial layer 4225 remaining after the sacrificial layer 4225 has been patterned and etched.

Figure 43A:
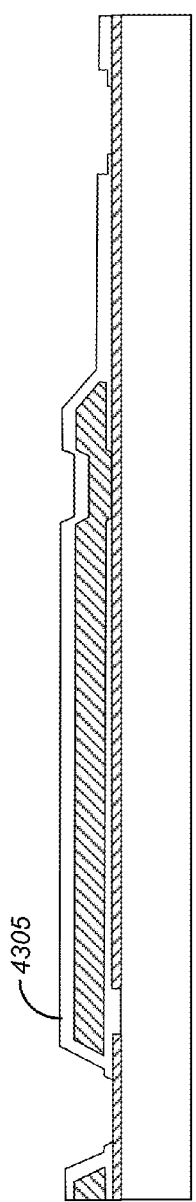
Figure 43B:
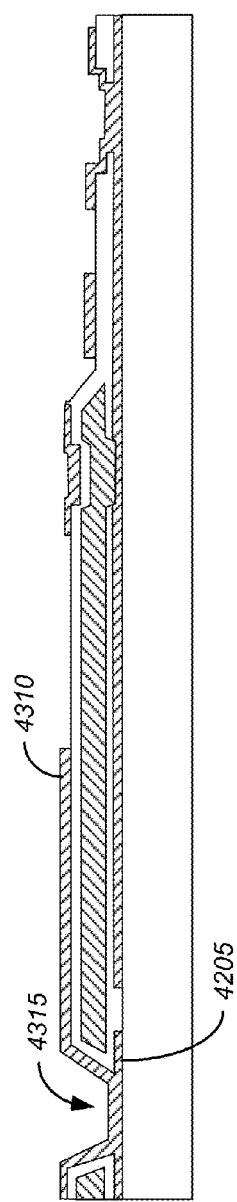

FIG. 43A illustrates a stage after which a dielectric layer 4305 has been deposited on the sacrificial layer 4225. Moreover, the dielectric layer 4305 has been patterned and etched. In FIG. 43B, a metallization layer 4310 is then deposited, patterned and etched. In this example, the metallization layer 4310 is in contact with the metallization layer 4205 in an anchor area 4315.

Figure 43C:
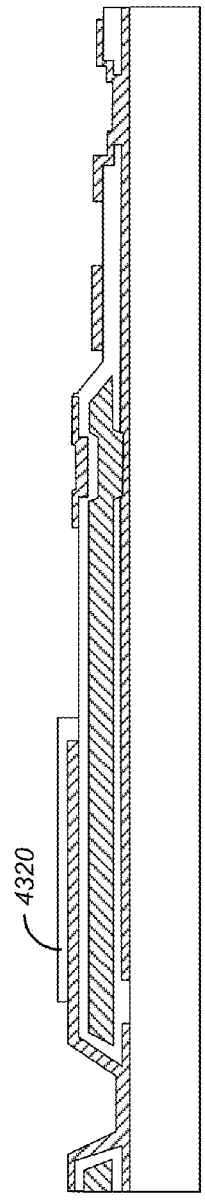
Figure 43D:
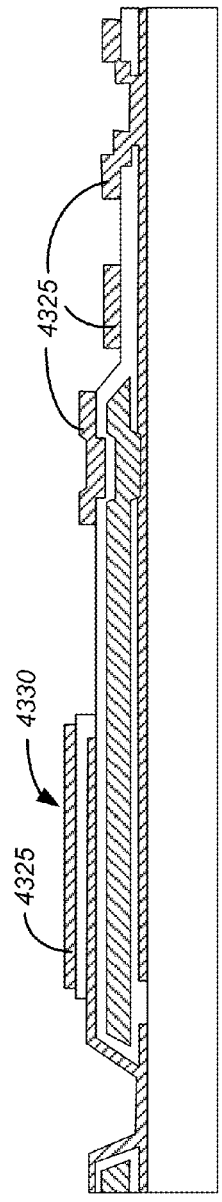

In FIG. 43C shows an example of a piezoelectric film 4320 that has been deposited, patterned and etched. In this example, the piezoelectric film 4320 is formed of aluminum nitride, but other piezoelectric materials may be used such as ZnO or lead zirconate titanate (PZT). In FIG. 43D, a metallization layer 4325 is deposited, patterned and etched. Here, the metallization layer 4325 forms a top layer of the electrode 4330, which may be a piezoelectric drive electrode or a piezoelectric sense electrode, depending on the implementation.

FIG. 44A shows an example of a dielectric layer 4405 that has been deposited, patterned and etched. During this phase, the dielectric layer 4405 is removed from most areas shown in FIG. 44A except the anchor area 4315 and the area adjacent to the electrode 4330.

At this stage, the partially-fabricated gyroscope components and related structures can be prepared for one or more electroplating processes. FIG. 44B shows an example of a plating seed layer 4405 such as nickel, a nickel alloy, copper, or chrome/gold that can be deposited prior to the electroplating process. As depicted in FIG. 44C, after the plating seed layer 4405 is deposited, a thick layer of high aspect ratio lithography material 4410 such as a thick photoresist can be formed between a proof mass area 4415 and a frame area 4420. According to some implementations, the layer of high aspect ratio lithography material 4410 is tens of microns thick, e.g., 40 to 50 microns thick. In other implementations, the layer of high aspect ratio lithography material 4410 can be thicker or thinner depending on the desired configuration of the, e.g., gyroscope. The high aspect ratio lithography material 4410 may be any of various commercially-available high aspect ratio lithography materials, such as KMPR® photoresist provided by Micro-Chem or MTF™ WBR2050 photoresist provided by DuPont®. Thick layers of the high aspect ratio lithography material 4410 also can be formed between the frame area 4420 and the seal ring area 4425, as well as between the seal ring area 4425 and the electrical pad area 4430. The high aspect ratio lithography material 4410 may be exposed with a suitable photomask and developed to define the shapes of electroplated metal structures that are subsequently formed.

As noted above, the large-area substrate on which the above-described structures have been partially formed may be divided into smaller sub-panels prior to the electroplating process. In this example, the large-area glass substrate is scribed and broken, but the large-area glass substrate may be divided in any appropriate manner (such as by dicing).

As shown in FIG. 45A, a thick metal layer 4505 may be electroplated in the areas between the high aspect ratio lithography material 4410. In this example, the thick metal layer 4505 is formed of a nickel alloy, but in other implementations thick metal layer 4505 may be formed of nickel or other plated metal alloys such as cobalt-iron, nickel-tungsten, palladium-nickel or palladium-cobalt. Here, a thin gold layer 4510 is deposited on the thick metal layer 4505, primarily to resist corrosion of the thick metal layer 4505. The gold layer 4510 also may be formed by an electroplating process.

Figure 46A:
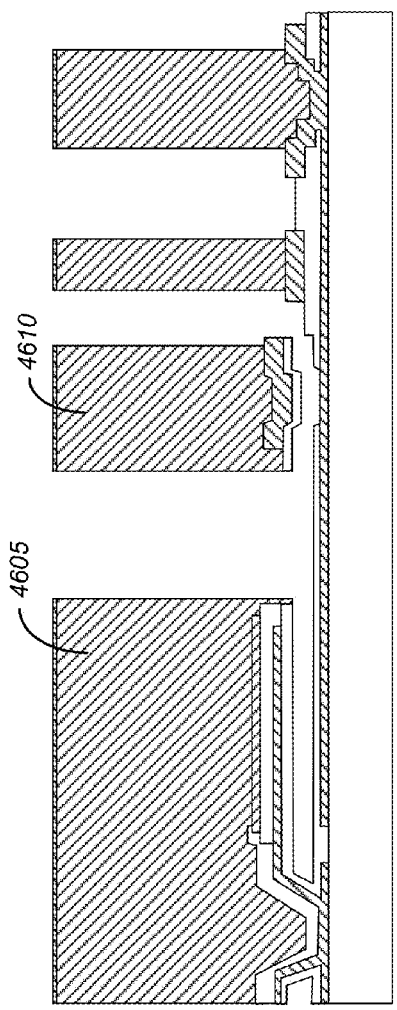

As depicted in FIG. 45B, after these metal layers have been deposited, the high aspect ratio lithography material 4410 can be removed from between the regions where the thick metal layer 4505 has been deposited. Removing the high aspect ratio lithography material 4410 exposes portions of the seed layer 4405, which may then be etched away to expose the sacrificial material 4225. FIG. 46A depicts the sacrificial material 4225 etched away, e.g., by a wet etching process or a plasma etching process, to release the proof mass 4605 and the frame 4610.

Figure 46B:
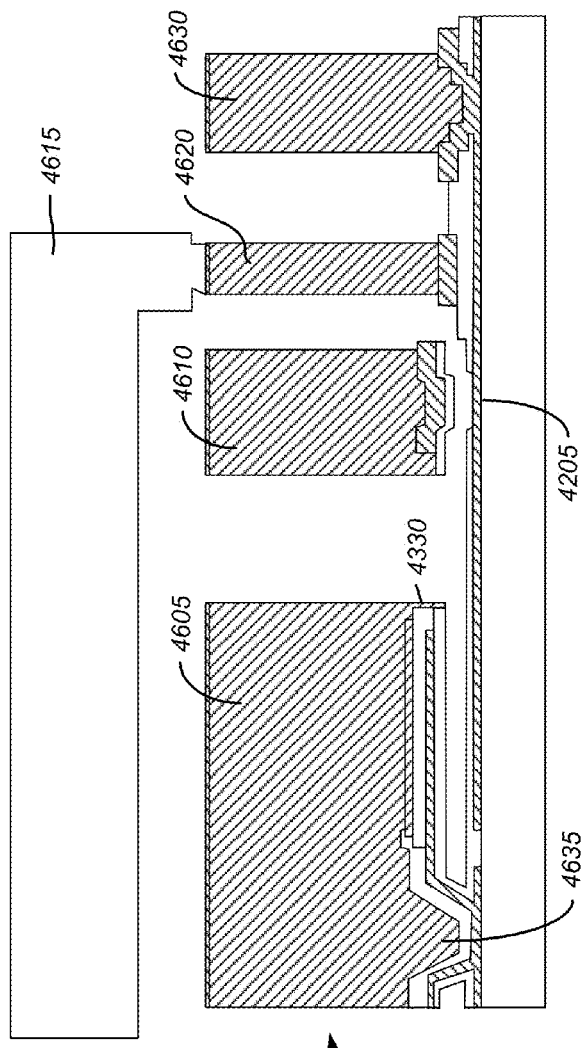

FIG. 46B illustrates the result of an encapsulation process, according to one example. Here, a cover 4615 has been attached to the seal ring 4620 in order to encapsulate the gyroscope 4625. In some implementations, the cover 4615 may be a glass cover, a metal cover, etc. The cover 4615 may be attached to the seal ring 4620, for example, by a soldering process or by an adhesive, such as epoxy. An electrical pad 4630 remains outside of the area encapsulated by the cover 4615, allowing a convenient electrical connection to the gyroscope 4625 via the metallization layer 4205.

The gyroscope 4625 resulting from this example of a fabrication process may, for example, correspond with the drive frame x-axis gyroscope 1200 shown in FIG. 12 and described above. The anchor 4635 of the gyroscope 4625 may correspond with the central anchor 1205 shown in FIG. 12. The electrode 4330 may correspond with a drive electrode 1215 shown in FIG. 12. The proof mass 4605 may correspond with the drive frame 1210 of FIG. 12, whereas the frame 4610 may correspond with the proof mass 1220 of FIG. 12.

As another example, the gyroscope 4625 may correspond with the z-axis gyroscope 2000 shown in FIG. 20A et seq. The anchor 4635 of the gyroscope 4625 may correspond with the central anchor 2005 shown in FIG. 20A et seq. Electrode 4330 may correspond with one of sense electrodes 2020a-d. The proof mass 4605 may correspond with the sense frame 2010 of FIG. 20A, whereas the frame 4610 may correspond with the drive frame 2030 of FIG. 20A.

Although the processes of fabricating gyroscopes and accelerometers have been described separately, large numbers of both types of devices may be formed on the same large-area substrate, if so desired. The accelerometers described herein may, for example, be formed by using a subset of the processes for fabricating gyroscopes. For example, the accelerometers described herein do not require piezoelectric drive electrodes or piezoelectric sense electrodes. Accordingly, no piezoelectric layer is required when fabricating such accelerometers. If accelerometers and gyroscopes are being fabricated on the same large-area substrate, the accelerometer portion(s) may be masked off when the piezoelectric layer is being deposited, patterned and etched.

In some implementations, the gyroscopes and accelerometers described herein may use different thicknesses of sacrificial material for their fabrication. For example, the gap between the accelerometer electrodes and the proof mass may be larger, in some implementations, than the gap between the proof mass and the metallization layer of a gyroscope. In some implementations that use copper as a sacrificial material, this difference in sacrificial layer thickness may be produced by plating copper on the copper seed layer only in those areas where accelerometers are being fabricated.

In some gyroscope implementations, the gyroscope may be encapsulated in a vacuum, whereas accelerometers do not need to be encapsulated in a vacuum. In some implementations, having gas in the encapsulated accelerometers may actually be beneficial, because it provides damping. Therefore, in some implementations, two different encapsulation processes may be used when fabricating both gyroscopes and accelerometers on a large-area substrate. One encapsulation process may be performed substantially in a vacuum, whereas the other would not be performed in a vacuum. In other implementations, a single encapsulation process may be performed substantially in a vacuum. The encapsulated accelerometers may be left partially open during this process, so that gas could subsequently enter the encapsulated accelerometers' packaging. The accelerometers' packaging could be entirely enclosed (e.g., with solder) during a subsequent process, if so desired.

Figure 47A:
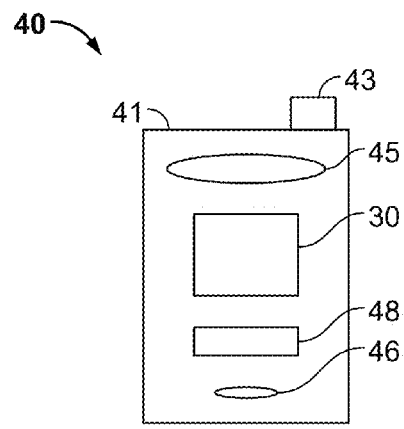
FIGS. 47A and 47B show examples of system block diagrams illustrating a display device that includes a plurality of interferometric modulators, gyroscopes and/or accelerometers.
Figure 47B:
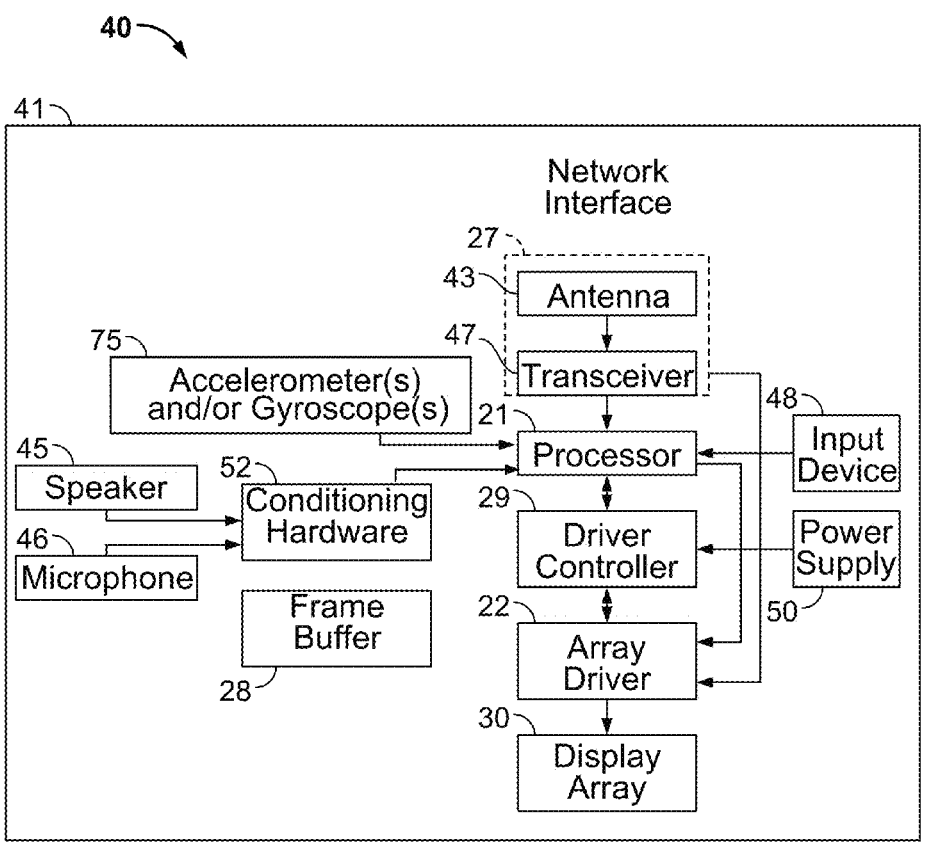

FIGS. 47A and 47B show examples of system block diagrams illustrating a display device 40 that includes a plurality of interferometric modulators. The display device 40 can be, for example, a cellular or mobile telephone. However, the same components of the display device 40 or slight variations thereof are also illustrative of various types of display devices such as televisions, e-readers and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 47B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. A power supply 50 can provide power to all components as required by the particular display device 40 design.

The network interface 27 includes the antenna 43 and the transceiver 47 so that the display device 40 can communicate with one or more devices over a network. The network interface 27 also may have some processing capabilities to relieve, e.g., data processing requirements of the processor 21. The antenna 43 can transmit and receive signals. In some implementations, the antenna 43 transmits and receives RF signals according to the IEEE 16.11 standard, including IEEE 16.11 (a), (b), or (g), or the IEEE 802.11 standard, including IEEE 802.11a, b, g or n. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1×EV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43. The processor 21 may be configured to receive time data, e.g., from a time server, via the network interface 27.

In some implementations, the transceiver 47 can be replaced by a receiver. In addition, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

In some implementations, the display device 40 may include one or more gyroscopes and/or accelerometers 75. Such gyroscopes and/or accelerometers 75 may, for example, be substantially as described herein and may be made according to processes described herein. The gyroscopes and/or accelerometers 75 may be configured for communication with the processor 21, in order to provide gyroscope data or accelerometer data to the processor 21. Accordingly, display device 40 may be able to perform some of the above-described methods relating to the use of gyroscope data and/or accelerometer data. Moreover, such data may be stored in a memory of the display device 40.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone integrated circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (e.g., an IMOD controller). Additionally, the array driver 22 can be a conventional driver or a bi-stable display driver (e.g., an IMOD display driver). Moreover, the display array 30 can be a conventional display array or a bi-stable display array (e.g., a display including an array of IMODs). In some implementations, the driver controller 29 can be integrated with the array driver 22. Such an implementation is common in highly integrated systems such as cellular phones, watches and other small-area displays.

In some implementations, the input device 48 can be configured to allow, e.g., a user to control the operation of the display device 40. The input device 48 can include a keypad, such as a QWERTY keyboard or a telephone keypad, a button, a switch, a rocker, a touch-sensitive screen, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices as are well known in the art. For example, the power supply 50 can be a rechargeable battery, such as a nickel-cadmium battery or a lithium-ion battery. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

The various illustrative logics, logical blocks, modules, circuits and algorithm processes described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and processes described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. In some implementations, particular processes and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The processes of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above should also be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the disclosure is not intended to be limited to the implementations shown herein, but is to be accorded the widest scope consistent with the claims, the principles and the novel features disclosed herein. The word "exemplary" is used exclusively herein to mean "serving as an example, instance, or illustration." Any implementation described herein as "exemplary" is not necessarily to be construed as preferred or advantageous over other implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of the IMOD (or any other device) as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. A method of fabricating a gyroscope, comprising:
depositing conductive material on a substrate;
forming a central anchor;
forming a sense frame disposed around the central anchor;
forming a plurality of sense beams, each of the sense beams including piezoelectric sense electrodes, the sense beams capable of connecting the sense frame to the central anchor;
forming a drive frame disposed around and coupled to the sense frame, the drive frame including a first side and a second side;
forming at least one pair of drive beams disposed on opposing sides of the sense frame, the drive beams capable of driving the first side of the drive frame in a first direction along a first axis in the plane of the drive frame, the drive beams being further capable of driving the second side of the drive frame in a second and opposing direction along the first axis;
forming a drive frame suspension capable of substantially restricting a drive motion of the drive frame to that of a substantially linear displacement along the first axis, wherein forming the drive frame suspension involves forming a plurality of flexures, each flexure of the plurality of flexures capable of coupling a pair of drive beams to the drive frame; and
forming a sense frame suspension capable of being compliant to rotation around a second axis orthogonal to the first axis.

2. The method of claim 1, wherein forming the plurality of sense beams includes:
    depositing a first metal layer that is in contact with the conductive material;
    depositing a piezoelectric layer on the first metal layer;
    depositing a second metal layer on the piezoelectric layer; and
    forming a third metal layer on the second metal layer.

3. The method of claim 2, wherein forming the third metal layer involves forming at least one of nickel, nickel-iron, nickel-cobalt, nickel-manganese, cobalt-iron, nickel-tungsten, palladium-nickel or palladium-cobalt on the second metal layer.

4. The method of claim 2, wherein forming the third metal layer involves electroplating.

5. The method of claim 4, wherein the electroplating involves depositing metal for the drive frame and the sense frame.

6. The method of claim 4, further including separating the substrate into a plurality of sub-panels prior to the electroplating.

7. The method of claim 1, further including forming the sense frame suspension to resist motion along the first axis.

8. The method of claim 1, wherein forming the central anchor includes:
    etching through a sacrificial layer to expose the first metal layer;
    depositing an oxide layer on the first metal layer;
    forming a seed layer on the oxide layer; and
    forming the third metal layer on the seed layer.

9. The method of claim 8, wherein forming the seed layer involves forming at least one of nickel, a nickel alloy, copper or a combination of chrome and gold on the oxide layer.

10. The method of claim 1, further comprising encapsulating the gyroscope inside packaging.

11. The method of claim 10, wherein the encapsulating involves sealing the gyroscope inside the packaging.

12. The method of claim 11, wherein the sealing involves sealing the gyroscope substantially in a vacuum.

13. The method of claim 10, further comprising forming a portion of the conductive material into an electrical connection from the gyroscope inside the packaging to an area outside of the packaging.

14. The method of claim 10, further comprising forming a seal ring, wherein the encapsulating involves attaching a cover to the seal ring.

15. The method of claim 14, wherein the cover includes metal or glass.

16. The method of claim 14, further comprising forming an electrical pad outside of the seal ring, the electrical pad being capable of electrical connection with the conductive material.

17. The method of claim 1, wherein forming the sense frame and forming the drive frame includes:
    etching between a drive frame area and a sense frame area;
    depositing high aspect ratio photoresist material between the drive frame area and the sense frame area; and
    electroplating the third metal layer in the drive frame area and the sense frame area.

18. The method of claim 17, wherein forming the sense frame and forming the drive frame includes:
    removing the high aspect ratio photoresist material from between the drive frame area and the sense frame area;
    etching to expose a sacrificial layer disposed below the drive frame and the sense frame; and
    removing the sacrificial layer to release the drive frame and the sense frame.

19. The method of claim 1, wherein the substrate is a glass substrate.

20. The method of claim 1, wherein the conductive material includes at least one of chrome, gold, aluminum, a combination of titanium and tungsten, platinum, silver, nickel, nickel alloys of cobalt, iron or manganese, a combination of titanium and gold, a combination of tantalum and gold or doped silicon.

* * * * *